United States Patent [19]

Staab et al.

[11] Patent Number: 5,973,363
[45] Date of Patent: Oct. 26, 1999

[54] CMOS CIRCUITRY WITH SHORTENED P-CHANNEL LENGTH ON ULTRATHIN SILICON ON INSULATOR

[75] Inventors: David R. Staab, San Jose, Calif.;
Richard M. Greene, Vincentown, N.J.;
Mark L. Burgener; Ronald E. Reedy, both of San Diego, Calif.

[73] Assignee: Peregrine Semiconductor Corp., San Diego, Calif.

[21] Appl. No.: 08/401,521

[22] Filed: Mar. 9, 1995

Related U.S. Application Data

[63] Continuation-in-part of application No. 08/218,561, Mar. 25, 1994, Pat. No. 5,572,040, which is a continuation-in-part of application No. 08/090,400, Jul. 12, 1993, Pat. No. 5,416,043.

[51] Int. Cl.[6] ................................................. H01L 29/94
[52] U.S. Cl. ........................ 257/347; 257/288; 257/350; 257/351; 257/352
[58] Field of Search .................................... 257/213, 347, 257/348, 288, 352, 350, 351; 437/62, 63

[56] References Cited

U.S. PATENT DOCUMENTS

| | | | |
|---|---|---|---|
| 3,309,586 | 3/1967 | Kleinknecht | 317/235 |
| 3,492,511 | 1/1970 | Crawford | 307/304 |
| 4,037,140 | 7/1977 | Eaton, Jr. | 361/56 |
| 4,072,910 | 2/1978 | Dingwall et al. | 331/57 |
| 4,177,084 | 12/1979 | Lau et al. | |
| 4,183,134 | 1/1980 | Oehler et al. | 29/571 |
| 4,198,649 | 4/1980 | Berry | 357/50 |
| 4,282,556 | 8/1981 | Ipri | 361/56 |
| 4,385,937 | 5/1983 | Ohmura | |
| 4,418,470 | 12/1983 | Naster et al. | |
| 4,425,700 | 1/1984 | Sasaki et al. | 29/571 |
| 4,463,492 | 8/1984 | Maeguchi | 437/84 |
| 4,488,230 | 12/1984 | Harrison | 364/200 |
| 4,509,990 | 4/1985 | Vasudev | |
| 4,523,963 | 6/1985 | Ohta et al. | |
| 4,588,447 | 5/1986 | Golecki | |
| 4,607,176 | 8/1986 | Burrows et al. | |
| 4,615,762 | 10/1986 | Jastrzebski et al. | 156/628 |
| 4,617,066 | 10/1986 | Vasudev | 437/27 |
| 4,659,392 | 4/1987 | Vasudev | |

(List continued on next page.)

FOREIGN PATENT DOCUMENTS

| | | |
|---|---|---|
| 0 273 702 | 7/1988 | European Pat. Off. |
| 0 600 596 | 6/1994 | European Pat. Off. |
| 2 380 637 | 9/1978 | France |
| 61-103530 | 5/1986 | Japan |

(List continued on next page.)

OTHER PUBLICATIONS

Betty Prince (Texas Instruments USA); "Semiconductor Memories, A Handbook of Design, Manufacture and Application", Second Edition; Copyright 1983, 1991 by John Wiley & Sons, Ltd., West Sussex, England; title pages; pp. 141–145 and pp. 434–443.

(List continued on next page.)

*Primary Examiner*—Valencia Martin-Wallace
*Attorney, Agent, or Firm*—Wilson Sonsini Goodrich & Rosati

[57] ABSTRACT

An integrated circuit comprising an insulating substrate; a layer of silicon formed on said insulating substrate; a p-channel transistor and an n-channel transistor formed in said silicon layer and interconnected in a CMOS circuit; wherein the ratio of transistor p-channel length to transistor n-channel length in the CMOS circuit is less than or equal to one.

35 Claims, 45 Drawing Sheets

U.S. PATENT DOCUMENTS

| | | |
|---|---|---|
| 4,682,055 | 7/1987 | Upadhyayula . |
| 4,717,836 | 1/1988 | Doyle ........................................ 307/310 |
| 4,766,482 | 8/1988 | Smeltzer et al. ......................... 148/1.5 |
| 4,775,641 | 10/1988 | Duffy et al. . |
| 4,843,448 | 6/1989 | Garcia et al. ............................. 357/36 |
| 4,989,057 | 1/1991 | Lu .......................................... 357/23.7 |
| 5,027,171 | 6/1991 | Reedy et al. ............................ 357/23.5 |
| 5,141,882 | 8/1992 | Komori et al. . |
| 5,145,802 | 9/1992 | Tyson et al. .............................. 437/63 |
| 5,300,443 | 4/1994 | Shimabukuro et al. .................. 437/51 |
| 5,313,077 | 5/1994 | Yamazaki ................................ 257/66 |
| 5,341,009 | 8/1994 | Young et al. ........................... 257/296 |
| 5,391,903 | 2/1995 | Strater et al. ........................... 257/351 |
| 5,416,043 | 5/1995 | Burgener et al. ........................ 437/63 |

FOREIGN PATENT DOCUMENTS

| | | |
|---|---|---|
| 62-176145 | 8/1987 | Japan . |
| 4-122020 | 4/1992 | Japan . |
| 5-55470 | 3/1993 | Japan . |
| 2 005 073 | 4/1979 | United Kingdom . |
| PCT/US88/ 04693 | 12/1988 | WIPO . |
| PCT/US94/ 06626 | 6/1994 | WIPO . |
| PCT/US94/ 06626 | 9/1994 | WIPO . |
| WO 95 02892 | 1/1995 | WIPO . |

OTHER PUBLICATIONS

Stanley Wolf, Ph.D. and Richard N. Tauber, Ph.D.; "Silicon Processing for the VLSI Era", vol. 1: Process Technology; Copyright 1986 by Lattice Press, Sunset Beach, California; title pages; pp. 151–155.

Stanley Wolf, Ph.D.; "Silicon Processing for the VLSI Era", vol. 2: Process Integration; Copyright 1990 by Lattice Press, Sunset Beach, California; title pages; pp. 68–83.

"Physics of Semiconductor Devices," S.M. Sze, VLSI Technology, Second Edition, published by John Wiley & Sons, Taipai, Taiwan at 344 and at Sections 8.4.3–8.4.4, at 477–485.

Colinge, Jean–Pierre, *Silicon On Insulator Technology: Materials to VLSI*, Kluwa Academic Publishers, 1991, at p. 112.

Patent Abstracts of Japan, vol. 008, No. 074 (E–236), Apr. 6, 1984 & JP,A, 58 222573 (Hitachi Seisakusho KK; Others; 01), Dec. 24, 1983.

Search Report dated Jun. 24, 1996, International Application No. PCT/US96/01968.

Patent Abstracts of Japan vol. 007, No. 049 (E–161), Feb. 25, 1983 & JP,A,57 197848 (Tokyo Shibaura Denki KK), Dec. 4, 1982.

Patent Abstracts of Japan vol. 005, No. 159 (E–077), Oct. 14, 1981 & JP,A, 56 090549 (Toshiba Corp), Jul. 22, 1981.

Syed and Abidi, "Gigahertz Voltage–Controlled Ring Oscillator", Electronics Letters, Jun. 5, 1986, vol. 22, No. 12.

Extended Abstracts, vol. 93/1, 1993, Pennington, New Jersey US, pp. 1201–1202, XP000432018 H. Nishizaza et al.: *An Advanced Dielectric Isolation Structure for SOI–CMOS/BiCMOS VLSIs*.

Chan et al., *Comparison of ESD Protection Capability of SOI and Bulk CMOS Output Buffers*,1994 IEEE International Reliability Physics Proceedings. pp. 292–298.

J.P. Whitehead and N.N. Duncan, *Design and Evaluation of CMOS–SOS On–Chip Input Protection Circuits*, Electrostatic Discharge Damage in Electronics Seminar Proceedings (1986) p. 4.2.1–4.2.10.

Cohen & Caswell, *An Improved Input Protection Circuit for CMOS/SOS Arrays*, IEEE Transactions on Electron Devices, vol. ED 25, No. 8, Aug. 1978, pp. 926–933.

W. Palumbo and M.P. Dugan, *Design and Characterization of Input Protection Networks for CMOS/SOS Applications*, 1986 Electrical Overstress/Electrostatic Discharge Symposium Proceedings, (1986) pp. 182–187.

Chen et al., "Self–Registered Gradually Doped Source Drain Extension Short Channel CMOS/SOS Devices", *IEEE Electron Device Letters*, vol. 3, No. 12, Dec. 1982, New York.

R. Reedy et al., "Thin (100 nm) SOS for Application to Beyond VLSI Microelectronics," *Materials Research Society Symp. Proc.*, vol. 107, Nov./Dec. 1988, pp. 365–376.

G. Garcia et al., "High–Quality CMOS in Thin (100 nm) Silicon on Sapphire," *IEEE Electron Device Letters*, vol. 9, No. 1, Jan., 1988, pp. 32–34.

P.R. de la Houssaye et al., "Fabrication of n–channel metal–oxide–semiconductor field–effect transistors with 0.2 $\mu$m gate lengths in 500Å thin film silicon on sapphire," *Journal of Vacuum Science & Technology B*, vol. 10, No. 6, Nov./Dec. 1992, pp. 2954–2957.

P.H. Woerlee et al., "Half–micron CMOS on Ultra–thin Silicon on Insulator," *Technical Digest of the International Electron Devices Meeting*, Dec. 3–6, 1989, pp. 821–824.

N. Sasaki et al., "A CMOS/SOS Synchronous Static RAM Fabricated with an Advanced SOS Technology," *Japanese Journal of Applied Physics*, vol. 18 (1979), Supplements 18–1, pp. 57–62.

T. King et al., "A low–temperature ($\leq$550 C) silicon–germanium MOS thin–film transistor technology for large–area electronics," *Technical Digest of the International Electron Devices Meeting*, Dec. 8–11, 1991, pp. 567–570.

I. Golecki et al., "Recrystallization of silicon–on–sapphire by cw Ar laser irradiation: Comparison between the solid–and the liquid–phase regimes," *Applied Physics Letters*, 37 (10), Nov. 15, 1980, pp. 919–921.

T. Inoue et al., "Crystalline disorder reduction and defect–type change in silicon on sapphire films by silicon implantation and subsequent thermal annealing," *Applied Physics Letters* 36 (1) Jan. 1, 1980, pp. 64–67.

I. Golecki et al., "Improvement of crystalline quality of epitaxial silicon–on–sapphire by ion implantation and furnace regrowth," *Solid–State Electronics*, vol. 23, pp. 803–806.

J. Linnros et al., "Ion–beam–induced epitaxial regrowth of amorphous layers in silicon on sapphire," *The American Physical Society*, vol. 30(7), Oct. 1, 1984, pp. 3629–3638.

S. Lau et al., "Improvement of crystalline quality of epitaxial Si layers by ion–implantation techniques," *Applied Physics Letters*, 34 (1) Jan. 1, 1979, pp. 76–78.

S.M. Sze, *Physics of Semiconductor Devicies*, Second Edition, John Wiley & Sons, Taipei, Taiwan, Sections 8.4.3–8.4.4 at p. 344, 477–485.

R. Reedy et al., "Characterization of Defect Reduction and Aluminum Redistribution in Silicon Implanted SOS Films," *Journal of Crystal Growth*, North–Holland Publishing Co., vol. 58, No. 1, Jun. 1982, pp. 53–60.

R.E. Reedy et al., "Characterization of Defect Reduction and Aluminum Redistribution in Silicon Implanted SOS Films", Journal Of Crystal Growth, vol. 58, No. 1, pp. 53–60, Jun. 1982.

R.E. Reedy et al., "Suppressing Al Outdiffusion in Implantation Amorphized and Recrystallized Silicon on Sapphire Films", Applied Physics Letters. vol. 42, No. 8, pp. 707–709, Apr., 1983.

G.A. Garcia et al., "High–Quality CMOS on Thin (100 nm) Silicon on Sapphire", IEEE Electron Device Letters, vol. 9, No. 1, pp. 32–34, Jan. 1988.

R.E. Reedy et al., "Thin (100 nm) SOS for Application to Beyond VLSI Microelectronics", Mat. Res. Soc. Symp. Proc., vol. 107, pp. 365–376, 1988.

P.R. de la Houssaye, et al., "Fabrication of n–channel metal–oxide–semiconductor field–effect transistors with 0.2µm gate lengths in 500 Åthin film silicon on sapphire", Journal of Vacuum Science and Technology: Part B, vol. 10, No. 6, pp. 2954–2957, Nov./Dec. 1992.

P.H. Woerlee, et al., "Half–Micron CMOS on Ultra–Thin Silicon on Insulator", Technical Digest of the International Electron Devices Meeting 1989, Washington, D.C., pp. 821–824, Dec. 3–6, 1989.

Nobuo Sasaki et al., "A CMOS/SOS Synchronous Static RAM Fabricated with an Advanced SOS Technology", Japanese Journal of Applied Physics, Supplement 18–1, vol. 18, pp. 57–62, 1979.

Adele E. Schmitz et al., "A Deep–Submicrometer Microwave/Digital CMOS/SOS Technology", IEEE Electron Device Letters, vol. 12, No. 1, pp. 16–17, Jan. 1991.

Tsu–Jae King et al., "A Low–Temperature ($\leq 550°C$) Silicon–Germanium MOS Thin–Film Transistor Technology for Large–Area Electronics", Technical Digest of the International Electron Devices Meeting 1991, Washington, D.C., pp. 567–570, Dec. 8–11, 1991.

Golecki et al., "Recrystallization of Silicon–on–Sapphire by CW Ar Laser Irradiation: Comparison Between the Solid and the Liquid–Phase Regimes"; Appl. Phys. Lett. 37(10), 1980, pp. 919–921.

Inoue et al. "Crystaline Disorder Reduction and Defect–Type Change in Silicon–on–Sapphire Films by Silicon Implantation and Subsequent Thermal Annealing"; Appl. Phys. Lett. 36(1), 1980, pp. 64–66.

Golecki et al., "Improvement of Crystalline Quality of Epitaxial Silicon–on–Sapphire by Ion–Implantation and Furnace Regrowth"; Solid State Electronics vol. 23, 1980, 803–806.

Linnros et al., "Ion–Beam Induced Epitaxial Regrowth of Amorphous Layers in Silicon on Sapphire"; Physical Review B, vol. 30, No. 7, 1984, pp. 3629–3638.

Lau et al., "Improvement of Crystalline Quality of Epitaxial Si Layers by Ion Implantation Techniques"; Appl. Phys. Lett. 34(1), 1979, pp. 76–78.

CMOS CIRCUITRY WITH SHORTENED P-CHANNEL LENGTH ON ULTRATHIN SILICON ON INSULATOR

RELATED APPLICATIONS

This application is a continuation-in-part of patent application Ser. No. 08/218,561, filed Mar. 25, 1994, by inventors Mark L. Burgener and Donald E. Reedy, and entitled, "High Frequency Wireless Communication System On A Single Ultrathin Silicon on Sapphire Chip," which is a continuation-in-part of patent application Ser. No. 08/090,400, filed Jul. 12, 1993, by inventors Burgener and Reedy, and entitled "Minimum Charge FET Fabricated on an Ultrathin Silicon on Sapphire Wafer."

BACKGROUND OF THE INVENTION

1. Field of the Invention

The invention relates generally to complementary metal oxide semiconductor (CMOS) circuits, and more particularly, to the comparative channel dimensions of the p-channel and n-channel transistors that comprise CMOS circuits.

2. Description of the Related Art

SILICON-ON-SAPPHIRE SUBSTRATES AND DEVICES

The field effect transistor (FET) controls current conduction from a source region to a drain region by application of voltage to a gate conductor. If the gate conductor is insulated from the source-drain conduction channel, the device is called an insulated gate FET. The most common gate structure is that of metal oxide semiconductor, or the MOSFET. A variety of requirements force designs which contain doped semiconductor material below the insulating gate structure, i.e., in the conduction channel. As device dimensions shrink, doping concentrations must be increased to maintain proper transistor operation.

Dopant atoms and electrically active states (hereinafter called "fixed charge") in and below the conduction channel region of MOSFETs are charged and discharged during operation of the device. Since fixed charge is immobile, it does not contribute to FET current conduction. Therefore, the charging and discharging of fixed charges introduces a variable parasitic charge to the transistor with many negative effects, including scattering of conduction carriers; variation in threshold voltage; introduction of buried channel operation; introduction of a body effect; complication of device modeling; increased complexity for device and process design; increased electric fields; and difficulty in scaling devices to smaller dimensions or voltages, among others.

Dopant atoms are introduced into MOSFETs for specific reasons such as to adjust threshold voltage or to control substrate currents, with the aforementioned adverse side effects accepted as necessary by-products of dopant atom introduction. It would be very desirable to be able to introduce only the specific type, quantity and location of dopant atoms which are necessary to achieve the desired electrical characteristics for the device and to avoid or eliminate all other dopant atoms. The "ideal" semiconductor material would thus include a completely monocrystalline, defect-free silicon layer of sufficient thickness to accommodate the fabrication of active devices thereon. Ideal operation of MOSFETs would occur if there were no parasitic charge (which we define as unintended or excess dopant atoms plus electrically active states) in the conduction channel.

Another requirement for MOSFETs is to set threshold voltage, which is the gate voltage necessary to initiate conduction. A common technique for setting threshold voltage is to modify the dopant concentrations in the channel region. However, this approach has the undesirable side effects associated with dopant charge mentioned above. Also, adjusting threshold voltage by ion implantation requires at least two and often four masking steps which increase cost and decrease yield.

Previously, silicon-on-sapphire (SOS) has been used for high performance MOSFET microelectronics, primarily for applications requiring radiation hardness. Typically, a silicon film is epitaxially grown on a sapphire substrate. Ideally, the silicon film is thin compared to the source to drain separation (called the channel length) and the insulating substrate is thick enough to ensure no significant electrostatic coupling to a back plane, or mounting surface. Due to crystal and thermal expansion mismatches between the silicon and the sapphire, the silicon films are typically heavily populated with crystalline defects and electrically active states. The dominant type of crystalline defects are commonly called "twins". The quality of the silicon films can be improved by increasing the thickness of the silicon, hence traditional SOS is made with silicon films between 400 and 800 nanometers thick. This film thickness is capable of supporting transistors with channel lengths down to about 1 micron. Submicron channel length devices cannot be made in traditional SOS materials as thinner films are required.

The advantages of utilizing a composite substrate comprised of a monocrystalline semiconductor layer, such as silicon, epitaxially deposited on a supporting insulative substrate are well recognized. These advantages include the substantial reduction of parasitic capacitance between charged active regions and the substrate and the effective elimination of leakage currents flowing between adjacent active devices. This is accomplished by employing as the substrate an insulative material, such as sapphire ($Al_2O_3$), and providing that the conduction path of any interdevice leakage current must pass through the substrate.

An "ideal" silicon-on-sapphire wafer may be defined to include a completely monocrystalline, defect-free silicon layer of sufficient thickness to accommodate the fabrication of active devices therein. The silicon layer would be adjacent to a sapphire substrate and would have a minimum of crystal lattice discontinuities at the silicon-sapphire interface. Previous attempts to fabricate this "ideal" silicon-on-sapphire (SOS) wafer have been frustrated by a number of significant problems.

Historically, the first significant problem encountered in attempts to fabricate the ideal SOS wafer was the substantial incursion of contaminants into the epitaxially deposited silicon layer. In particular, substantial concentrations of aluminum contaminants, diffused from the sapphire substrate, were found throughout the silicon epitaxial layer. The inherent consequence of a high concentration of aluminum contaminants, effectively acting as acceptor-type impurities in the silicon epitaxial layer, is that there are unacceptably high leakage currents between the source and drain regions of P-channel active devices, such as MOSFETs (Metal Oxide Semiconductor Field Effect Transistor) and MESFETs (MEtal Semiconductor FET). These leakage currents may be of sufficient magnitude that the P-channel active devices may be considered to be always in an "on", or conducting state.

The incursion of substrate-oriented contaminants into the silicon layer was found to be an inherent consequence of high temperature processing steps. Such steps are typically utilized in both the initial epitaxial deposition of the silicon layer and the subsequent annealing of the silicon layer to reduce crystalline defects contained therein. Thus, it was recognized that high temperature annealing needed to be avoided to prevent the substantial incursion of substrate-orientated contaminants into the silicon layer.

However, in the absence of a high temperature anneal, a second problem appeared. The crystalline quality of the silicon layer, as epitaxially deposited, was of insufficient quality to permit the fabrication of active devices therein. It was discovered that the dominant crystal defects, i.e., twins, could be eliminated by solid phase epitaxial (SPE) regrowth, a process described in U.S. Pat. No. 4,177,084, entitled "METHOD FOR PRODUCING A LOW DEFECT LAYER OF SILICON-ON-SAPPHIRE WAFER", issued to Lau et al. As described by Lau et al., the SPE process provides a low temperature subprocess for improving the crystallinity of the silicon epitaxial layer of a silicon-on-sapphire composite substrate. The SPE process involves the high energy implantation (typically at 40 KeV to 550 KeV) of an ion species, such as silicon, into the silicon epitaxial layer at a sufficient dose (typically $10^{15}$ to $10^{16}$ ions/cm$^2$) to create a substantially amorphous silicon layer lying adjacent the silicon/sapphire interface while leaving a substantially crystalline layer at the surface of the original epitaxial layer. The thickness of the silicon epitaxial layer is substantially that intended for the completed silicon-on-sapphire composite substrate (typically 3000 Å–6000 Å). The ion species is implanted through the majority of the epitaxial layer so that the maximum disruption of the silicon crystal lattice is near, but not across, the silicon/sapphire interface to ensure that the amorphous region is adjacent the sapphire substrate. Throughout the ion implantation, the sapphire substrate is kept below about 100° C. by cooling with Freon or liquid Nitrogen. A single step low temperature (600° C.) annealing of the composite substrate is then performed to convert the amorphous silicon layer into crystalline silicon. During this regrowth, the remaining crystalline surface portion of the silicon layer effectively acts as a nucleation seed so that the regrown portion of the silicon epitaxial layer has a common crystallographic orientation and is substantially free of crystalline defects.

While Lau's SPE process does significantly improve the crystallinity of the silicon epitaxial layer, it also facilitates the diffusion of aluminum from the sapphire substrate (Al$_2$O$_3$) into the silicon epitaxial layer, which dopes the silicon film P-type. The contaminant concentration resulting from the use of the SPE process is, unfortunately, sufficient to preclude the practical use of integrated circuits fabricated on composite substrates processed with this SPE subprocess. The reasons for the failure of active devices to operate correctly are essentially the same as given above with It has been found that the process described by Vasudev can result in incomplete and non-uniform removal of crystalline defects and electrically active states from the silicon layer due to non-uniform thermal contact of the rear surface of the sapphire with the heat sink. When the thermal paste is used, any air bubbles in the paste interface can result in the non-uniform control of the silicon layer temperature. Additionally, further processing of the wafer is made more difficult because it is necessary to completely remove all residues of the thermal paste before proceeding. While coating the rear surface of the sapphire with silicon to provide a thermal interface removes the problem of cleaning paste from the wafer before further processing, it has also been found to provide non-uniform temperature control of the silicon layer, due to roughness of the rear surface of the sapphire. Even when great care is taken to smooth the rear surface of the sapphire prior to applying the silicon interface layer, a costly and time consuming process, warping of the substrate caused by heating and cooling of the sapphire during the implantation can result in non-uniform thermal contact between the rear surface of the sapphire and the heat sink.

U.S. Pat. No. 4,659,392, entitled "SELECTIVE AREA DOUBLE EPITAXIAL PROCESS FOR FABRICATING SILICON-ON-INSULATOR STRUCTURES FOR USE WITH MOS DEVICES AND INTEGRATED CIRCUITS", issued to Vasudev, describes another method for tailoring defect densities in regions of silicon on insulator wafers. Using this process, the defect structure and dopant concentrations near the interface between the silicon and the insulator are optimized for specific applications. However, such residual defects would make such silicon films inappropriate for construction of fully depleted transistors.

Other methods to prepare silicon on sapphire films have been described. U.S. Pat. No. 4,385,937, entitled "REGROWING SELECTIVELY FORMED ION AMORPHOSIZED REGIONS BY THERMAL GRADIENT", issued to Ohmura, describes a method which uses large thermal gradients during solid phase regrowth to enhance electron mobility in the silicon semiconductor layer. U.S. Pat. No. 4,775,641, entitled "METHOD OF MAKING SILICON-ON-SAPPHIRE SEMICONDUCTOR DEVICES", issued to Duffy et al., describes a method which intentionally forms a silicon layer adjacent an insulating substrate which has a high density of naturally occurring crystallographic defects. The purpose of this region is to substantially reduce the back-channel leakage that occurs when the device is operated after being irradiated. U.S. Pat. No. 4,588,447, entitled "METHOD OF ELIMINATING P-TYPE ELECTRICAL ACTIVITY AND INCREASING CHANNEL MOBILITY OF SI-IMPLANTED AND RECRYSTALLIZED SOS FILMS", issued to Golecki, describes use of ion implantation, recrystallization and oxygen diffusion to neutralize aluminum in the silicon film. The resulting oxide layer on the outward surface is subsequently densified and etched away. U.S. Pat. No. 4,523,963, entitled "METHOD OF FABRICATING MOS DEVICE ON A SOS WAFER BY STABILIZING INTERFACE REGION WITH SILICON AND OXYGEN IMPLANT", issued to Ohta, et al. describes use of implanting both silicon and oxygen to form recrystallized silicon films. An insulating layer is intentionally formed at the interface of the sapphire substrate. This insulating layer contains a high density of crystalline defects and dopants.

The paper entitled "THIN (100 nm) SOS FOR APPLICATION TO BEYOND VLSI MICROELECTRONICS", published in the Mat. Res. Soc. regard to composite substrates fabricated utilizing high temperature processing steps. Additionally, it has been observed that the method described by Lau et al., can leave enough electrically active states in the silicon epitaxial layer to preclude its use for fabrication of integrated circuits.

U.S. Pat. No. 4,509,990, entitled "SOLID PHASE EPITAXY AND REGROWTH PROCESS WITH CONTROLLED DEFECT DENSITY PROFILING FOR HETEROEPITAXIAL SEMICONDUCTOR ON INSULATOR COMPOSITE SUBSTRATES", issued to Vasudev, also describes use of ion implantation and solid phase regrowth to prepare a silicon-on-sapphire wafer. In a first principle embodiment, a method for fabricating a silicon-on-sapphire wafer very similar to that taught by Lau et al. is described with the additional requirement that the implantation energy and the ion dose are constrained such that they are sufficiently low so as not to exceed the damage density threshold of the sapphire substrate. In a second principle embodiment, the method describes a residual high defect density in the silicon layer near the sapphire substrate. Both embodiments utilize a method for controlling the temperature of the rear surface of the sapphire substrate by mounting the substrate on a heat sink with either a thin film of thermal paste or a thin film of silicon positioned intermediate to the rear surface of the substrate and the heat sink to provide a high heat conductivity interface therebetween. During the ion implantation, the temperature of the heat sink is held at a constant temperature (typically between −20° C. and 250° C.) resulting in a substantial thermal gradient between the rear surface of the sapphire and the silicon layer (typically 150° C. to 200° C.). Thus, it follows that the silicon layer is at a temperature falling in the range of 130° C. to 450° C. Symp. Proc. Vol. 107, pp. 365–376, 1988, authored by Reedy et al. discusses preparation techniques for SOS films using a double anneal with temperatures as high as 1050° C. Mention is made that adequate thermal contact must be made to prevent self annealing, however, no method of providing such contact is disclosed. Characteristics of bulk silicon and the SOS films thus produced are compared. Likewise, it is noted that N- and P-channel transistors which were fabricated in these SOS films exhibited performance characteristics which rivaled those of similar devices fabricated in bulk silicon. However, there is no discussion of fully depleted transistor operation in this paper.

The paper entitled "HIGH-QUALITY CMOS IN THIN (100 nm) SILICON ON SAPPHIRE", published in IEEE Electron Device Letters, Vol. 9, No. 1, pp. 32–34, January, 1988, authored by Garcia et al., presents substantially the same information as the above referenced Reedy et al. paper with more emphasis placed on the characteristics of the enhancement-mode N- and P-channel MOSFET's fabricated in the SOS material.

Historically, as summarized above, significant progress has been made in producing SOS material having low concentrations of crystalline defects and substrate contaminates in the silicon. However, none of this work appears to recognize or address the effects or origin of charge states, which may also be present. Additionally, there are no teachings on how to produce SOS materials and devices therein which do not have the undesirable charge states discussed above.

SINGLE CHIP ARCHITECTURE HIGH FREQUENCY WIRELESS COMMUNICATION SYSTEM

It is well known in the IC industry that integration of several high performance functions in a single chip can reduce the cost of certain functions to a level making widespread use a commercial reality. One of the earliest examples is the pocket calculator. More recent examples include a variety of very complex computer central processing unit (CPU) chips. These new CPU chips have brought large computer system performance to reasonably priced desktop personal computers. Modern communications devices present greater difficulties in high level integration because they require digital computing capability (logic and memory) along with analog and RF circuitry.

Unfortunately, the implementation of large CPU chips in bulk Si CMOS processes have brought the integration path of such systems up against another technology barrier, power dissipation. The 15 Watt power dissipation range of these large CPU chips is at the limit of cooling technology that is conventional in desktop personal computing systems. The power dissipation of such large chips is definitely outside the range of battery powered wireless communication systems, even without adding the analog and RF functions.

The need to reduce power consumption in large single-chip systems for battery powered wireless communication systems is a need which has not previously been met. Portions of such systems have been constructed using Bipolar, GaAs, and CMOS technologies, but many obstacles arise that prevent these technologies from combining different functions in a single chip architecture. Current wireless products must divide digital, analog, and RF functions among several chips. Combining these functions on a single chip would enhance product performance and reliability while decreasing size, power consumption, and manufacturing costs. However, since different functions are currently manufactured in different technologies, attempts at high levels of integration which attempt to combine digital, analog, and RF functions on a single chip have proven to be difficult, expensive and generally unsatisfactory.

One attempt at integrating several different functions on a single substrate is the thin-film hybrid process. The combination of several chips on a thin-film hybrid substrate for RF applications requires highly precise line widths and circuit elements. To create these circuits, however, many processing steps are necessary. These steps include depositing a thin layer of metal on the substrate, coating it, and finally removing the metal layer by etching to form a desired pattern. Individual chips are then interconnected by optically patterned transmission lines within the hybrid package.

Not only is the hybrid fabrication process expensive and time consuming, it has yield problems that increase greatly as the number of integrated circuits on the substrate increases. When the substrate fails a production test due to a failure in just one of the many integrated circuits required, the substrate must be subjected to an expensive rework process or discarded along with all the otherwise good components. Yield losses from incorporation of multiple chips in a hybrid circuit are a significant cost factor.

Another factor which increases hybrid costs is variations in stray coupling between closely-spaced RF circuits. Stray RF coupling between active components, passive components, and interconnect wiring is a significant factor in reducing manufacturing yields. These stray coupling variations make it difficult to achieve repeatable circuit performance, thereby resulting in a serious yield problem.

For the above reasons, attempts to integrate systems more completely using monolithic microwave integrated circuits (MMICs) have increased. Many of these efforts have been frustrated, however, by a number of significant problems caused by using non fully-insulative substrates in attempts to increase device operating frequency and reduce costs. Problems such as high electrical loss, high inter-element parasitic capacitance, high conductor-to-substrate capacitances, and other negative effects result from using non fully-insulative substrates such as gallium arsenide (GaAs) and bulk Si.

U.S. Pat. No. 4,418,470, "METHOD FOR FABRICATING SILICON-ON-SAPPHIRE MONOLITHIC MICROWAVE INTEGRATED CIRCUITS", issued to Naster et al., describes the use of SOS technology for creating an improved method for production of active devices within a MMIC. Naster's method for fabricating MMICs in SOS is limited to conventional (i.e., not fully-depleted) silicon-onsapphire. No mention of digital, analog, memory, or analog-to-digital components are included. Additionally, Naster is limited to low frequency operation due to gate length limitations of conventional SOS.

In present bipolar technology, two well known disadvantages occur: high power dissipation and low density. High power dissipation is a result of the high parasitic junction capacitance associated with using silicon as the substrate. The cross section of a bipolar device, because of its complexity, is much larger than that of a CMOS device. Consequently, the scale of integration (number of components that can be placed on a single chip) is much lower than CMOS.

Present GaAs technology is well suited for RF power active devices, but is not suitable for passive components. The substrate conductivity limits its suitability for the inductors, and lack of a stable oxide makes it unsuitable for the capacitors. GaAs technology is also not suitable for low power logic because it is not possible to build the P-channel MOS device required for CMOS logic. Finally, GaAs is not suitable for analog application because of its inability to closely match device thresholds. GaAs, overall, has proven to be an expensive technology with several manufacturing problems.

It is well known that bulk Si CMOS has frequency performance limits considerably lower than those of Bipolar or GaAs devices. Bulk Si CMOS has limited applicability for construction of RF power amplifiers in the frequency range above 700 MHz. Also, because the substrate is semiconductive, it is unsuitable for RF inductors. Power limitations become severe when bulk Si CMOS is used for ultra-large scale integration of logic in the range beyond 1 million gates. It is generally recognized that a need for a new type of quiet logic must be developed to prevent the substrate displacement currents in standard bulk Si CMOS logic from disrupting the operation of on-chip precision analog and analog-to-digital components. Quiet logic requires more components than conventional CMOS logic.

In conventional SOS technology, there are certain well known properties that limit the integration of a single chip architecture. For example, the limitation in film thickness is not adequate for fabrication of RF active devices and high speed logic devices. Short devices have shallow junctions that could not benefit from the insulating substrate.

A second property of conventional SOS technology that makes it unsuitable for the integration of single chip architecture is the limitation deriving from the kink effect. This characteristic makes conventional SOS technology unsuitable for use in linear amplifiers since devices with transfer function kinks are not linear.

A third property of conventional SOS technology is the high density of active-states, which makes it unsuitable for high-speed memory applications where sense amplifier offsets are important. Bit line and word line drive current are a dominant source of power consumption in a memory. Drive current is directly proportional to the swing required to overdrive the sense amplifier offset voltage. A typical requirement of 200 mV (milli volts, or $10^{-3}$ volts) would have to be doubled if sense amplifier offset voltages reached 200 mV.

In general, prior attempts to use conventional SOS technology for high volume commercial applications have failed due to the limitations of the substrate material. Conventional SOS technology does have superior radiation hardness characteristics, however, this is usually achieved only by accepting inferior device performance. Hundreds of millions of dollars have been spent at several research facilities around the country in attempts to overcome the problems of SOS technology. The net result is that 20 or more years of such research activity has failed to produce a robust, commercially viable fabrication technology for SOS that even approaches the low manufacturing costs, high yields and scale of integration possible in conventional bulk Si MOS technology.

A final factor required when integrating several functions into a single chip architecture is low noise operation. In order to transmit strong and clear signals, little or no noise must exist in the transmission. However, transistors naturally create noise, and it is difficult and expensive to design around high noise characteristics. In addition, various frequency levels are required to transmit information. For instance, baseband information transmitted contains so called 1/f noise (low frequency noise) yet, information transmitted in a cellular phone, requires the RF output transistors to run at high frequencies. Therefore, in a single chip technology, transistors must be able to function at low and high frequencies with as little noise as possible.

Conventional SOS and bulk Si CMOS technology have high noise factors at low frequency levels due to the charging and discharging of electrical states. Bulk Si Bipolar technology demonstrates low noise characteristics at low frequencies and moderate noise at high frequency levels, but has high power dissipation and expensive processing, which causes severe limitations. GaAs MESFETs (metal Schottky field effect transistors) have the worst 1/f noise characteristics over conventional SOS and bulk Si because of its high state density, but demonstrates the lowest noise characteristics at high frequencies. It would be a significant advantage over the above technologies if a transistor could function consistently with low noise in a cost effective single chip process.

RADIO FREQUENCY ELEMENTS

The U.S. government controls and allocates frequency bands for various applications such as radio, T.V., and wireless communications. The frequency bands allocated for wireless communications, such as cellular phones, are set at much higher frequency levels than the frequency bands for radio or television. RF (radio frequency) technology must be devised to function at these higher frequencies in order to clearly convey information in a cost-effective manner. However, device design is substantially more difficult and complicated at higher frequencies. Conventional technology can easily work with frequency levels under 700 MHz (700 million cycles per second), but encounters many obstacles at higher frequencies.

In addition to higher frequency requirements, there is an ever-increasing demand to have more information transmitted simultaneously, without interference from other channels. Higher information rates imply higher bandwidths as well as an increase in the number of communication channels.

The baseband bandwidth is defined as the bandwidth necessary to convey the information transmitted. The more complex the information becomes, the greater baseband bandwidth required. Within carrier frequency bands, channels are spaced by a distance greater than 2 times the baseband bandwidth to prevent interference. At lower frequencies, such as AM radio, baseband bandwidth is lower, which allows more channels to fit within the carrier frequency band compared to the number of channels that can fit into an FM radio band. The quality of sound transmitted, however, is not as clear as FM radio whose wider bandwidth creates better sound quality, but requires greater spacing between channels. The same effect applies to higher frequency bands used for cellular phones.

The major obstacle to fabricating high frequency devices on an insulative substrate using present technology methods is the inability to achieve an adequate device gain-bandwidth product. A gain-bandwidth product, $f_t$, is defined as the signal amplification times the frequency, (or as the frequency at which device gain equals 1). To achieve high gain-bandwidths for wireless communications above 700 MHz, high transconductances and low device capacitances are required. These requirements are necessary because the gain of a transistor is simply the ratio of transconductance to device output conductance, both of which are affected by device capacitance, which is a parasitic load. An acceptable high frequency performance for a gain band-width product suitable for a 700 MHz amplifier would be, for example, an $f_t$ of 10 gigahertz (GHz).

Devices fabricated in bulk silicon (Si) are characterized by comparatively high parasitic capacitances. Thus, the gain-bandwidth product for such devices runs well below 10 GHz. The dominant output capacitances are due to the capacitance from gate to source and from gate to drain resulting from coupling through the mobile channel charge, as well as the parasitic overlap capacitance from the gate to the lightly doped drain diffusions (LDD regions) and due to the junction capacitances from the channel, source and drain diffusions to substrate.

The use of silicon-on-insulator (SOI) technology is a well known method for reducing junction capacitance in metal oxide semiconductor (MOS) devices. If the junctions are diffused to a depth greater than the film thickness, the bottom wall of the junction becomes the insulator top surface, and the bottom wall component of the junction capacitance is eliminated. The problem facing designers who use conventional SOI technology in this manner is the thickness of the epitaxial silicon layer, i.e., in the range of 4,000 to 6,000 Å. The source and drain regions are diffused in a downward direction to at least the same depth. Additionally, a bulk Si process step resulting in a 4,000 Å diffusion depth results in approximately 3,000 Å of sideways diffusion. It is generally considered acceptable for the sideways diffusion to be as much as ⅕ of the gate length. Therefore, this amount of sideways diffusion is characteristic of a 1.5 μm gate-length process.

Unfortunately, to produce a device with transconductance high enough to achieve gain-bandwidths in the range beyond 10 GHz, channel lengths must be shortened considerably below 1.5 μm. For a 0.8 μm channel length device, required junction depths are ⅕ of 0.8 μm, or approximately 0.15 μm (1500 Å). Fabricating such a device using traditional silicon-on-sapphire (SOS) techniques on an insulative substrate results in unacceptably high junction capacitance. This effect occurs because a 0.15 μm junction bottom wall depth is far shallower than the 0.4 μm depth of the interface between the Si film and the sapphire insulator. The bottom wall capacitance cannot therefore be reduced by contact with the insulator. (Note: As used herein, traditional or conventional SOS is defined as a 400 to 800 nanometers [i.e., 4,000 Å to 8,000 Å] thick silicon film on a sapphire wafer. This film thickness is capable of supporting transistors having minimum channel lengths of about 1–1.5 microns. Additionally, traditional or conventional SOS has a high level of crystalline defects and is not fully depleted.)

Short channel effects seriously degrade output conductance if the device is constructed with a short, deep channel in bulk silicon or conventional SOS. A short, deep channel region increases the control the drain has over the channel near the source. This causes threshold to vary with drain voltage and channel length. The ability of the gate to shut off the channel is also degraded.

Not only are there limitations in bulk Si for constructing high frequency active RF components, but also in the integration of both active and passive RF components in a single chip. The physical dimensions of RF active components in non-insulating substrates, can be small enough to be incorporated on the top surface of a Si or gallium arsenide (GaAs) device. Unfortunately, the conductivity of the underlying substrate (typically doped above $1 \times 10^{15}$ cm$^{-3}$) results in unacceptably high loss factors at frequencies above 700 MHz for passive components such as inductors. GaAs results in a much lower loss factor than bulk Si, but for the best results, an insulating substrate must be used to integrate on-chip inductors or interconnects.

ANALOG ELEMENTS

It is generally recognized that there are numerous problems associated with the integration of precision analog components, such as high resolution analog-to-digital converters (ADCs) and digital-to-analog converters (DACs), with complex logic systems on the same non-insulating silicon substrate. A non-insulating substrate carries high logic noise voltages as a result of displacement currents in the logic and at the logic/external-bus interface. An insulating substrate, such as sapphire, is required to isolate the analog components from the substrate noise produced by the digital logic, random-access memory (RAM), and I/O in highly integrated systems.

However, the fabrication of analog circuitry on insulative substrates is severely limited by a problem arising in N-channel MOS devices. N-channel MOS devices fabricated in conventional SOS technology suffer from a limitation known as the "kink effect."

The kink effect is associated with floating undepleted regions under the conduction channel, and is a result of holes produced from drain impact ionization current. These holes propagate toward the source and charge the undepleted portions of the substrate below the gate. For N-channel devices, the substrate region charges positively, and the resulting source-body voltage change increases the current in the transistor. This extra current distorts the operation of the transistor, causing an amount of current to pass through the devices that is not proportional to the gate control voltage. This unpredictable and non-linear operation makes the devices unsuitable for analog circuit design.

For example, analog circuit designers typically use a set of curves, referred to as a family of curves, to assist them in a circuit design. These curves determine the drain to source current ($I_{DS}$) at a given drain to source voltage ($V_{DS}$), resulting from a given gate to source voltage ($V_{GS}$). The curves show a saturation of the current after a certain point, which results in a family of drain current curves, one for each gate voltage. In ideal behavior, drain current saturates (or stops increasing) above a certain drain voltage referred to as $V_{DSAT}$, or saturation voltage. However, where the kink effect is present, as in devices fabricated on traditional SOS substrates, increases in drain voltage produce significant impact ionization at a certain value, and the drain current increases as a highly non-linear function of drain voltage.

In the construction of linear components required for precision analog components, such as linear preamplifiers, the kink effect must be eliminated. If not, a high degree of non-linearity is present in their transfer functions. Also, the increase in current causes a decreased output conductance and therefore a decrease in device gain.

Another major limitation for analog components in bulk Si, SOI, and conventional SOS is the source body effect. Source body effects are a well known problem in these technologies. Integrated Circuit (IC) industries spend large amounts of resources in attempts to design transistors to function in the presence of source body effects.

The source body effect occurs when the source is not held at the substrate or body potential. When there is an increase in source potential, there must be an increase in surface potential at the source-end of the device if the source current is to be held constant. Unfortunately, the increase in surface potential creates a deeper depletion region under the channel. The increased depletion charge competes with mobile channel charge for the total charge induced voltage drop across the gate oxide capacitance. The effect is the same as an increase in threshold voltage caused by an increase in fixed depletion charge.

When the gate is on for a typical analog transmission gate in bulk Si, SOI, or traditional SOS, and the analog source input is in the voltage range approximately half-way between the supply voltages, the source-body voltage of both PMOS and NMOS devices plays an important role in increasing "on resistance". Consider a case with a 2.5 volt positive supply voltage, a 2.5 volt negative supply voltage, and the input source near zero volts. The source-body voltage of 2.5 volts for either N or P transistor contributes to an increase in threshold voltage by an amount of nearly 1 volt in a typical process. "On resistance" is inversely proportional to the gate voltage in excess of threshold, otherwise known as "gate drive". When device threshold is 0.7 volts plus 1.0 volts for source-body voltage, a gate supply voltage of 5 volts produces a gate drive of less than 1 volt.

LOGIC ELEMENTS

Technologies such as GaAs and Bipolar offer many desirable radio frequency properties. However, high power consumption results when large amounts of logic are required.

Complementary MOS (CMOS) consumes the lowest logic power of any common technology, but is severely limited in speed and power by the poor performance of the PMOS devices in comparison to NMOS devices. PMOS channel widths must be significantly larger than NMOS channel widths. However, CMOS logic circuitry would exhibit many significant advantages for logic circuity if the PMOS channel widths could be reduced to be comparable to the NMOS channel widths.

One of the problems associated with bulk Si PMOS devices fabricated in CMOS processes is poor transconductance characteristics. This drawback exists for several reasons. PMOS mobility is low as a result of hole mobility being lower than electron mobility. Additionally, CMOS processes include scattering by the total quantity of N-type and P-type dopants required to achieve proper device thresholds. The PMOS channel widths, also, must be made significantly larger than the NMOS channel widths in order to provide drive currents adequate to maintain high clock speeds. Consequently, the PMOS devices substantially increase the capacitive input load presented by a CMOS gate, resulting in high operating voltage and power requirements. If a logic element capacitive load could be reduced as a result of narrower PMOS devices, the excess speed could be traded for narrower N and P devices operating at the same speed, but consuming less silicon area. Less silicon area results in reduced fabrication costs.

Another factor contributing to wide NMOS and PMOS channels for logic elements in bulk Si and conventional SOS is the source-body effect as described in the above section on analog components.

A second important logic power limitation in bulk Si arises from an increased logic supply voltage required when the logic subsystem must be operated on a CMOS chip with a linear subsystem requiring a negative substrate bias. Part of the logic power reduction objective is to eliminate the effects of substrate bias in increasing the logic supply voltage.

In order for linear subsystems to operate in the voltage range above and below ground, it is often required that the substrate voltage of an integrated circuit be biased in the range of 3 to 5 volts below ground. A negative substrate bias requires an increase in logic power supply voltage to maintain speed while overcoming well known source-body threshold voltage increases. Such increases result from the N-channel devices operating with a negative substrate bias.

When an increase in speed is desired, higher supply voltages must be used in bulk Si technology with negative substrate bias. If the supply voltage could be reduced by a significant factor, dynamic current would be reduced in direct proportion. Because logic power is dominated by the product of dynamic current and voltage, power can be reduced as the square of the voltage decreases. In bulk Si, however, it is very difficult to lower voltages and maintain speed with a negative substrate bias.

Another problem with traditional SOS MOS devices is the limitation to channel lengths in excess of 1.5 $\mu$m. Because digital system power is related strongly to channel lengths, these relatively long channel lengths result in excessively high power requirements for the digital subsystem of a single chip architecture wireless communication system.

Other difficulties exist in bulk Si for PMOS logic elements relating to the source and drain doping requirements. The diffusivity of boron in silicon at a given temperature is far higher than arsenic, the dopant of choice for N-channel MOS transistor source and drain diffusions. High temperature and time combinations are required to diffuse arsenic to a depth sufficient to prevent source and drain "contact spiking" in a bulk CMOS process. If the arsenic is not diffused sufficiently, the contact will spike, or vertically penetrate the bottom wall of the junction. A shorting of the diffusion to the substrate then exists.

In submicron bulk Si technology, high time/temperature combinations for arsenic diffusion causes excessively deep boron diffusion for the PMOS device. The time-temperature products required to eliminate contact spiking cause sideways diffusion of the boron source and drain into the PMOS channel. To compensate for this action, PMOS transistor gate lengths must be drawn about 0.1 $\mu$m greater than NMOS gate lengths. If the time-temperature products are lowered, less sideways diffusion occurs thereby allowing PMOS channel lengths to be drawn at the same length, or shorter than the NMOS devices. To have the ability to create equal or shorter PMOS electrical channel lengths than the NMOS channel lengths, while still retaining acceptable output conductance value for logic devices, would be a major improvement over present technologies.

Finally, the effect of gate-drain and gate-drain parasitic overlap capacitance in conventional logic is enhanced by what is commonly known as "the Miller effect" in linear circuits. Consequently, a non-negligible portion of the current from a logic element driving a CMOS inverter is consumed in charging the parasitic overlap capacitance enhanced by the Miller effect as the inverter output makes a rapid voltage transition. Again, if the PMOS gate width is reduced to approximately the same measurement as the NMOS gate width in a logic inverter and the reduced lateral diffusion causes less overlap capacitance, speeds will increase by nearly a factor of 2 by comparison to inverters fabricated at the same feature size in bulk Si or conventional SOS CMOS processes.

MEMORY ELEMENTS

The key memory elements comprising a typical memory chip include decoders, drivers, memory cells and sense amplifiers. Memory power is dominated by word line voltages required to adequately drive cell pass transistors. This is true for both static and dynamic random-access memories (SRAM and DRAM).

GaAs and Bipolar technologies are not suitable for large amounts of memory. These technologies are incapable of integrating the amount of memory, both in terms of size and power, required for a single-chip wireless communication system. The high power consumption, read/write switching currents, and noise introduced through the substrate to precision analog components are significant limitations in bulk Si CMOS technology. One major source of noise current generation is the current required to charge the word lines. A major portion of this current is displacement current resulting from charging the pass-gate capacitance.

In order to improve power dissipation and high noise current generation in bulk Si, word line current must be reduced. There are numerous sources that contribute to word line current in addition to pass-gate capacitance. One such source is the interconnect capacitance from word line to substrate.

Interconnect capacitance is reduced in the SOI process. However, SOI processes suffer from high pass-gate capacitance as a result of the 1.5 $\mu$m limitation in device length previously described. Because interconnect capacitance is typically less than 10% of total word line capacitance, the benefit in reducing it is perhaps on the order of only 5%. There is, however, a more significant benefit from making the use of SOI technology practical. The benefit is derived from the elimination of the coupling of voltage noise to the sensitive analog circuitry from the word line and associated pass transistor dynamic current coupling through the conductive substrate.

A second source of word line current is the capacitive loading of "off" pass transistors. In a typical SRAM cell, half of the pass transistors connected to the word line will not turn on, and therefore, no conductive channel forms. In a typical DRAM cell, such as used for coefficient RAM in telecommunication system digital filters, the abundance of digital 1's in the coefficients results in a significant fraction of the pass transistors not being turned on. The charge required to drive the gate of the "off" pass transistors in a bulk Si CMOS DRAM or SRAM is higher than the charge required to drive a transistor to the threshold voltage. The total charge required results from the gate voltage pushing out the depletion layer charge in the conductive substrate below over the entire range of gate voltage swing. This kind of charge push is commonly known as "deep depletion."

A third source of word line current results from charging the gate capacitance of the "on" pass transistors. The gate capacitance is a result of the device width required to achieve a given speed. If bit line capacitance can be significantly reduced, it may be possible to reduce the pass transistor device width. Pass transistor size reductions, then, can contribute to a reduction in overall memory operating current. Note that other design issues such as read margin must be considered in selecting a pass transistor device width.

In addition, there are several sources contributing to bit line capacitance that, if reduced, will assist in the reduction of pass-transistor size and bit line charging current. The sources include parasitic overlap capacitances from the pass transistor gate to source and drain, the parasitic junction capacitance of the diffusions on the bit line, and the interconnect capacitance of the bit line itself. SRAM bit line current is a major factor contributing to overall memory power requirements in large high-speed memories.

Another source of SRAM bit line current is the charge required to deliver the voltage swing required at the sense amplifier. Voltage swing determines how much drive current is required on the bit lines to reach an unambiguous sense amplifier result within the required time interval. By decreasing the sense amplifier offset voltage, the required voltage swing decreases.

This charge is determined largely by cell area. There are several factors that contribute to large cell area in bulk Si devices. For example, there is a need to devote a fraction of the cell or cell array area to a substrate tie and a "well tie". Both ties are required in every cell, or in some cases every fourth cell, to stabilize the voltage in both the N and P diffusions underlying the N and P devices to prevent latch-up. The need for a well structure yields another factor limiting SRAM cell area in bulk Si, the need to increase N-channel to P-channel spacing to accommodate the added well dimensions.

Also, a significant contributor to limited cell size in DRAMs is the requirement to store sufficient charge to provide an adequate signal level. This is often expressed as a ratio of cell capacitance to bit line capacitance, thus reduced bit line capacitance implies reduced DRAM cell capacitance and size. A DRAM cell must also maintain signal charge sufficient to overcome upsets resulting from alpha particle track charge collection. With an insulating substrate, charge collection from the portion of the particle track in the substrate is eliminated. Vertical track charge collection, therefore, cannot be enhanced by well known phenomena, such as "funnelling". In bulk Si, this process distorts the fields under the depletion region and results in collection of alpha track charge deep within the bulk Si MOS substrate. Die coating and packaging techniques can also reduce alpha particle sensitivity.

Relative P-Channel And N-Channel Dimensions In CMOS Circuits

CMOS circuits consist of two complementary transistor types, namely a p-channel transistor and an n-channel transistor, both of which are generically referred to as MOSFETs (Metal Oxide Semiconductor Field Effect Transistors). Each transistor consists of a drain, gate, and source. CMOS transistors formed on a substrate of the patterned semiconductor material are referred to as bulk CMOS transistors. The p-channel transistor is enabled, or turned on, with a negative drain to source voltage, whereas the n-channel transistor is enabled with a positive drain to source voltage. Typically, a p-channel transistor is connected to drive a more positive supply voltage from source to drain and thus serves as a "pull-up, whereas, a n-channel transistor is connected to drive a more negative supply voltage from source to drain and thus serves as a "pull-down".

Integrated circuits implemented in CMOS technology exhibit relatively low power dissipation since CMOS gates require virtually no D.C. (direct current) from the power supply. In addition, CMOS technology is readily suitable to very large-scale integration (VLSI) since MOSFETs typically require less space for physical implementation than other technologies such as bipolar junction transistors.

A representative conventional CMOS circuit shall be explained with reference to FIG. 16, which shows a CMOS inverter circuit 131 which includes a p-channel "pull-up" transistor 134P and an n-channel "pull-down" transistor 134N. A common input signal on line 135 is provided to the gates 132, 133 of the two transistors, and a common output signal is provided on line 136. The source terminal 137 of the p-channel transistor is connected to a positive $V_{cc}$ bias voltage. The drain terminal 138 of the p-channel transistor and the drain terminal 139 of the n-channel transistor both are connected to the output line 136. The source terminal 140 of the n-channel transistor is connected to ground 141.

In operation, the inverter 131 acts like two switches. When the input logic signal is in one logical state, then the p-channel transistor 134P conducts, the n-channel transistor 134N is cut off, and voltage $V_{cc}$ appears on the output line 136. When the input logic signal is in the opposite logical state, then the p-channel transistor 134P is cut off, the n-channel transistor 134N conducts, and a voltage zero appears on the output line 136. In either case, virtually no DC current flows through the inverter 131. Hence, the circuit exhibits low power dissipation.

MOSFET dimensions typically are specified in terms of channel length and channel width. Referring to the illustrative drawing of FIG. 11, there is shown an isometric view of a typical transistor (p-channel or n-channel) with a gate, source, and drain showing the generalized device geometry and the channel width (W) and length (L) dimensions. Channel dimensions are a critical factor in FET performance for many of the reasons set forth below.

In general, in high performance CMOS circuits, the minimum channel length of n-channel transistors is shorter than or equal to the minimum channel length of p-channel transistors. Conversely, the channel width of the n-channel transistors ordinarily is less than the channel width of the p-channel transistors. The reasons for these differing channel geometries has to do with charge carrier mobilities and transistor breakdown characteristics.

One of the challenges in developing high performance CMOS circuits is in compensating for the differing charge carrier mobilities in p-channel and n-channel transistors. The effective mobility of "hole" carriers in p-channel transistors is less than the effective mobility of electron carriers in n-channel transistors. As explained below, p-channel widths are made to be wider than n-channel widths in order to compensate for this difference in carrier mobilities. For further discussion on carrier mobility, refer to "VLSI Technology", Second Edition, edited by S. M. Sze, published by McGraw-Hill, New York, Section 8.2.4.

Another challenge is transistor breakdown. Transistor breakdown can be defined generally as unintended transistor "on" behavior which occurs for a transistor which should be in the "off" state at a specified drain to source voltage. A shorter transistor channel length usually results in a lower transistor drain to source breakdown voltage. Hence, breakdown voltage often is the factor used to set minimum MOSFET channel length. There are two common transistor breakdown mechanisms: impact ionization breakdown (also known as avalanche breakdown) and punch-through breakdown. "Physics of Semiconductor Devices," Second Edition, by S. M. Sze, published by John Wiley & Sons, Taipei, Taiwan, at 344 and at Sections 8.4.3–8.4.4, at 477–485 discusses transistor breakdown mechanisms.

Impact ionization breakdown primarily affects n-channel transistors. For an n-channel transistor, impact ionization breakdown typically occurs at a similar voltage to n-channel punch-through breakdown, but at a similar or greater voltage than p-channel transistor punch-through breakdown given equivalent transistor channel lengths.

Source-to drain punch-through breakdown occurs in the bulk silicon beneath a p-channel or n-channel transistor. U.S. Pat. No. 5,141,882 entitled, Semiconductor Field Effect Device Having Channel Stop and Channel Region Formed in a Well and Manufacturing Method Therefore, which issued to Komori, et al. on Aug. 25, 1992 discusses punch-through breakdown.

Punch-through transistor breakdown results from a combination of the spreading of source and drain diffusion depletion regions in the bulk silicon and a strong lateral electric field derived from a given drain to source voltage. The illustrative drawings of FIG. 17 show a conventional MOSFET 81 with a bulk silicon substrate 84. The arrows 94 represent the lateral electric field contours between source 86 and drain 90. Punch-through breakdown ordinarily occurs where the lateral electric field is the strongest, primarily in the bulk region 84 farther away from the electric field control imposed by voltage applied to the transistor gate 88. This is shown in FIG. 17 by the lateral electric field contours that extend between the source 86 and drain 90 rather than terminating in the gate channel region 92.

In conventional CMOS circuitry with a bulk silicon substrates, p-channel lengths ordinarily are made to be equal to or longer than n-channel lengths in order to avoid p-channel transistor punch-through breakdown. Specifically, p-channel transistor source and drain junctions typically are deeper than n-channel transistor source and drain junctions due to the typical p-channel transistor source and drain dopant (boron) being lighter than the typical n-channel transistor source and drain dopant (arsenic). Deeper p-channel junction depths result in poorer punch-through breakdown performance since the "off" control imposed voltage at the transistor gate diminishes with increased distance from the transistor gate.

Hence, typical high performance CMOS technologies are constructed so that the minimum p-channel length is greater than or equal to the minimum n-channel transistor length in order to provide comparable breakdown characteristics. An increased transistor channel length increases punch-through breakdown voltage due to a corresponding reduction in the lateral drain-to-source electric field strength in the bulk silicon beneath the longer transistor channel.

A longer p-channel length, however, exacerbates the performance problems associated with the lower effective charge carrier mobility of hole carriers in p-channel transistors. Transistor switching speed is inversely proportional to channel length. Longer channel length results in slower transistor switching speeds. In addition, switching speed is proportional to change carrier mobility. For example, lower charge carrier mobility yields lower transistor current drive. A transistor with lower current drive requires more time to charge a capacitive load. Hence, a transistor with lower mobility carriers switches more slowly. In order to balance the switching speeds of the p-channel and the n-channel transistors of a CMOS circuit, the p-channel width is increased relative to the n-channel width. As a result, in CMOS circuits, p-channel transistors often have the same or a greater channel lengths but wider channel widths than n-channel transistors.

Unfortunately, a longer p-channel length and/or a wider p-channel width can result in an increased capacitive load on preceding logic stages driving the p-channel transistor. This can substantially reduce CMOS circuit speed and can increase the power dissipation. Additionally, the increased p-channel width can increase the overall area occupied by a CMOS circuit. Factors such as switching speed, compactness of integration, and power dissipation are prime determinants of the costs and commercial success of integrated circuits.

Thus, there has been a need for improved CMOS circuits with p-channel transistor geometries reduced relative to geometries of n-channel transistors so as to provide balanced high speed n-channel transistor and p-channel transistor performance while exhibiting acceptable p-channel breakdown behavior, limited power dissipation and compact integration. The present invention meets these needs.

SUMMARY OF THE INVENTION

An integrated circuit comprises an insulating substrate with a layer of silicon formed on it. A p-channel transistor and an n-channel transistor are formed in the silicon layer and are interconnected in a CMOS circuit. The ratio of the p-channel length to the n-channel length in the CMOS circuit is less than or equal to one.

In another aspect of the invention, an integrated circuit comprises an insulating substrate with a layer of silicon formed on it. A p-channel transistor and an n-channel transistor are formed in the silicon layer and are interconnected to form a balanced CMOS circuit. The respective source and drain regions of the p-channel transistor and the n-channel transistor extend substantially to the substrate.

In yet another aspect of the invention, a method is provided for producing CMOS circuit. The method involves the steps of providing an insulating substrate, and forming a semiconductor layer on the substrate. An n-channel transistor and a p-channel transistor are formed adjacent to each other on the semiconductor layer such that the source and drain regions of the n-channel and p-channel transistors extend from an upper surface of the semiconductor layer to the semiconductor-insulator interface. The n-channel and p-channel transistors are formed such that their channels both are fully depleted, and such that the ratio of the p-channel length to the n-channel length is less than or equal to one.

DETAILED DESCRIPTION OF THE PREFERRED EMBODIMENTS

Figure 1A:
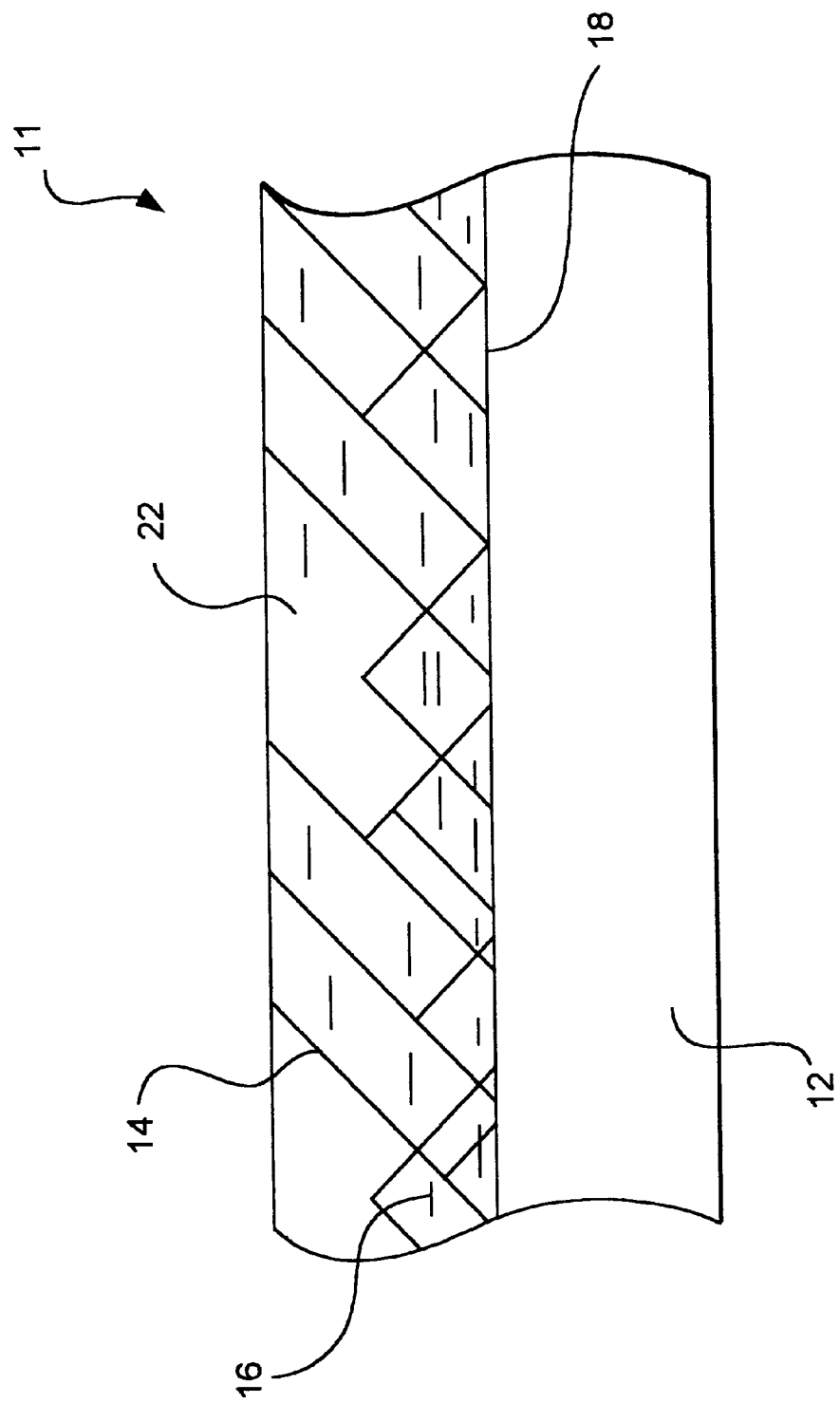
FIGS. 1A–1E illustrate steps in the process of converting an epitaxial silicon on sapphire wafer into a substantially pure silicon on sapphire wafer.

The present invention comprises novel CMOS circuitry. The following description is presented to enable any person skilled in the art to make and use the invention. Descriptions of specific applications are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

SILICON-ON-SAPPHIRE SUBSTRATES AND DEVICES

The present invention will now be described with reference to the FIGURES. Like reference numbers refer to like or similar regions depicted in the FIGURES. It is to be understood that the several views and the present descriptions are by way of example and that the scope of the current invention is not limited by such views or descriptions. It is understood that both N- and P-type MOSFETs can be made simultaneously on the same sapphire substrate, as shown throughout FIGS. 2 and 3, thereby comprising complimentary MOS (or CMOS) circuits.

In one embodiment, the present invention is in the form of an ultrathin intrinsic silicon film on an insulating sapphire substrate wherein the silicon film contains extremely low concentrations of charge states and a process for making same. Ideally, the intrinsic silicon contains no dopant atoms or electrically active states, either within the silicon film or at the interface between the silicon and the sapphire. While complete elimination of all charge states and dopant atoms is not feasible, trace amounts are acceptable within tolerances determined by the application. For example, if a threshold voltage is to be set to an accuracy of $\delta$ Volts, the total charge in the silicon film should be less than about $\delta/C_{ox}$ where $C_{ox}$ is the gate oxide capacitance per unit area. Other tolerances can be determined similarly. Analog circuitry and memory sense amplifiers have the most exacting requirements for low active state density. As an example, an areal density of active states less than approximately $2\times10^{11}$ cm$^{-2}$ will produce a shift in threshold voltage by an amount less than 200 mV. Here, the areal charge density is multiplied by the unit electronic charge $1.6\times10^{-19}$ coul and divided by the specific oxide capacitance $190\times10^{-9}$ farad cm$^{-2}$ to estimate the threshold voltage shift. Equally important is the variation in this contribution as it affects the offset voltage of an amplifier. That variation is estimated by dividing the threshold shift by the square-root of the total number of active states under the gate of the amplifier input MOSFET. For the example chosen, an areal density of $2\times10^{11}$ cm$^{-2}$ will produce a variation (standard deviation) in offset voltage equal to approximately 1 mV when the gate area is 20 $\mu$m$^2$. This offset is small enough to provide low offset voltages for sense amplifiers. Other applications may tolerate total allowable fixed charge up to as much as $5\times10^{11}$ cm$^{-2}$.

In a preferred embodiment, as shown in FIG. 1A, a 270 nm thick intrinsic silicon film 22 is deposited on a sapphire substrate 12 by epitaxial deposition to form a silicon-on-sapphire wafer 11. After the epitaxial deposition, the silicon film 22 contains a concentration of twin defects 14 and electrically active states 16. The thickness of the silicon film 22 is controlled during the epitaxial deposition process using standard processes.

Figure 1B:
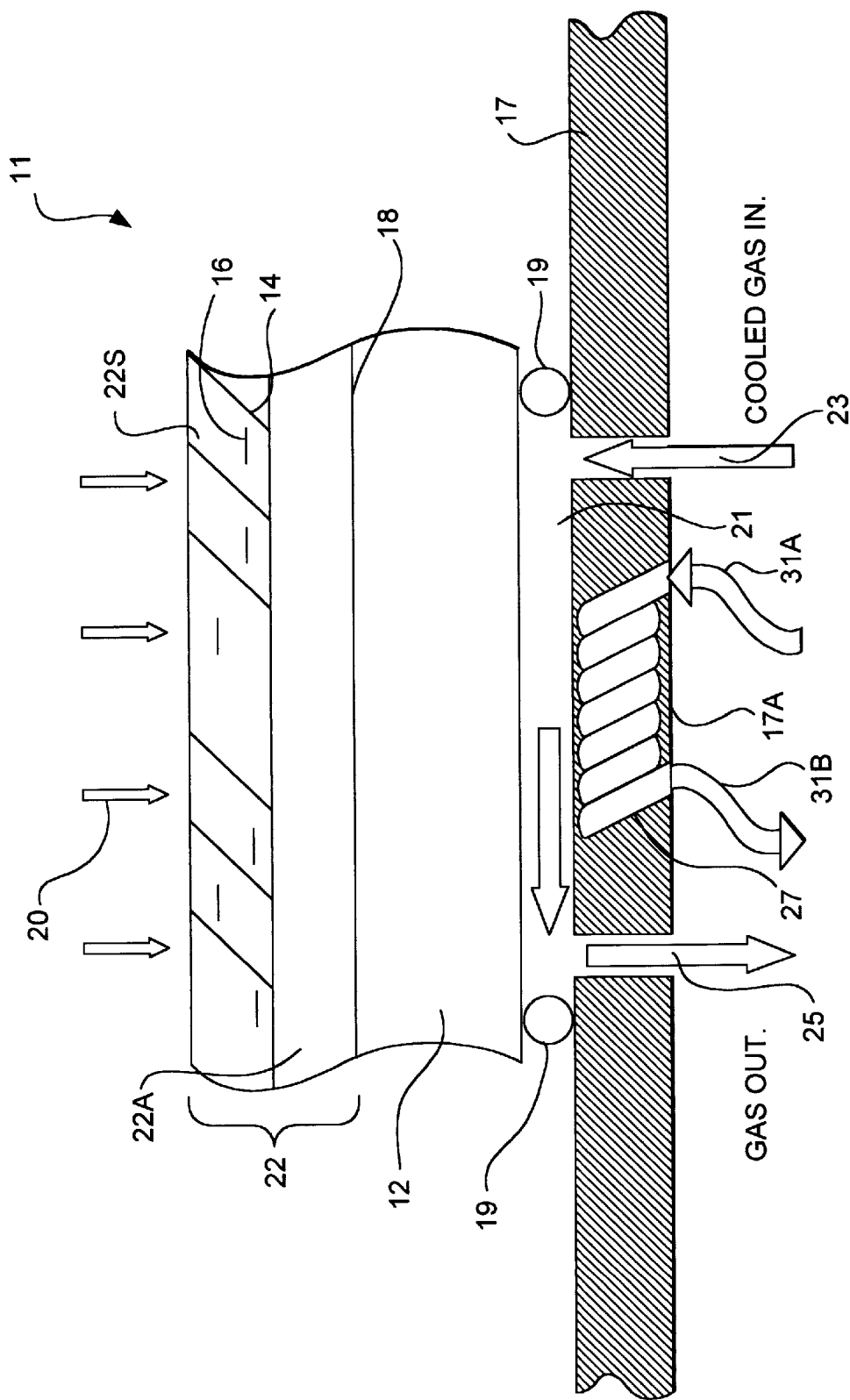

Referring to FIG. 1B, a 185 keV Beam of Si ions 20 is implanted into the silicon film 22 at a dose of approximately $6\times10^{14}$ cm$^{-2}$, thus creating a subsurface amorphous region 22A and leaving a surface monocrystalline silicon region 22S. The energy and dose of the beam of Si ions 20 are selected so that the amorphous region 22A extends from an interface 18 formed between the sapphire substrate 12 and the Si film 22 up into the Si film 22 to a thickness which is greater than the desired final thickness of Silicon film. In this embodiment, the amorphous region 22A is approximately 200 nm thick.

The amorphous region 22A in the 270 nm thick intrinsic silicon film 22 is created by implantation with the Si ion beam having an energy of 185 keV at a dose of $6\times10^{14}$ cm$^{-2}$ while maintaining the silicon film 22 at a uniform temperature at or below about 0° C. It has been found that this process will uniformly amorphize layer 22A without causing aluminum atoms to be released from the sapphire substrate 12 into the silicon film 22. While others have reported cooling the substrate by placing it on a cooled heat sink during implantation, none have paid particular attention to the temperature of the silicon film 22 during the implantation nor have they adequately addressed the issue of uniform cooling of the silicon film.

Previous cooling techniques include various techniques for placing the sapphire substrate 12 in contact with a cooled heat sink. Contact between the sapphire substrate and the heat sink was accomplished in a variety of ways including the use of a thermal paste layer interposed between the sapphire and the heat sink; depositing a layer of indium on the sapphire to provide more uniform contact with the heat sink; polishing the sapphire surface to improve contact with the heat sink; etc. However, these techniques created other problems and have been found to be inadequate for forming silicon films free of defects, dopants and charge states. A common shortcoming of these techniques is that it is very difficult to insure that the thermal contact between the sapphire and the heat sink is uniform over the entire sapphire surface. Non-uniform contact results in a nonuniform temperature within the overlying silicon film 22 which creates an amorphous layer 22A which is not uniformly amorphous due to partial self annealing. If the silicon film 22 is held at higher temperatures, the dose and/or energy must be increased to insure amorphization of layer 22A. If the temperature of the silicon film 22 is maintained at too high a temperature or not controlled at all, the ion implantation will cause the substrate temperature to rise, thereby increasing the required dose and/or energy required to amorphize layer 22A to a level where aluminum will outdiffuse from the sapphire 12 into the silicon 22. The present invention overcomes these shortcomings by cooling the sapphire with a chamber filled with cooled gas and/or a cooled support structure and by adjusting the gas flow, pressure and/or temperature of the gas and the temperature of the chamber's backside to insure that the silicon layer 22 is maintained at or below a predetermined temperature. For the dose and energy cited above, the substrate 12 is cooled to a temperature which maintains the surface of the silicon film 22 at a temperature preferably lower than about 0° C. One configuration for accomplishing these objectives is illustrated in FIG. 1B.

As shown in FIG. 1B, the SOS wafer 11 is positioned on a support structure 17 in a manner which creates a chamber 21 between the sapphire substrate 12 and the cooled support structure 17, for example, by placing an O-ring 19 between the support structure 17 and the SOS wafer 11. Cooled gas is circulated through the chamber 21 to cool the substrate 12. In a presently preferred embodiment, the coolant gas is hydrogen. Since the gas has the same thermal contact with all areas of the substrate 12, uniform cooling is assured. Gas enters the chamber 21 through an inlet 23 and exits the chamber through an outlet 25. The gas provides thermal contact to the cooled support structure 17 which removes the heat. Additionally, support structure 17 has a cooled region 17a which is cooled by a coil 27 having a coolant inlet 31a and a coolant outlet 31b. The support structure is cooled by flowing coolant into the inlet 31a, through the coil 27 and out the outlet 31b. The coolant flow and temperature are adjusted to insure that the silicon layer 22 is maintained at or below a predetermined temperature.

Figure 1C:
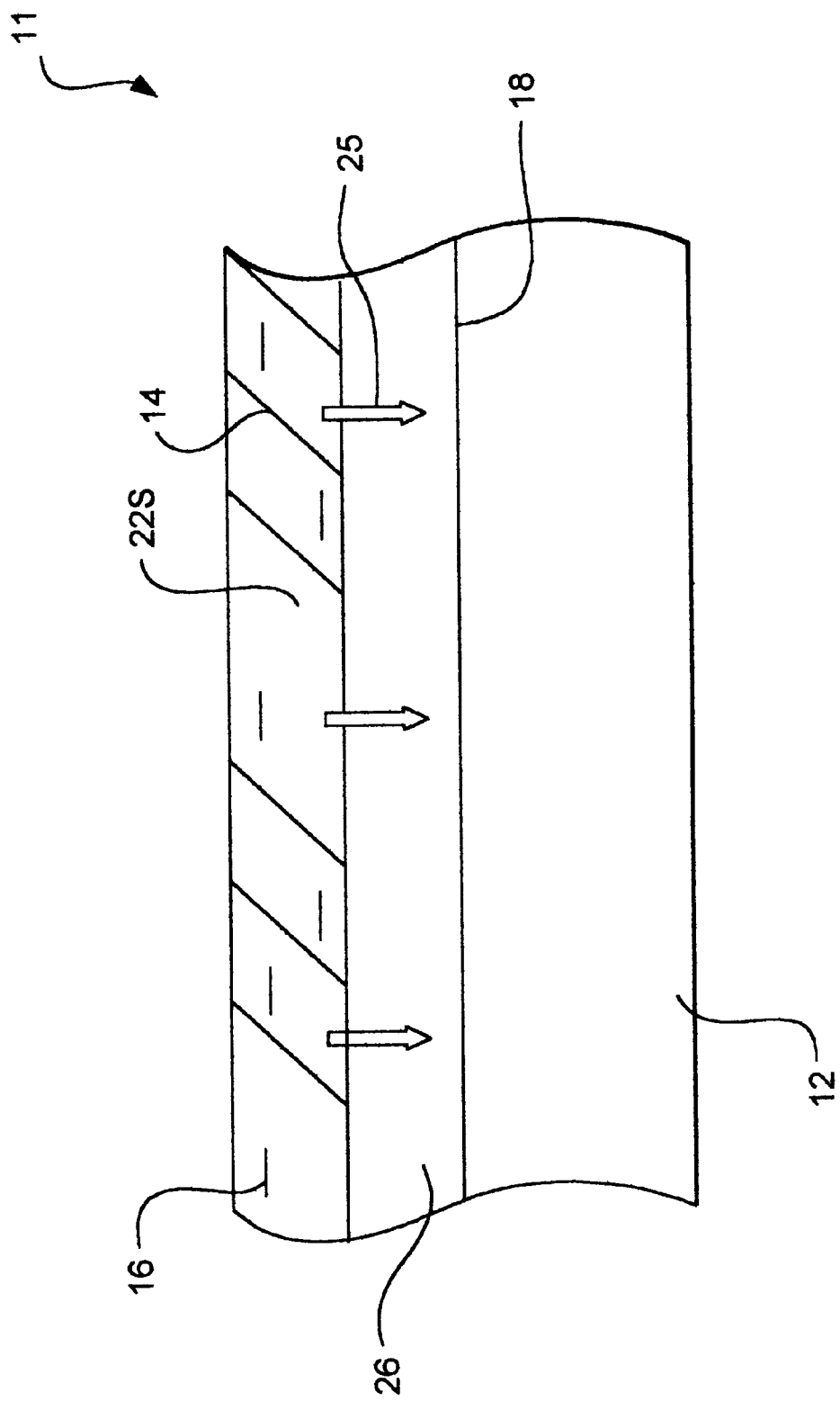

After creating the amorphous region 22A through silicon ion implantation, the SOS wafer 11 is subjected to a thermal anneal step at approximately 550° C. in an inert atmosphere (e.g. nitrogen) to induce solid phase epitaxial regrowth from the surface of the monocrystalline silicon region 22S downward through the amorphous region 22A to the interface 18. Thus the amorphous region 22A is regrown as a single crystal region, generally indicated at 26 in FIG. 1C. The direction of the regrowth from the monocrystalline silicon region 22S to the interface 18 is depicted by arrows 25 in FIG. 1C. Regrowth is accomplished in approximately 30 minutes. Upon completion of this solid phase epitaxial regrowth, the anneal temperature is ramped over a time of approximately 30 minutes to approximately 900° C. in an inert atmosphere (e.g. nitrogen) and held at 900° C. for a time of approximately 30 minutes to remove any remaining defects or states, thereby converting the amorphous region 22A (FIG. 1B) into a substantially pure single crystal region 26 (FIG. 1C) devoid of the twins 14 and the bandgap states 16 (FIG. 1A).

Figure 1D:
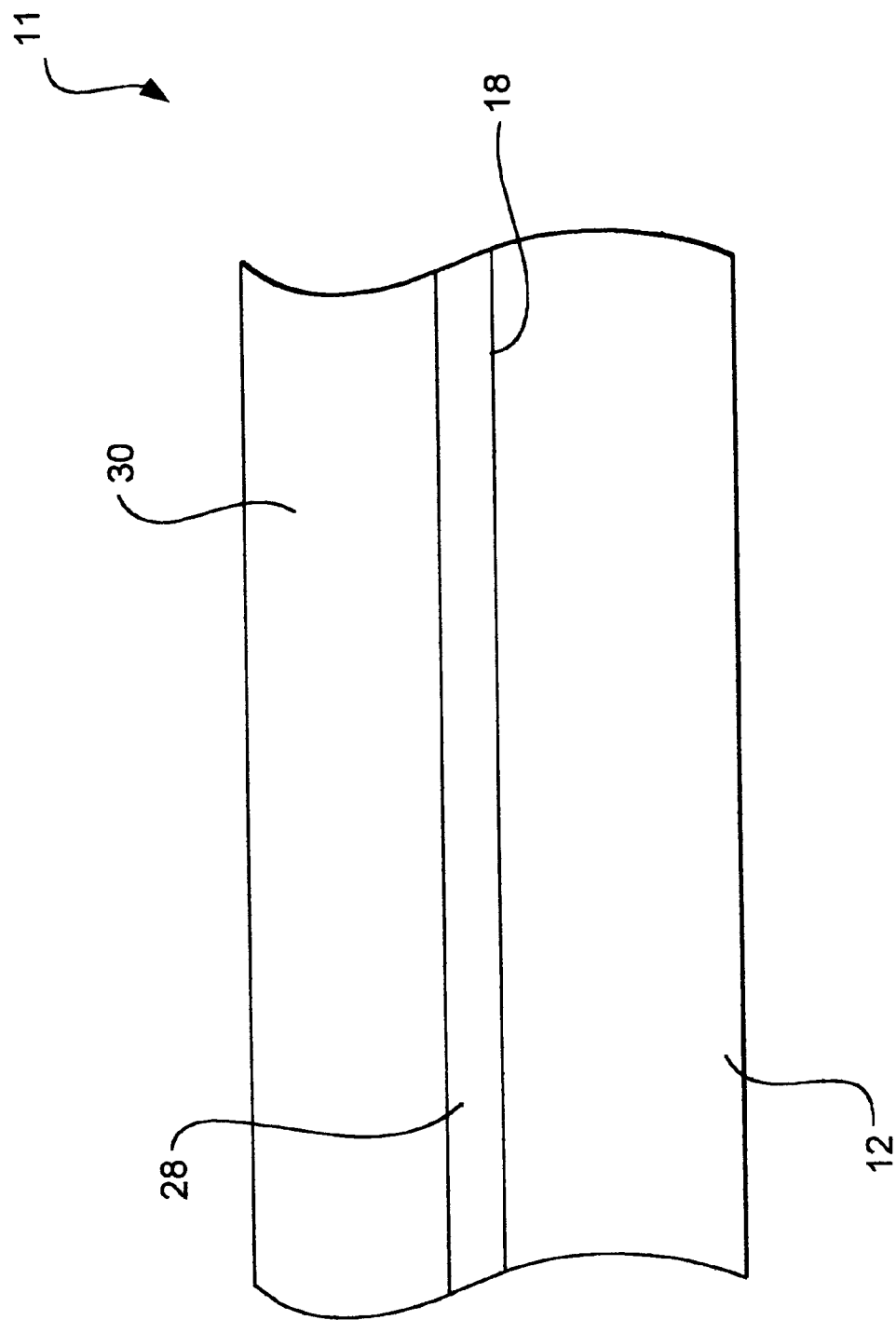

As shown in FIG. 1D, a silicon dioxide region 30 having a thickness of approximately 360 nm is then grown in the monocrystalline silicon region 22S by turning on dry $O_2$ just before turning off the nitrogen at the end of the anneal at 900° C. The temperature is ramped to 1000° C. at which time the temperature is stabilized and the oxidation is carried out in steam at 1000° C. Prior to ramp-down, dry $O_2$ is turned on and left on during ramp-down. The silicon dioxide region 30 is sufficiently thick to consume all the remaining twins 14 and band gap states 16 in the surface region 22S (FIG. 1C) of the silicon film 22. The silicon dioxide region 30 is sufficiently thick to leave an approximately 110 nm thick region of substantially pure silicon 28 (i.e., substantially free of defects and bandgap states) immediately adjacent the sapphire substrate 12.

Figure 1E:
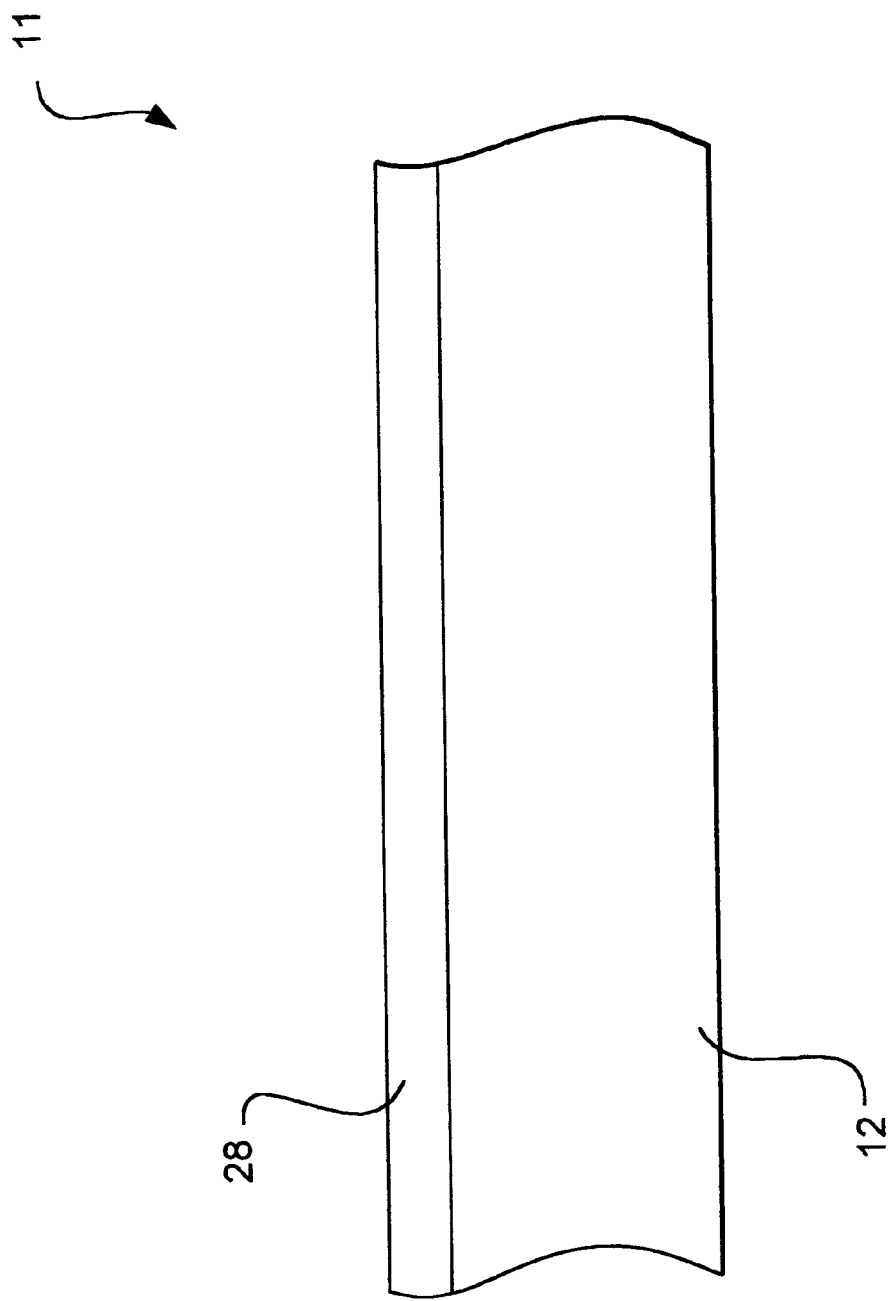

Referring now to FIG. 1E, the silicon dioxide film 30 is removed (etched) to result in an approximately 110 nm thick substantially pure silicon film 28 on the sapphire substrate 12. Thus, referring to FIG. 1C, the twins 14 and the states 16 in the upper portion of the silicon film are removed by forming the silicon dioxide film 30 and etching it away. Removal of the silicon dioxide film 30 may be delayed if it could serve a masking or other purpose. Additionally, the film 30 could be formed by an initial oxidation followed by stripping and a second oxidation, thereby resulting in an approximately 110 nm thick substantially pure silicon film 28 on the sapphire substrate 28 and a silicon dioxide film 30 of any desired thickness. The substantially pure silicon film 28 on the sapphire substrate 12 is now suited for MOSFET fabrication.

The above process of the present invention advantageously produces the substantially pure ultrathin silicon film 28 and reduces processing costs and complexity by using only one implant cycle and a two phase anneal cycle.

Design and fabrication of fully depleted MOSFET's are described with reference to FIGS. 2 and 3. In all of the below described embodiments, all of the MOSFET processing steps are preferably limited to temperatures less than approximately 950° C. in order to maintain the purity of the silicon in channel regions. Additionally, all anneals performed in non-oxidizing conditions are performed at temperatures less than approximately 950° C.

In one MOSFET embodiment, formation of isolated N-type and P-type regions in the silicon layer 28 is accomplished using a process often referred to as "local oxidation of silicon" (LOCOS). Unless otherwise stated, it will be understood throughout that there may be other standard semiconductor processing steps which will achieve the same or functionally similar results as described below. Substitution of these alternatives are considered to be within the scope of the present invention as long as they do not result in a processing step performed in non-oxidizing conditions which subjects the silicon layer 28 or any subsequent regions fabricated in the silicon layer 28 to temperatures in excess of approximately 950° C. For example, instead of using the LOCOS process to form the isolated N-type and P-type regions, alternative isolation techniques may also be employed. One such alternative process etches the silicon layer 28 (FIG. 1E) into individual islands (sometimes called "mesas"), to form the isolated N-type and P-type regions. Additional alternative processing procedures are disclosed in a book entitled "VLSI Technology", Second Edition, edited by S. M. Sze, published by McGraw-Hill, New York, 1988, hereby incorporated herein by reference.

The following process step descriptions are intended to supplement standard bulk CMOS processing steps. It is understood by those skilled in the art that each silicon fabrication facility has its own preferred process recipes that have been well tried and tested in its own bulk CMOS process. Therefore, it is not necessary to explain each process recipe utilized in processing devices in ultrathin silicon on sapphire of the present invention in order to enable one skilled in the art of bulk silicon CMOS processing to practice the present invention. For example, in well understood steps such as gate oxide growth, it is not necessary to explain each cleaning or "clean-up oxide" step, but rather it is helpful to explain the final oxide target thickness. This type of information is provided for a 0.8 μm ultrathin silicon on sapphire process typical of the present invention.

Figure 2A:
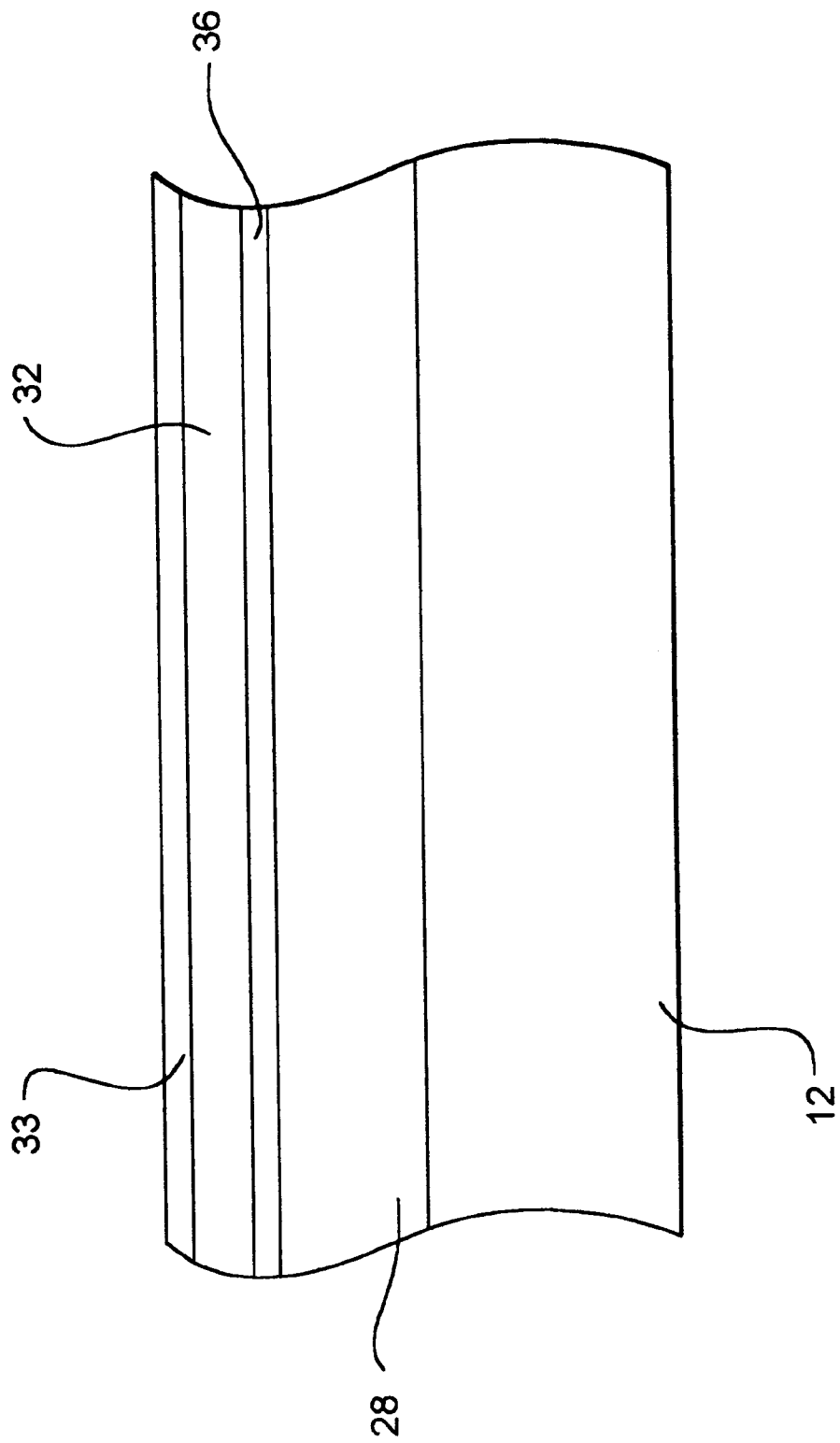
FIGS. 2A–2E illustrate a MOSFET and fabrication process steps used to manufacture the MOSFET in substantially pure silicon on sapphire material. Cross sectional views are shown for both N- and P-type transistors. These figures show the device and process through the first level of metallization.
Figure 2B:
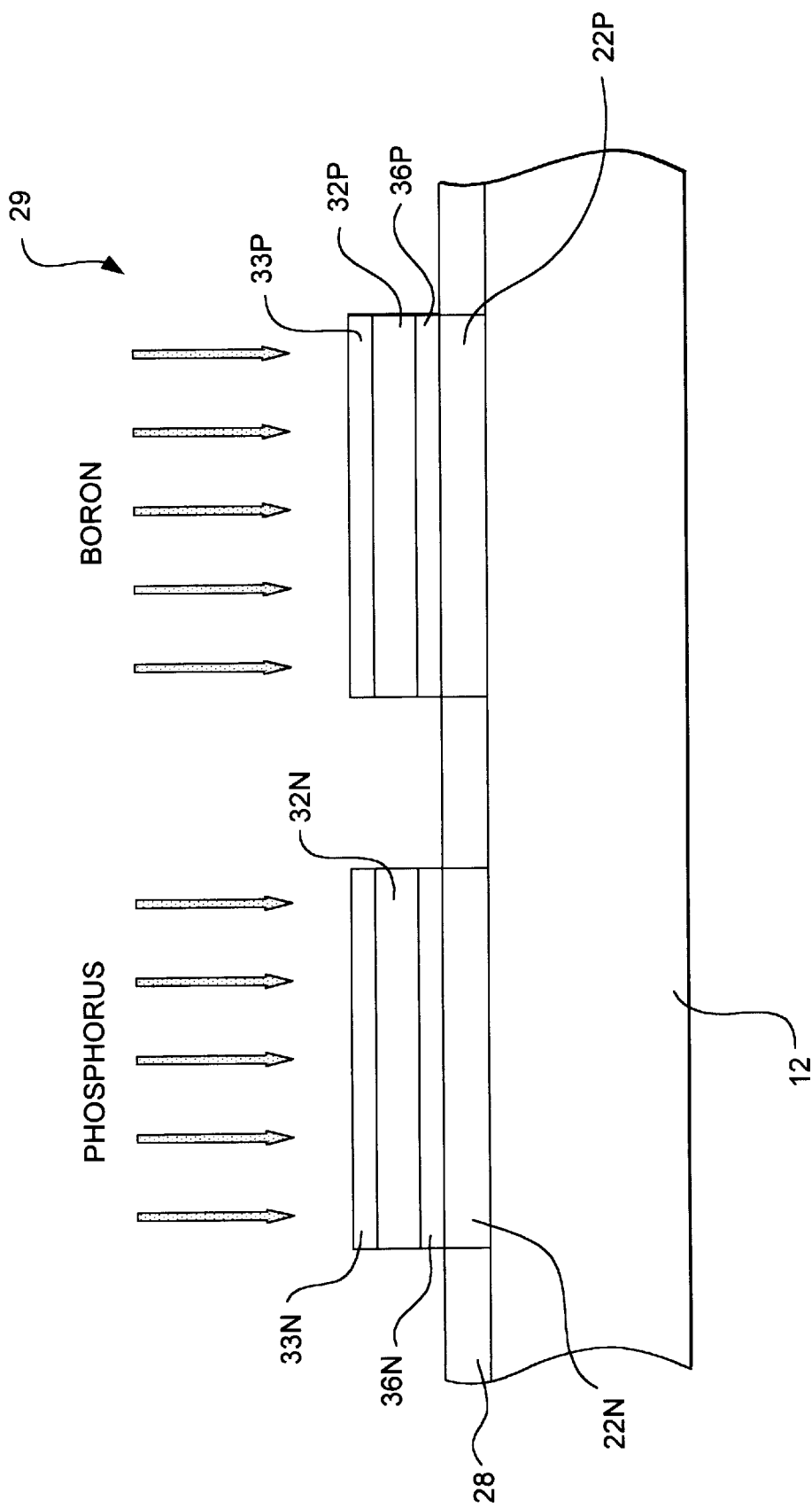
Figure 2C:
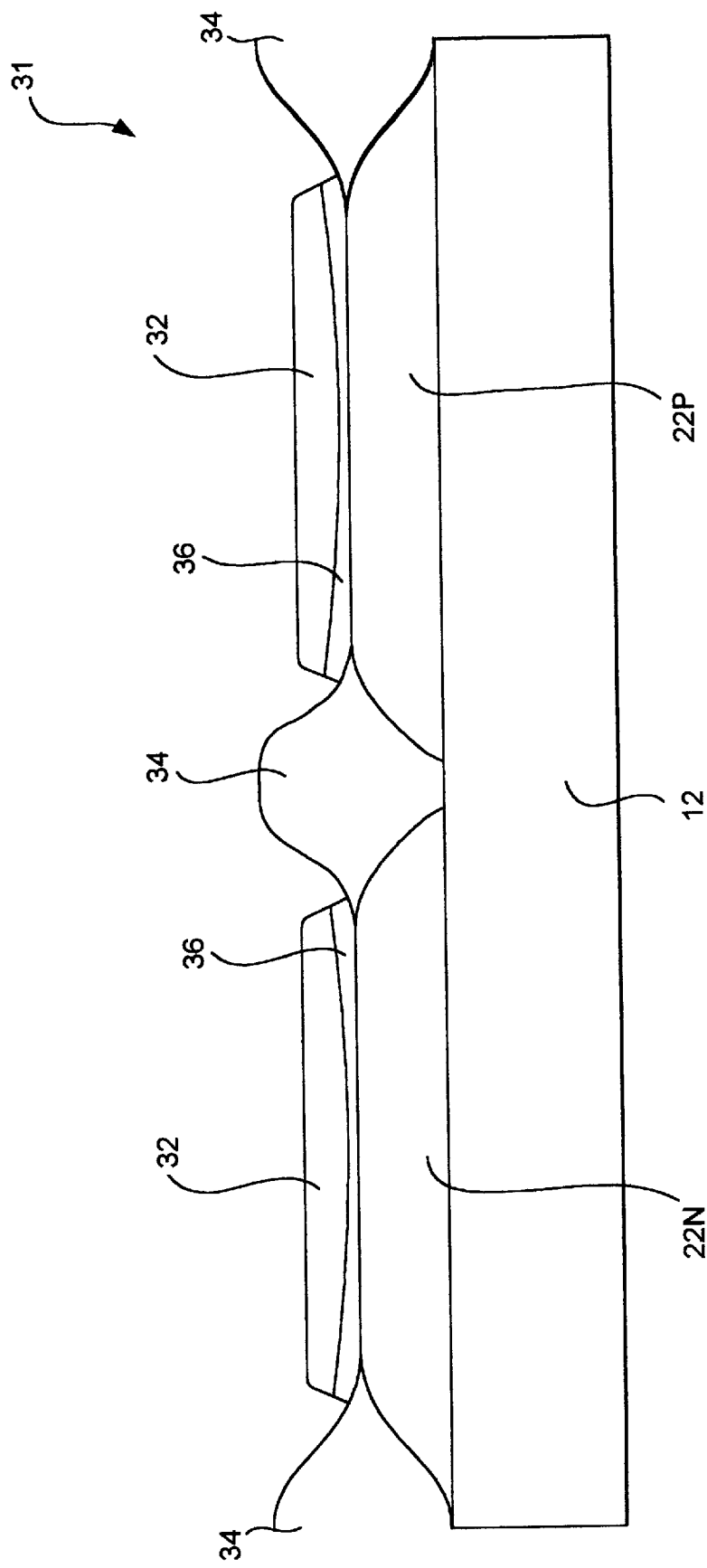

As shown in FIG. 2A, formation of isolated N-type and P-type regions with the LOCOS process begins with the deposition of a silicon dioxide layer 36, a silicon nitride layer 32 and a photo-resist layer 33 on top of the silicon layer 28 of the silicon-on-sapphire wafer 11 shown in FIG. 1E. Using standard masking and etching processes, individual islands (36p,32p,33p) and (36n,32n,33n) of the silicon dioxide layer 36, silicon nitride layer 32 and photo-resist layer 33 are formed on the surface of the Silicon layer 28 as shown in FIG. 2B. Standard masking and ion implantation techniques are used to form a silicon N-type region 22N and a silicon P-type region 22P. For example, as shown in FIG. 2B, the silicon N-type region 22N is formed by ion implantation of the Silicon layer 28 underlying the island (36n, 32n,33n) with phosphorus and the silicon P-type region 22P is formed by ion implantation of the Silicon layer 28 underlying the island (36p,32p,33p) with boron. As shown in FIG. 2C, the silicon N-type region 22N is isolated from the silicon P-type region 22P by the growth of a silicon dioxide region 34. The silicon dioxide regions 34 are grown by introducing the wafer 29 shown in FIG. 2B into a high temperature (less than approximately 950° C.) oxidizing ambient environment. The silicon dioxide isolation regions 34 extend down to the sapphire substrate 12. Although the wafer 29 is in an oxidizing ambient, the silicon nitride layer 32 shields the silicon regions 22N and 22P, thereby keeping those regions from oxidizing. After growing the isolation regions 34, the silicon nitride layer 32 and the stress relief oxide layer 36 are stripped away.

FIG. 2C shows regions 22N and 22P fully isolated from each other by the silicon dioxide isolation regions 34 for complementary MOS transistors. Alternative isolation techniques may also be employed. For example, the silicon layer 28 (FIG. 1E) may be etched into individual islands (sometimes called "mesas"). Thus, upon removal of the silicon dioxide regions 34 by etching, the silicon islands 22N and 22P become individual isolated islands or mesas.

Figure 2D:
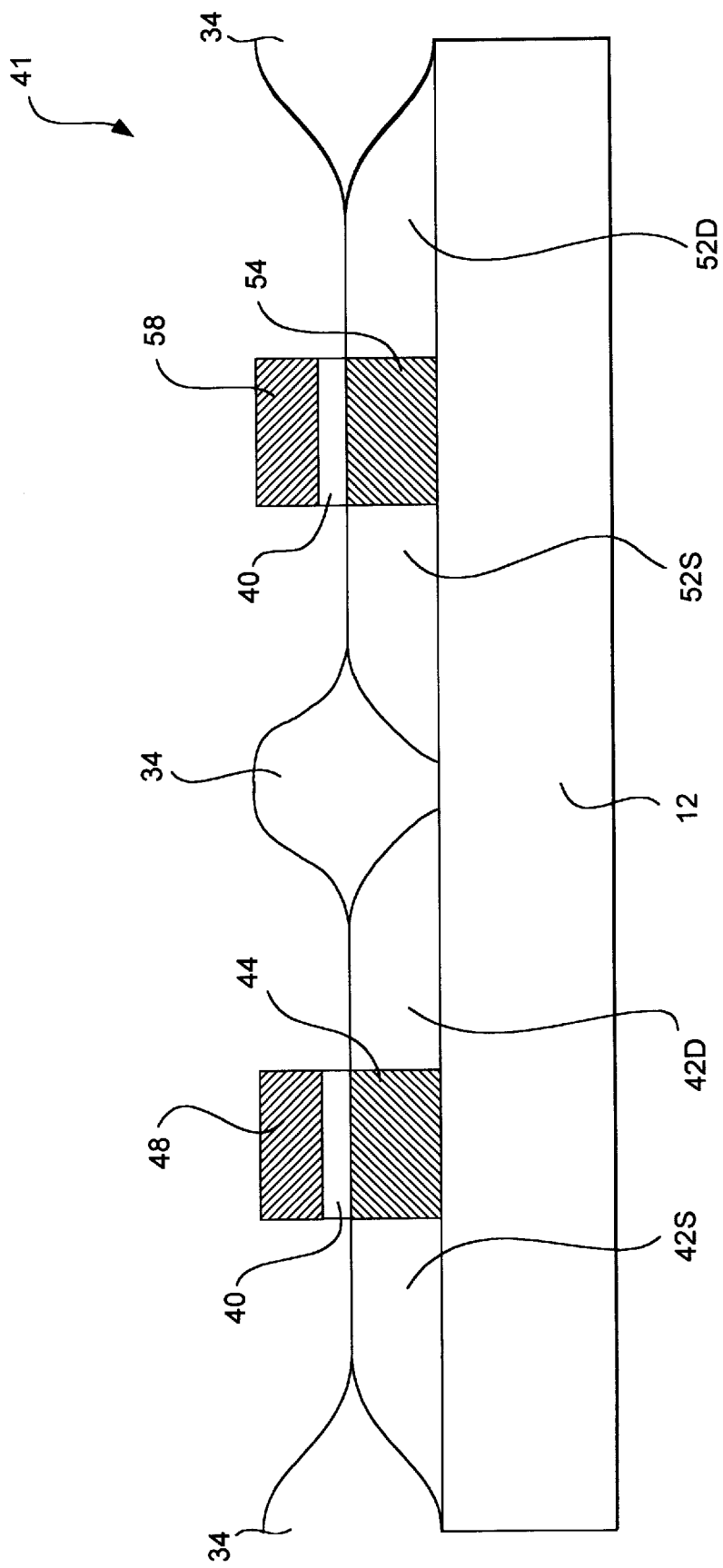

A subsequent stage 41 of the MOSFET process is shown in FIG. 2D. In stage 41, the N-type and P-type regions 22N and 22P (FIG. 2C) are further processed to form self aligned sources 42S and 52S, conduction regions 44 and 54, and self aligned drains 42D and 52D, respectively. Additionally, gate insulators 40 and gate conductive layers 48 and 58 form a control gate structure. The control gate structure is formed by thermal oxidation of the gate insulators 40 followed by deposition and patterning of a chosen gate conductive layer 48 for the P-channel and 58 for the N-channel. For electrostatic reasons, it is preferred that the gate length, i.e., the distance separating the source 52S from the drain 52D, be maintained at more than about 5–10 times the thickness of the conduction region. For example, a 500 nm gate length should be made in a silicon film thinner than about 100 nm, and preferably closer to 50 nm.

Referring to FIG. 2D, self aligned sources and drains 42S, 42D, 52S and 52D are formed by ion implantation or diffusion. Doping the source and drain regions of thin silicon films is subject to certain limitations. For example, ion implantation doping can amorphize the entire thickness of the source/drain region. An amorphized film will not properly recrystallize from the sapphire substrate and high resistivity may result. Therefore, it is preferable that the source and drain regions be formed by diffusion doping since the sapphire substrate forms a diffusion barrier to the dopant atoms. Diffusion doping of the source/drain regions represents an improvement over conventional MOSFET designs using implantation doping in that very thin (i.e., shallow) source/drain regions 42S, 42D, 52S and 52D having low resistivities can be fabricated by means of a single diffusion step.

Since the sapphire substrate 12 is an effective diffusion barrier and since the depth of the source and drain regions 42S, 42D, 52S and 52D are determined by the thickness of the silicon film, forming shallow source and drain regions is controlled by the structure, not by diffusion time and temperature, as in conventional transistor processing. Therefore diffusion doping can be used for scaled down dimensions. Diffusion doping has several advantages over ion implantation including: the host silicon is not damaged or transformed into amorphous regions; the process is inherently scalable to the thinnest silicon films; and higher doping concentrations can be achieved.

Threshold voltage of the control gate structure is initially determined by correctly choosing the gate conductor material according to its so-called metal work function. If necessary, further adjustments to the threshold voltage are made by introducing appropriate dopant atoms into the conduction channel, for example by ion implantation into the conduction regions 44 and 54. In accordance with the present invention, no dopant atoms other than those introduced for threshold adjustment (or to ensure surface channel conduction, see below) are present in the conduction channel regions 44 and 54. The absence or low concentrations of dopants in the MOSFFT embodiments of the present invention represent an improvement over traditional MOSFET designs wherein substantial concentrations of dopant atoms are typically present for various reasons (e.g., as integral parts of traditional transistors; to provide isolation; as a byproduct of counterdoping; etc.). By fabricating MOSFETs in substantially pure silicon on sapphire in accordance with the present invention, only minimal concentrations of dopant atoms (if any) are present, thereby eliminating parasitic charge and its associated degradations discussed above.

Gate conductor layers 48 and 58 are often multilayer structures. In this case, the threshold voltage is determined by the characteristics of the primary gate conductor layer, i.e., the layer which is immediately adjacent the gate insulator 40. Conductive layers above the primary gate conductor layer are included for various reasons, especially to reduce series resistance (See FIG. 3 and discussion below for an example). However, such secondary gate conductive layers do not affect the threshold voltage of transistors. Each of the gate materials cited below has various applications when the material is in contact with the gate insulator 40.

$P^+$ and $N^+$ polysilicon gate materials, used in various combinations in N-type MOSFETS and P-type MOSFETS, are useful in designing and fabricating digital and analog circuits, voltage reference circuits and memory type circuits. $P^+$ polygermanium is a good choice for high performance digital logic where symmetric threshold voltages for N- and P-type MOSFETs are desired. Any conductive material which has a metal work function at the center of silicon's band gap (i.e., equal to silicon's electron affinity plus half the band gap or more specifically a metal work function of 4.5–4.7 eV) results in symmetric threshold voltages for N- and P-channel MOSFETs. Examples of such materials are tungsten, chrome, indium tin oxide, and titanium nitride, among others. The material may be different or the same for each transistor type (regions 48 and 58) depending on the desired threshold voltage. Examples of choice of material and resultant threshold voltages are approximately as follows:

N$^+$ polysilicon gate conductor results in V$_{tn}$=0 V and V$_{tp}$=–1 V;

P$^+$ polysilicon gate conductor results in V$_{tn}$=+1 V and V$_{tp}$ =0 V;

P$^+$ polygermanium, tungsten, indium tin oxide or titanium nitride gate conductors result in V$_{tn}$=+½ V and V$_{tp}$=–½ V;

where V$_{tn}$ and V$_{tp}$ are the threshold voltages of N- and P-channel MOSFETs, respectively.

As can be seen from the above discussion and referring to FIG. 2D, if a threshold voltages of +1 Volt for the N-channel and –1 Volt for the P-channel were desired, region 48 could be P$^+$ polysilicon and region 58 could be N$^+$ polysilicon (i.e., different materials). If threshold voltages of +½ Volt for the N-channel and –½ Volt for the P-channel were desired, regions 48 and 58 could be P$^+$ polygermanium, tungsten, indium tin oxide or titanium nitride (i.e., the same material). Numerous other material choices, and therefore other choices of threshold voltages, are also available.

The gate dielectric material 40 is grown and the gate conducting materials 48 and 58 are deposited using process conditions which avoid introduction of states or fixed charges into the channel regions 44 and 54. Specifically, processing temperatures and ambients are chosen to avoid generation of interface states or fixed charge in the dielectric. Therefore, as previously discussed, processing temperatures should be kept below approximately 950° C. Also, for P$^+$ doped conductors as gate material 48 or 58, processing temperatures, times and ambients should be chosen to avoid diffusion of the dopant atoms from the gate conductors 48 and 58 through the gate dielectric insulator 40 into the silicon films 44 and 54. Diffusion barriers such as silicon nitride as part of the gate dielectric insulator 40 can be used to prevent such dopant migration.

Use of metal work function exclusively (i.e., no dopant atoms introduced into the conduction region) to set threshold voltage has the desirable effect of accurate and predictable threshold voltage control which is independent of process variations or certain device parameters.

Surface channel transistor behavior occurs when conduction occurs in the silicon channels 44 and 54 at the interface between the gate insulator 40 and the silicon films 44 and 54. In some designs, it may be desirable to intentionally induce surface channel conduction. This may be accomplished by implanting very small amounts of dopant atoms into the substantially pure silicon channel regions 44 and 54. This will result in surface channel conduction without significantly affecting the threshold voltage. Such a device is defined herein as an "intrinsic surface channel MOSFET." Additional dopant atoms, such as boron, phosphorous or arsenic, may be introduced into the channel regions 44 and 54 to further adjust the threshold voltage of the intrinsic surface channel MOSFET. Addition of dopant atoms in excess of that necessary to adjust the threshold voltage may introduce some of the adverse effects cited earlier, such as impurity scattering and possible threshold voltage variation. However, a device constructed in accordance with this invention contains only the dopant atoms necessary to induce surface channel conduction and to set threshold voltage. Therefore, none of the other parasitic charge found in traditional MOSFETs are present. The present invention thereby minimizes the dopant charge in regions 44 and 54 and associated adverse effects associated with higher concentrations of dopant charge.

A maximum amount of dopant charge can be introduced into channel regions 44 and 54. If the maximum amount is exceeded, the depletion region will not reach the sapphire 12, thus eliminating fully depleted operation. The maximum dopant charge is dependent on the silicon film thickness in the channel regions 44 and 54. For the preferred embodiment, the regions 44 and 54 are approximately 100 nm thick and the maximum dopant density is approximately $1 \times 10^{12}$ cm$^{-2}$.

Figure 2E:
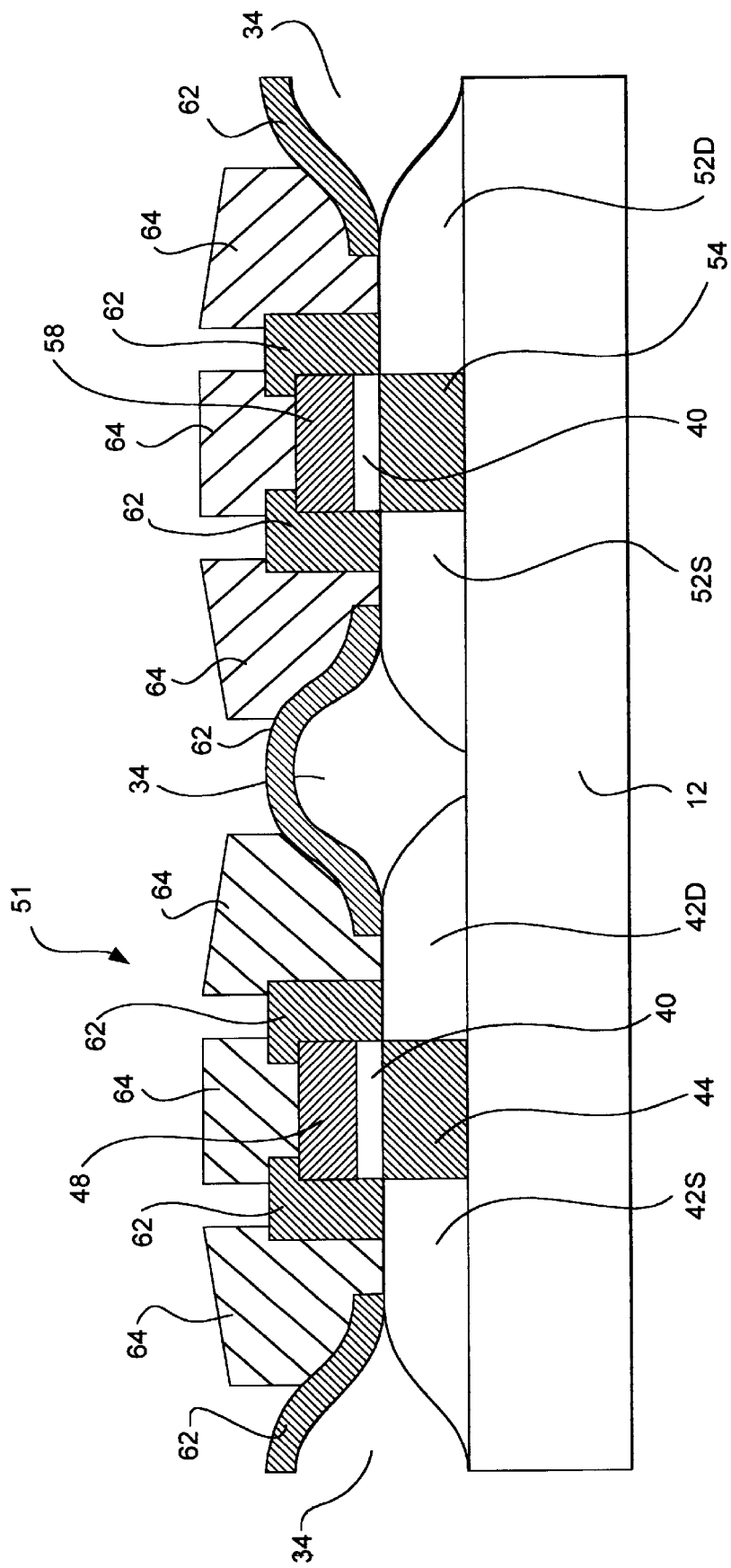

A next stage 51 of the MOSFET fabrication process is shown in FIG. 2E. In this stage, insulating layer 62 and metal layer 64 are deposited and patterned for interconnecting devices as desired. Specifically, an interlevel insulating layer 62 is deposited and patterned, followed by deposition and patterning of a metallic conductor interconnecting layer 64. Additional layers of insulators and metallic conductors may be added as needed (not shown). Another advantage of the present invention is apparent at this point, there are no opportunities for metal to diffuse into the source and drain regions as in many conventional MOSFET fabrication processes. In the present invention, after deposition and patterning of the metallic interconnect layer 64, an annealing step is performed. This annealing step serves two primary functions: to remove states and charge which may have been introduced during the previous processing steps and to sinter different metallic layers to form low resistance contacts. In conventional processing, source and drain junctions are deep enough to ensure that no metal will diffuse through them and into an underlying silicon substrate, thereby destroying transistors. In the current invention, such a failure mechanism does not exist since only sapphire 12 is found beneath the source and drain regions 42S, 42D, 52S and 52D.

Figure 3A:
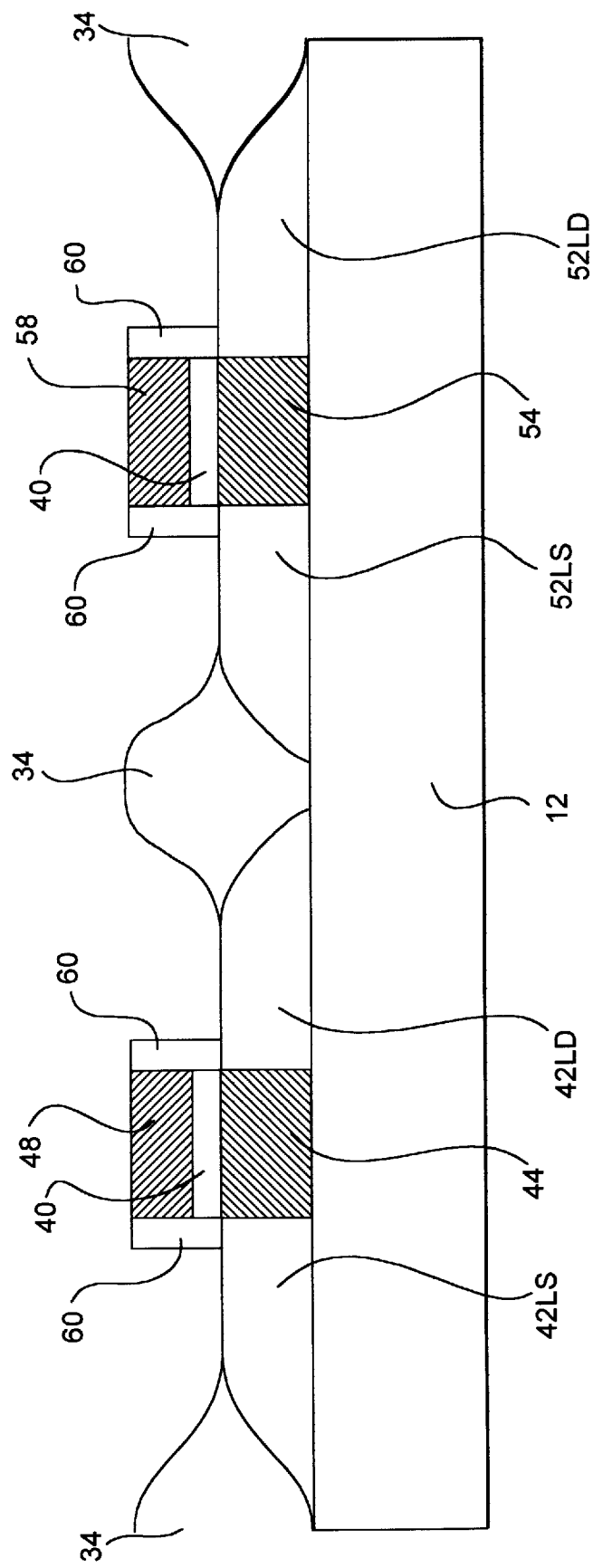
FIGS. 3A–3C illustrate an embodiment of the invention comprising adding to the device and process depicted in FIGS. 2, gate sidewall spacers, lightly doped drains (LDD), and self aligned silicide (salicide). Cross sectional views are shown for both N- and P-type transistors. These figures show the device and process through the first level of metallization.
Figure 3B:
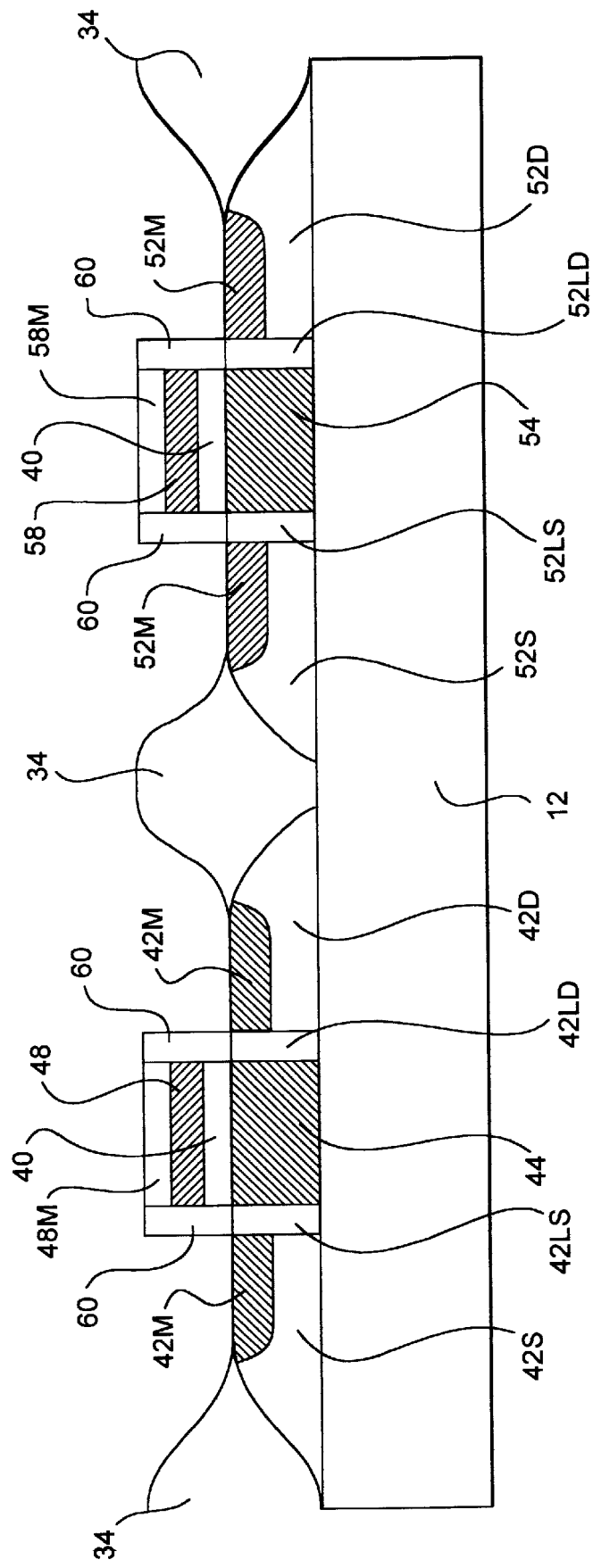
Figure 3C:
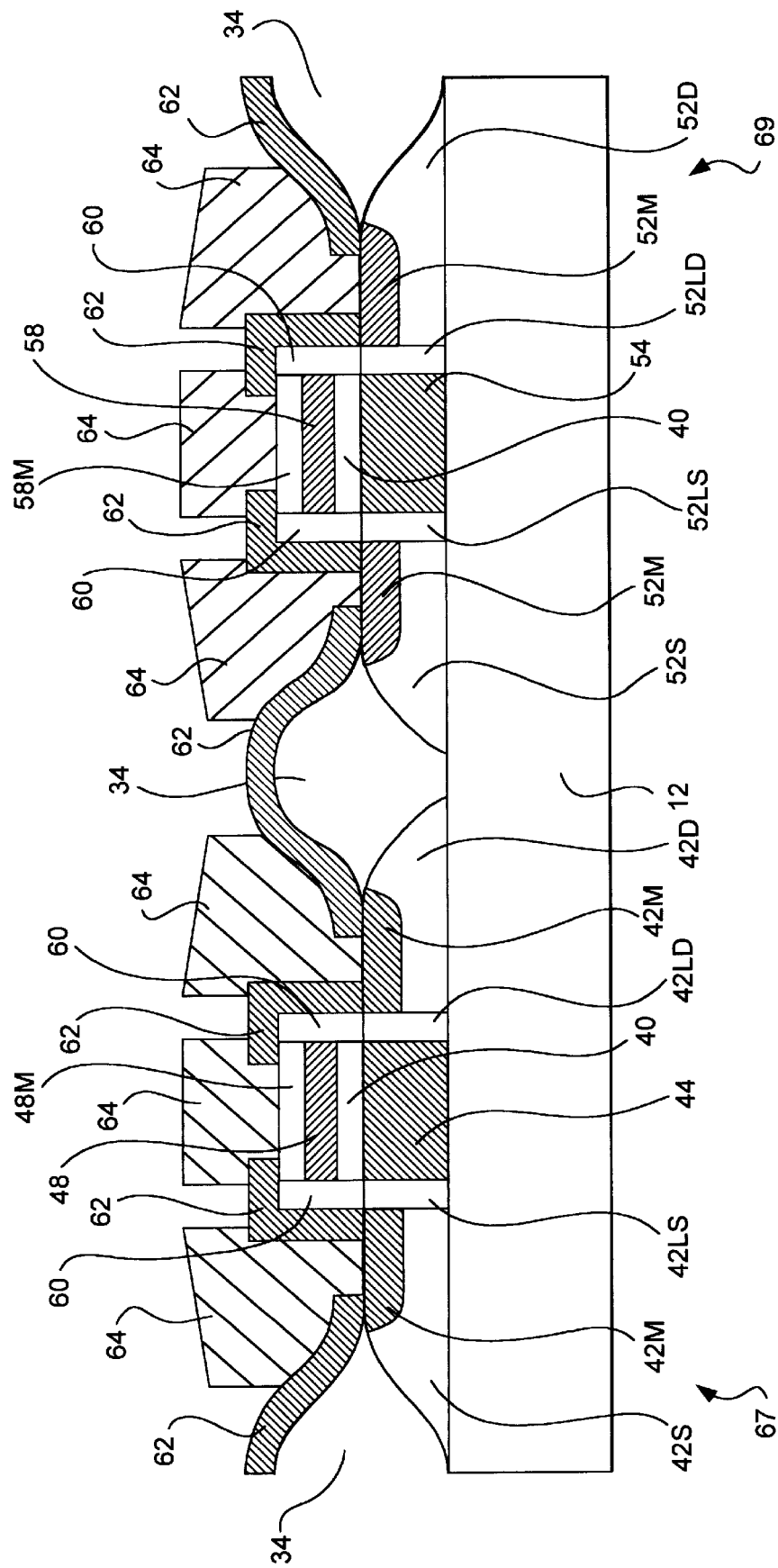

The current invention may also be embodied in a lightly doped drain (LDD) structure or self aligned silicide (salicide). This embodiment is illustrated in FIGS. 3A, 3B and 3C. This embodiment may be implemented after the gate conductors 48 and 58 are patterned as discussed above and shown in FIG. 2D. Referring to FIG. 3A, after patterning the gate conductors 48 and 58, self aligned lightly doped drain (LDD) regions 42LD and 52LD are formed by ion implantation or diffusion. The LDD reduces electric fields, thereby improving reliability and certain device characteristics such as drain breakdown voltage. However, the LDD also increases series resistance at both the drain and source, thereby decreasing output current. A trade-off is therefore inherent in the choice of an LDD and different requirements will lead to different LDD designs. The advantages cited above for diffusion doping of the self aligned sources and drains 42S, 42D, 52S and 52D also apply to doping the LDD structures.

In the self aligned silicide (salicide) embodiment of the present invention, a sidewall spacer 60 is deposited and etched adjacent to the gate structure comprising the gate insulator 40 and conductor 48, 58. Referring to FIG. 3B, final self aligned sources and drains 42S, 42D, 52S and 52D are formed by ion implantation or diffusion. For appropriate gate conductors 48 and 58 (such as polysilicon or polygermanium) the structure is coated with a metallic material and reacted to form metallic compounds 48M and 58M in the upper portion of gate conductors 48 and 58 as well 42M and 52M in source and drain regions 42S, 42D, 52S and 52D. Stripping unreacted metal from sidewall spacers 60 completes the salicide (or germanide) processing.

Referring to FIG. 3B, silicide regions 42M, 52M, 48M, and 58M are separated from each other by the sidewall spacers 60. The thickness of metallic regions 42M, 48M, 52M and 58M is controlled by the amount of metallic material which is deposited. Obviously, the salicide option exists independently of LDD doping level. Referring to FIG. 3C, a complementary MOS structure is shown with both LDD and salicide options included after metallization as described above for FIG. 2. Many other materials and processing options can be used in addition to or in replacement of those described above. It is to be understood that such choices may be practiced within the scope of this invention.

Additional information (including circuit designs, design rules, processes, etc.) which may be adapted for making similar or analogous devices or circuits in the ultrathin silicon on sapphire material of the present invention is disclosed in a book authored by Arthur B. Glaser and Gerald E. Subak-Sharpe entitled "Integrated Circuit Engineering—Design, Fabrication, and Applications", Addison-Wesley Publishing Company, Inc., 1979, ISBN 0-201-07427-3, this entire publication is hereby incorporated herein by reference.

RADIO FREQUENCY ELEMENTS

Figure 4A:
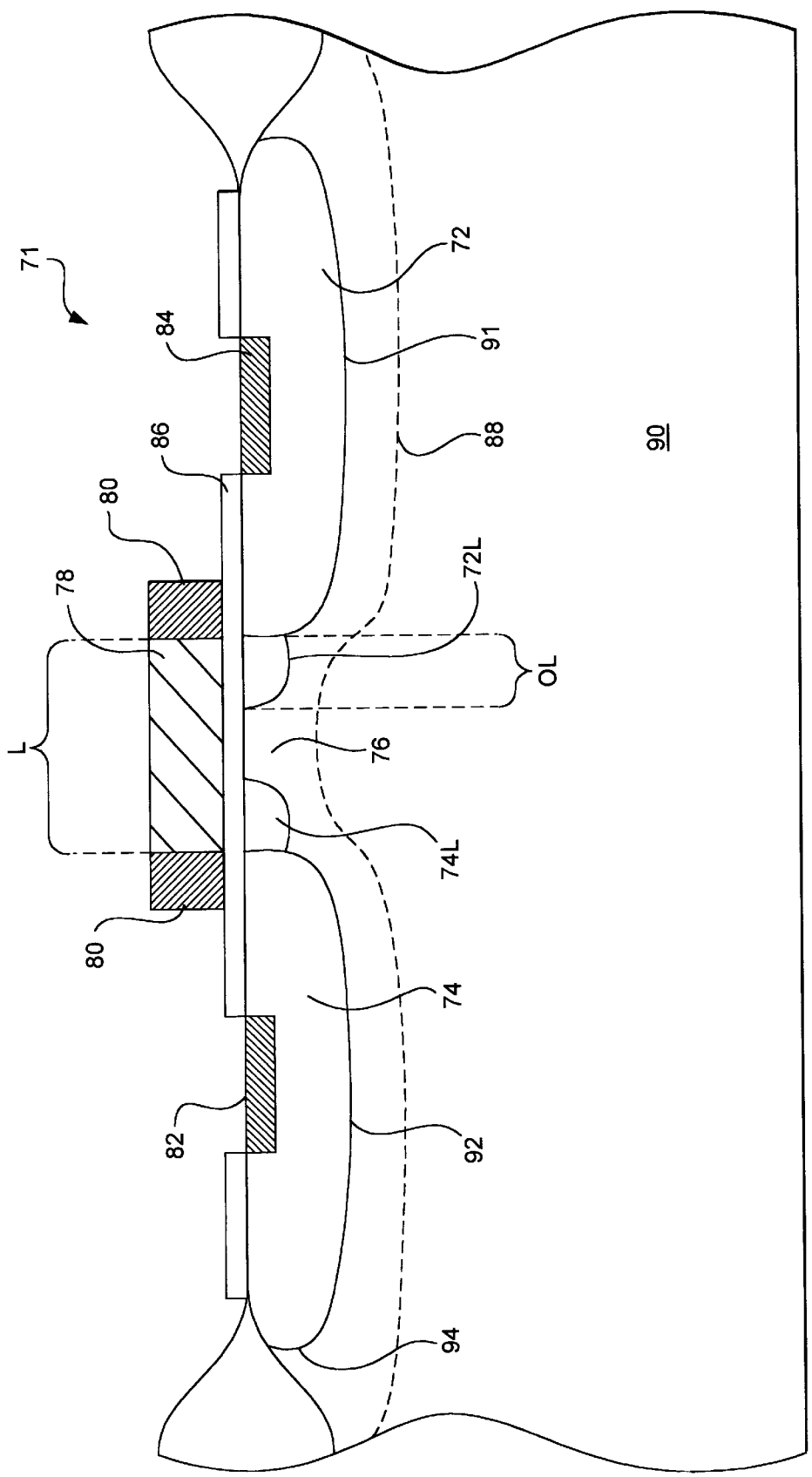
FIG. 4A shows a cross sectional view of a typical MOS device fabricated in bulk Silicon.
Figure 4B:
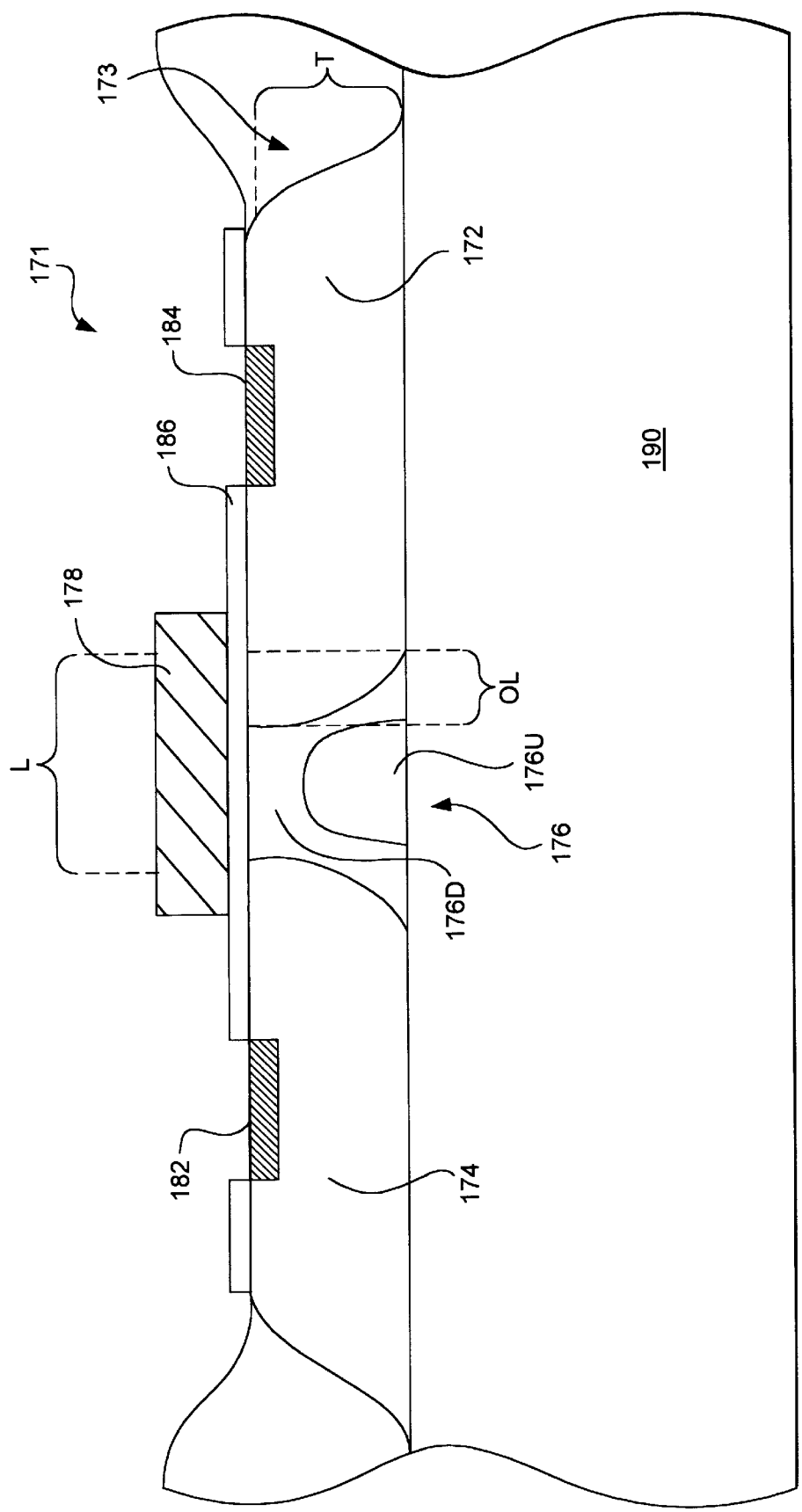
FIG. 4B shows a cross sectional view of a typical MOS device fabricated in conventional Silicon on Sapphire, i.e., a 4,000 to 6,000 Å thick layer of Silicon on a sapphire substrate.
Figure 4C:
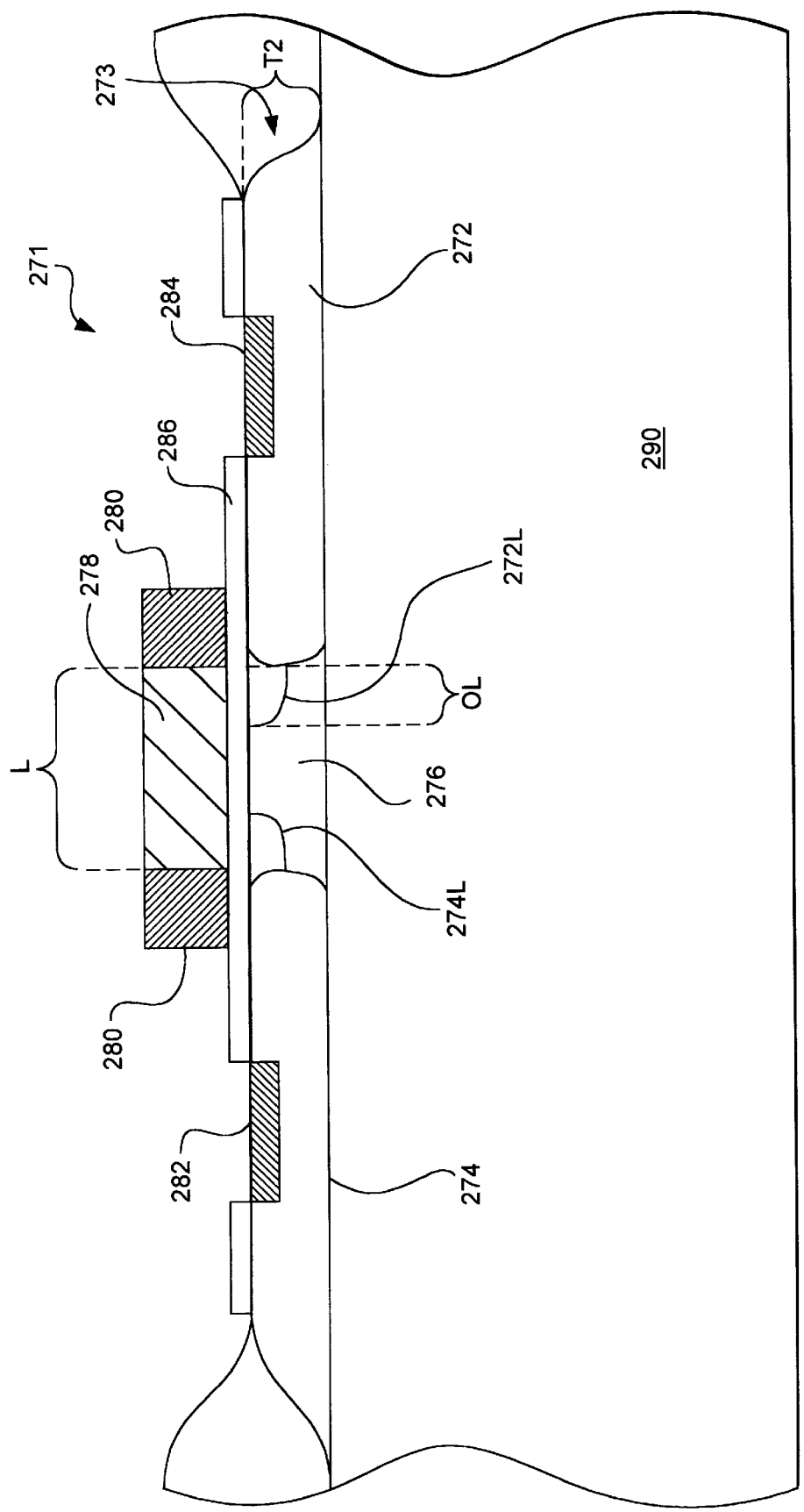
FIG. 4C shows a cross sectional view of a typical MOS device fabricated in ultrathin Silicon on Sapphire of the present invention, i.e., an approximately 1,000 Å thick layer of substantially defect free Silicon on a sapphire substrate.

FIGS. 4A, 4B and 4C show a typical MOS device fabricated in bulk Silicon, conventional Silicon on Sapphire, and ultrathin Silicon on Sapphire of the present invention, respectively. These Figures illustrate how the MOS device fabricated in the ultrathin Silicon on Sapphire of the present invention achieves radio frequency performance characteristics which are far superior to similar devices fabricated in bulk silicon and conventional Silicon on Sapphire.

FIG. 4A shows a cross sectional view of a typical MOS transistor 71 fabricated in a bulk Silicon substrate 90. Transistor 71 includes a drain diffusion region 72, a source diffusion region 74, a conduction channel 76 and a gate 78 having sidewall spacers 80. A lightly doped drain diffusion 72L and a lightly doped source diffusion 74L are positioned adjacent the drain diffusion region 72 and the source diffusion region 74, respectively. A source contact 82 and a drain contact 84 are provided for making connections to the device 71. An oxide layer 86 isolates the gate 78 from the channel 76. A depletion region is indicated generally by dashed line 88 within the bulk silicon substrate 90. Typical of present bulk silicon MOS devices, the minimum length L of gate 78 is less than approximately 0.5 $\mu$m.

The dominant internal capacitances for this type of bulk silicon MOS device are due to: 1) overlap capacitances created by the overlap OL of the gate 78 and the lightly doped drain diffusion 72L and the lightly doped source diffusion 74L (typically, the overlap OL is approximately 0.1 $\mu$m); 2) capacitances between a bottom wall 92 of the source diffusion region 74 and the bulk silicon substrate 90 (similar capacitance is present between the bottom wall of the drain diffusion region 91 (See FIG. 4A) and the bulk substrate 90); and 3) side wall junction capacitances between a side wall 94 of the source diffusion region 74 and the bulk silicon substrate 90 (similar capacitance is present between the side wall of the drain diffusion region and the bulk substrate 90). In order to improve the radio frequency performance of bulk silicon devices, much effort is expended in designing the devices in ways which will reduce these capacitances.

FIG. 4B shows a cross sectional view of a typical MOS transistor 171 fabricated in a conventional Silicon on Sapphire wafer, i.e., a 4,000 to 6,000 Å thick layer of Silicon 173 on a sapphire substrate 190. Transistor 171 includes a drain diffusion region 172, a source diffusion region 174, a conduction channel 176 and a gate 178. The conduction channel 176 includes a depleted region 176D and an undepleted region 176U. A source contact 182 and a drain contact 184 are provided for making connections to the device 171. An oxide layer 186 isolates the gate 178 from the channel 176. Typical of conventional Silicon on Sapphire MOS devices, the minimum length L of gate 178 is approximately 1.5 $\mu$m.

Since conventional or traditional SOS material is limited to minimum epitaxial silicon layer 173 thicknesses T of approximately 4,000 angstroms (Å), depletion region 176D only extends through part of the channel 176. Additionally, since the silicon layer 173 is 4,000 Å thick, the drain diffusion 172 yields a sideways diffusion OL of approximately 3,000 Å, i.e., approximately ⅓ of the gate length L of approximately 1.0–1.5 $\mu$m. The capacitances due to the side walls 94 and the bottom walls 92 in bulk silicon MOS transistor 71 shown in FIG. 4A and discussed above, are eliminated in conventional SOS, but the capacitance due to the 3,000 Å overlap of the source 174 and drain 172 diffusions with the gate 178 and the capacitance from the gate 178 to the undepleted region 176U still remain. The long channel length and high overlap capacitance of the typical conventional SOS device shown in FIG. 4B make it generally unsuitable for fabrication of MOSFETs having an $f_t$ in excess of the 10 GHz required for RF power amplifier operation above 700 MHz.

FIG. 4C shows a cross sectional view of a typical MOS transistor 271 fabricated in the ultrathin Silicon on Sapphire of the present invention, i.e., an approximately 1,000 Å thick layer of substantially pure Silicon 273 on a sapphire substrate 290. Transistor 271 includes a drain diffusion region 272, a source diffusion region 274, a conduction channel 276 and a gate 278 having sidewall spacers 280. A lightly doped drain diffusion 272L and a lightly doped source diffusion 274L are positioned adjacent the drain diffusion region 272 and the source diffusion region 274, respectively. A source contact 282 and a drain contact 284 are provided for making connections to the device 271. An oxide layer 286 isolates the gate 278 from the channel 276. A representative gate length L for gate 278 in ultrathin Silicon on Sapphire of the present invention is approximately 0.5 $\mu$m.

The MOS device 271 in ultrathin silicon on sapphire of the present invention shown in FIG. 4C exhibits substantially smaller short channel effects than either the bulk silicon device 71 or the conventional SOS device 171 because of the substantially thinner silicon film 273 thickness T2 of approximately 0.1 $\mu$m (equivalent to 100 nanometers or 1,000 Å). Production of a device having a transconductance capable of gain-bandwidths of approximately 10 GHz is achieved by selecting gate length L to be approximately 0.8 $\mu$m. This significant reduction from the conventional SOS channel lengths of 1.5 $\mu$m is possible because of the reduction in the thickness T of the silicon film 273.

Transistor 271 of FIG. 4C has high transconductance properties since the gate length L is on the order of 0.8 $\mu$m or less. It also has low parasitic capacitance in comparison to the bulk Si transistor 71 and conventional SOS transistor 171 illustrated in FIGS. 4A and 4B. Because low temperature processing (described previously) is used to produce device 271 of the present invention, sideways diffusion of the lightly doped source 274L and the lightly doped drain 272L regions extend only about 0.03 $\mu$m under the gate 278. Note that in MOS transistor 71 of FIG. 4A the lightly doped source 74L and the lightly doped drain 72L regions extend about 0.1 $\mu$m under the gate 78, thus creating substantially greater overlap capacitance. Also, note that the drain diffusion 172 for the typical SOS device 171 of FIG. 4B has a sideways diffusion overlap OL of the source 174 and drain 172 under the gate 178 of approximately 0.3 µm. In comparison, the gate overlap capacitance of the MOS device in ultrathin silicon on sapphire of the present invention shown in FIG. 4C is reduced by at least a factor of 3.

Due to the above described improvements resulting in reduced overlap of the source and drain with the gate and reduced channel length, transistor 271 of the present invention achieves the gain-bandwidth product of 10 GHz required to construct a 700 MHz RF power amplifier. This is due to a transconductance approximately as high as the bulk Si MOS transistor 71 and the reduced device capacitances described above.

Figure 5A:
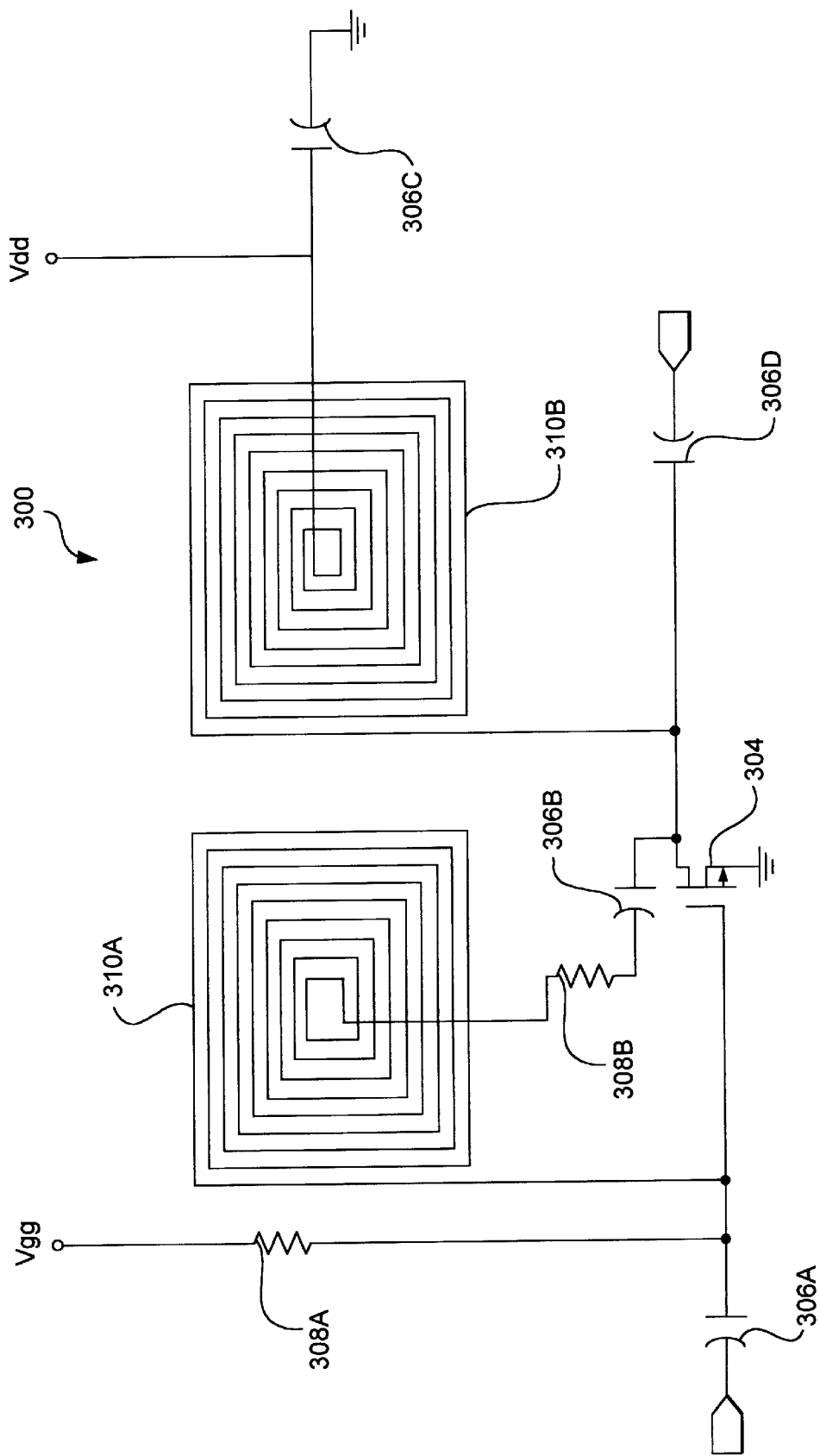
FIG. 5A shows an electrical schematic diagram of a typical high frequency radio amplifier stage.

FIG. 5A is an electrical schematic diagram of a typical high frequency radio amplifier stage 300. Amplifier stage 300 includes an N-channel active device 304 having a device width of 500 µm and a channel length of 0.8 µm, capacitors 306, resistors 308 and inductors 310.

The amplifier stage 300 could be fabricated in bulk silicon. However, such a device would have severe limitations on its high frequency performance. The capacitors and inductors are easily formed in bulk Si MOS fabrication technology using MOS technology that is well understood by those knowledgeable in the art. In MOS technology, the capacitor plates are formed using the two layers of metal commonly available in the MOS processes. They may also be formed under a polysilicon gate by using a process step known as a buried layer. Yet another alternative is to form a capacitor between the gate polysilicon and a second layer of polysilicon. The inductors may be formed by patterning either of the two metal layers. However, low substrate conductivity is essential for low-loss operation of the inductors at frequencies above 700 MHz. Unfortunately, the high conductivity of the bulk silicon substrate seriously degrades the inductor performance and consequently the high frequency performance of the amplifier stage 300 when fabricated in bulk silicon.

Figure 5B:
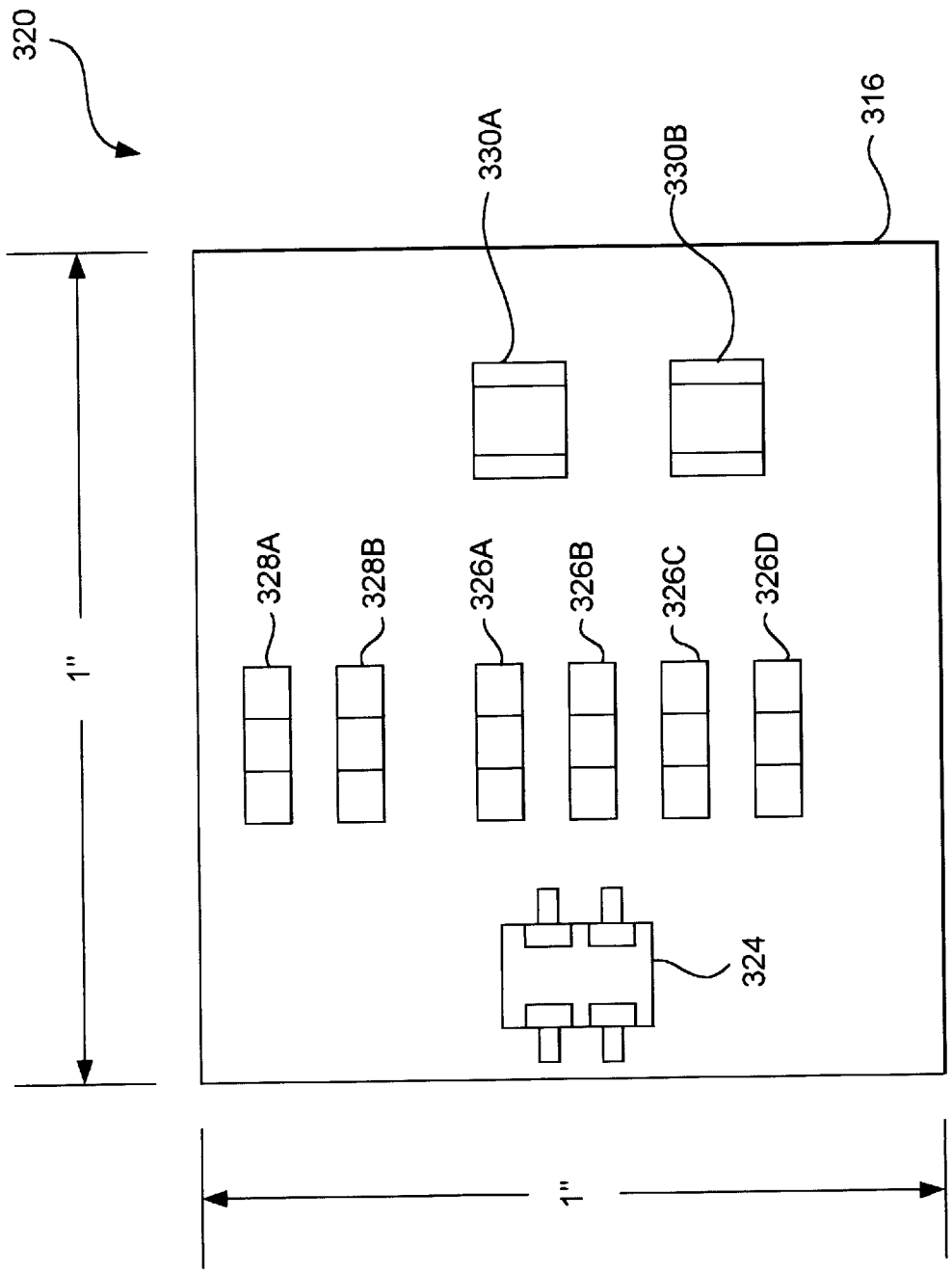
FIG. 5B shows the RF power amplifier stage in FIG. 5A fabricated on an insulating substrate using discrete components.

While GaAs has been found suitable for fabrication of certain high frequency active devices, it has been found to be unacceptable where it is desirable to integrate both active and passive components on a single chip. This is due to the high conductivity of the substrate which causes unacceptably high loss factors for inductors operating at frequencies above 700 MHz. Also, manufacturing options commonly available in silicon processing, such as gate oxide growth, are not available or as mature in GaAs. Thus, since bulk silicon and GaAs, have proven inadequate for single chip construction of high frequency applications of amplifier stage 300, such circuits are generally fabricated on an insulating substrate 316 using discrete components as shown in FIG. 5B. Insulating substrate 316 may be a printed circuit board or alumina substrate. Mounted on the substrate 316 are the individual components comprising the amplifier stage 300 including an N-channel active device 324, capacitors 326, resistors 328 and inductors 330. The dimensions of such a printed circuit board are typically about one inch square.

Figure 5C:
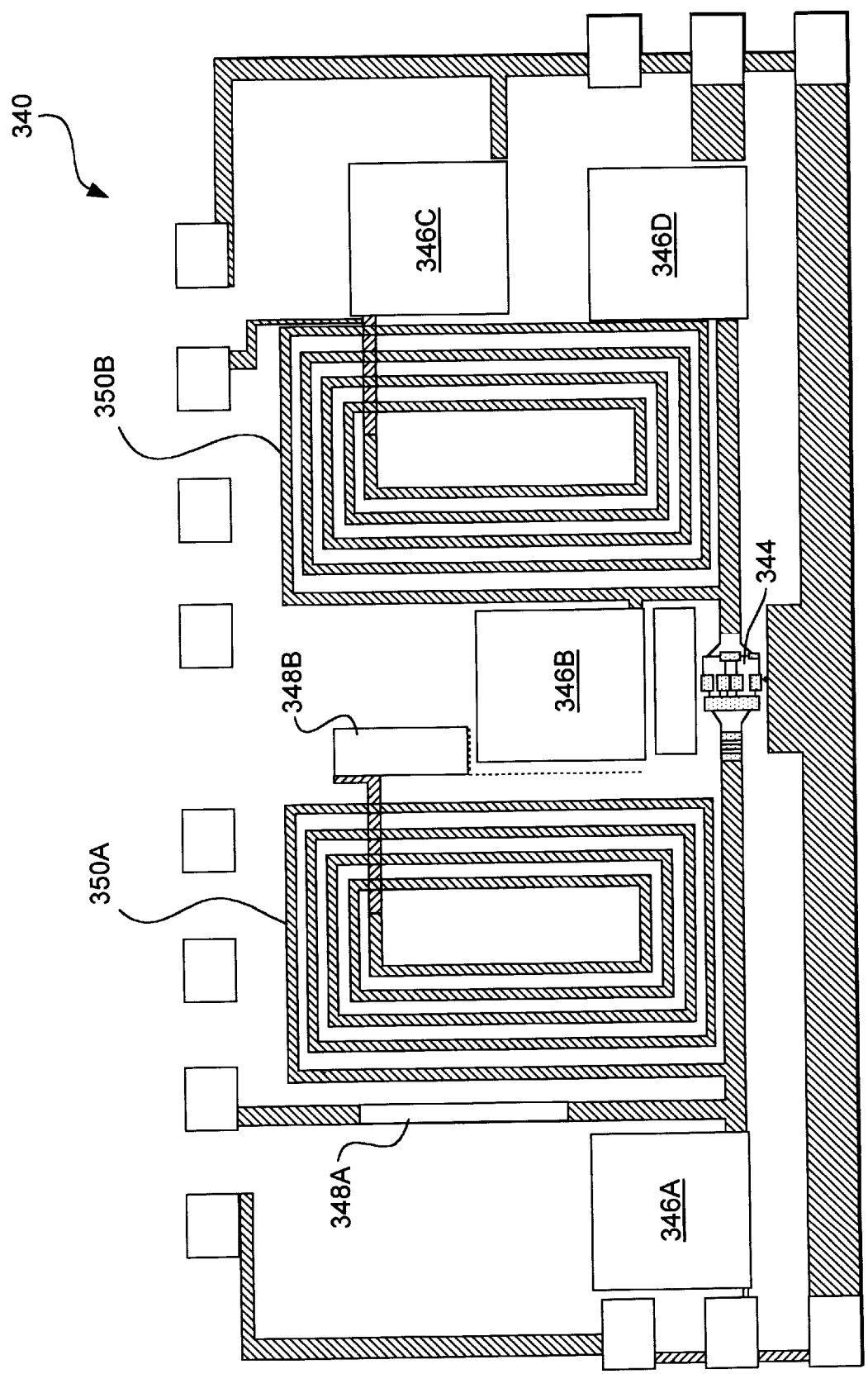
FIG. 5C shows the RF power amplifier stage in FIG. 5A fabricated on a single ultrathin silicon on sapphire chip of the present invention.

FIG. 5C illustrates the integration of passive and active components on a single ultrathin silicon on sapphire chip of the present invention. Shown in FIG. 5C is amplifier stage 300 on a single ultrathin silicon on sapphire chip of the present invention. In this case, all of the components, including active as well as passive devices are formed in the same material. As above, circuit 300 includes active device 344, capacitors 346, resistors 348, and inductors 350. Circuit layout 340 has dimensions of only 100 mils by 30 mils and is, therefore, easily accommodated on a small portion of an ultrathin silicon on sapphire integrated circuit. One important factor necessary for the successful integration of high frequency active and passive RF components on a single chip which is provided by the ultrathin silicon on sapphire chip of the present invention is low conductivity of the insulating substrate. Since traditional bulk silicon processing technology is easily transferred to the ultrathin silicon on sapphire technology of the present invention, fabrication of amplifier stage 300 on a single ultrathin silicon on sapphire chip of the present invention is straightforward.

Additional information (including circuit designs, design rules, processes, etc.) which may be adapted for making similar or analogous devices or circuits in the ultrathin silicon on sapphire material of the present invention is disclosed in a book authored by J. E. Franca and Y. Tsividis, entitled "Design of Analog-Digital VLSI Circuits for Telecommunications and Signal Processing", 2nd Edition, Prentice Hall, 1994, this entire publication is hereby incorporated herein by reference.

ANALOG ELEMENTS

In order to eliminate the kink effect present in traditional SOS devices as previously described in the BACKGROUND OF THE INVENTION for analog circuitry, it is necessary to eliminate the undepleted region 176U under the gate 178 in the SOS transistor 171 shown in FIG. 4B. Two undesirable properties of traditional SOS devices must be overcome to eliminate this undepleted region 176U.

First, the density of active states must be reduced below about $2 \times 10^{11}$ cm$^{-2}$. Then the active states will not prematurely terminate the gate electric field, preventing it from ionizing all the dopant atoms in the channel region 176.

Second, the film thickness T must be less than the depletion depth when the channel is in a conductive state. When the channel is conducting, the surface potential of the channel has reached a value sufficient for inversion. This potential is more than 400 mV beyond the intrinsic potential of the substrate, and is more than sufficient to fully deplete a film thickness of approximately 1,000 Å.

Figure 6A:
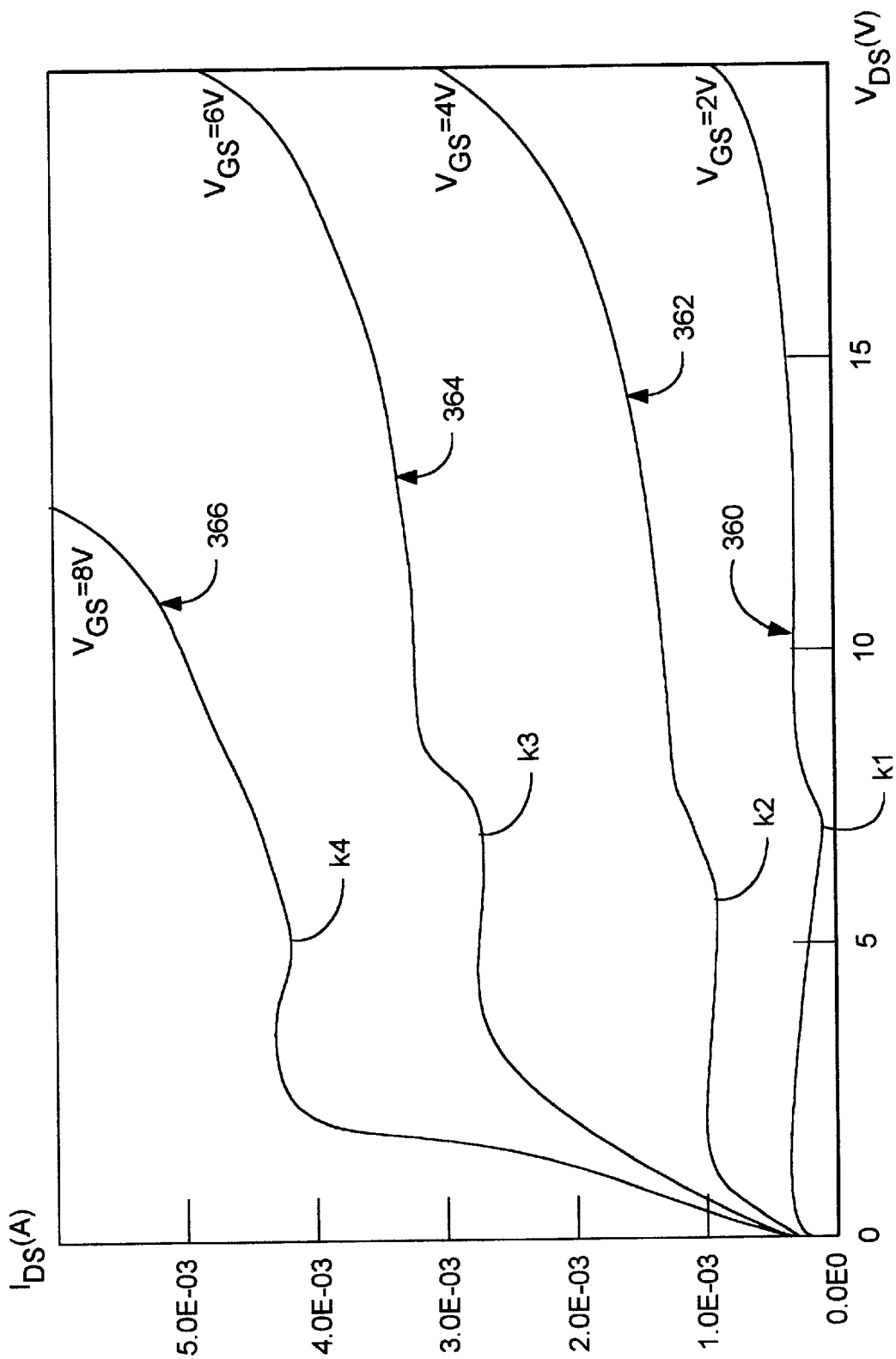
FIG. 6A illustrates the kink effect typical of traditional SOS devices.
Figure 6B:
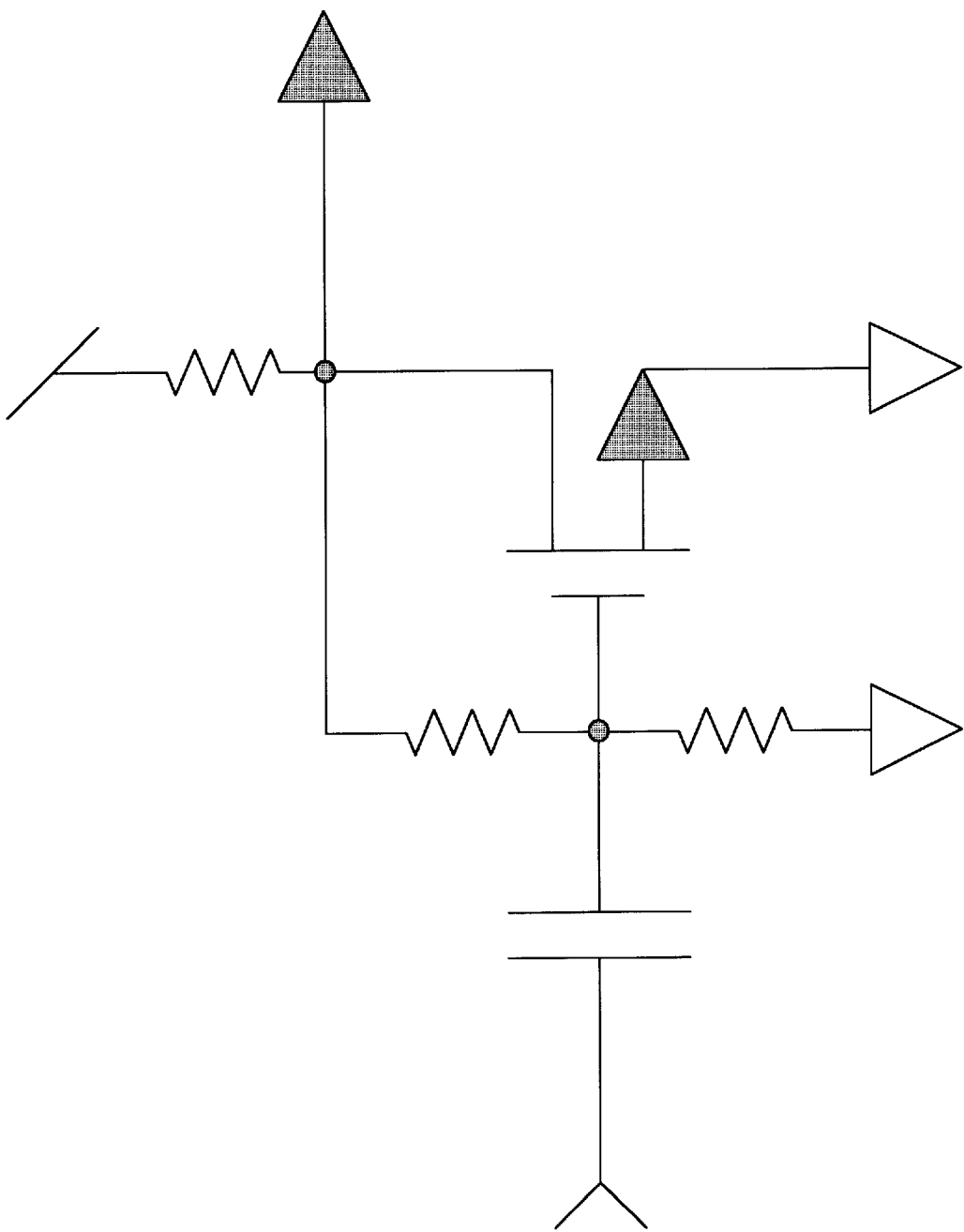
FIG. 6B shows a simple preamplifier circuit.

The curves shown in FIG. 6A illustrate the kink effect typical of traditional SOS devices. Curves 360, 362, 364 and 366 show the drain current $I_{DS}$ as a function of drain voltage $V_{DS}$ for four values of gate voltage $V_{GS}$, 2 volts, 4 volts, 6 volts and 8 volts, respectively. Each of these curves exhibits a kink, or non-linear feature, at the points labelled k1, k2, k3 and k4. Because drain current non-linearities and instabilities correspond to output voltage non-linearities and instabilities in a simple preamplifier as shown in FIG. 6B, such a preamplifier has a non-linear output voltage to input voltage relationship which is unsuitable for most analog circuit applications.

Referring now to FIGS. 7A through 7D, these graphs of N-channel and P-channel plots for bulk Si and the present invention in ultrathin silicon on sapphire will illustrate the absence of the kink effect in the present invention.

Figure 7A:
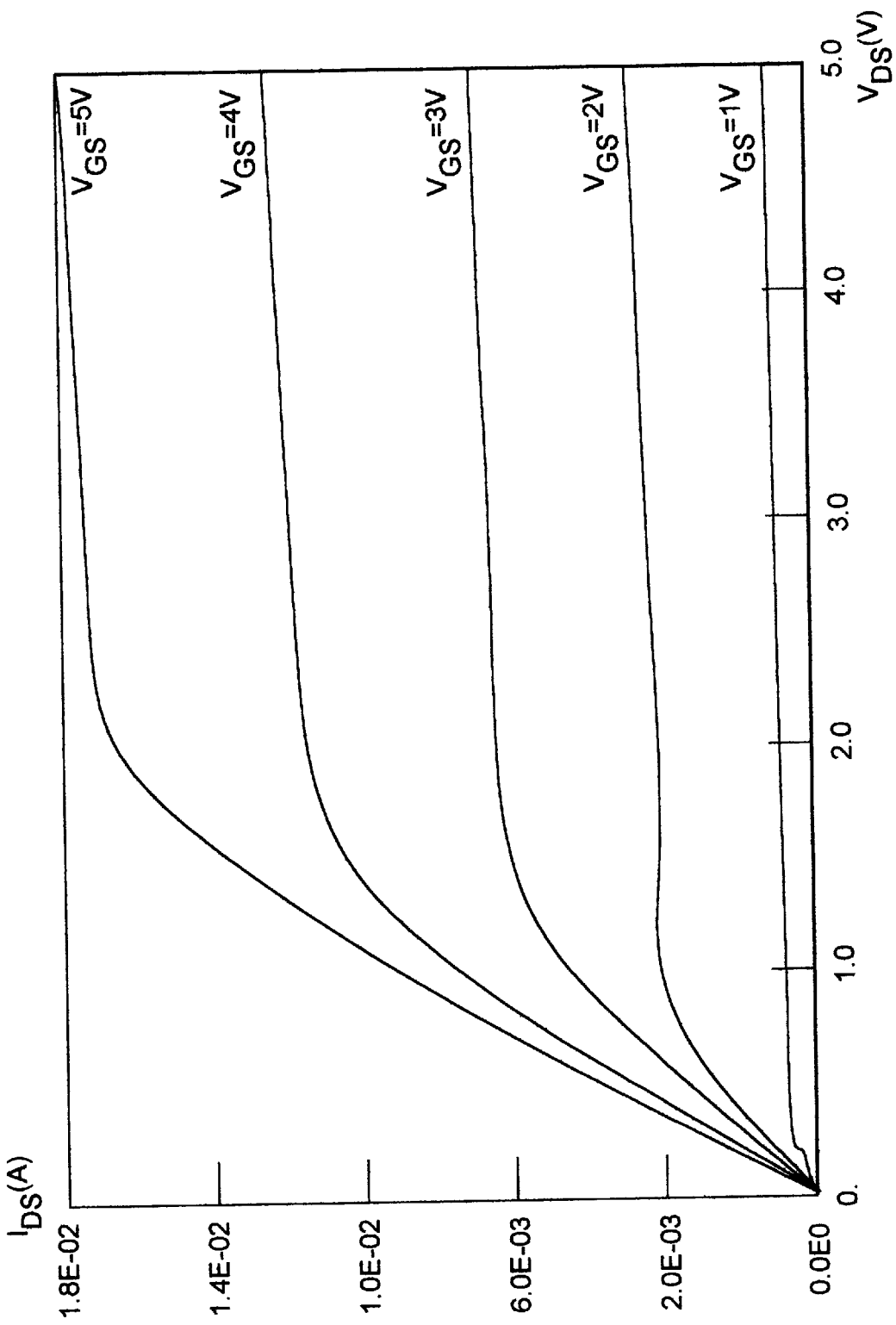
FIG. 7A illustrates the drain current versus gate voltage characteristics typical of a N-channel bulk silicon transistor.
Figure 7B:
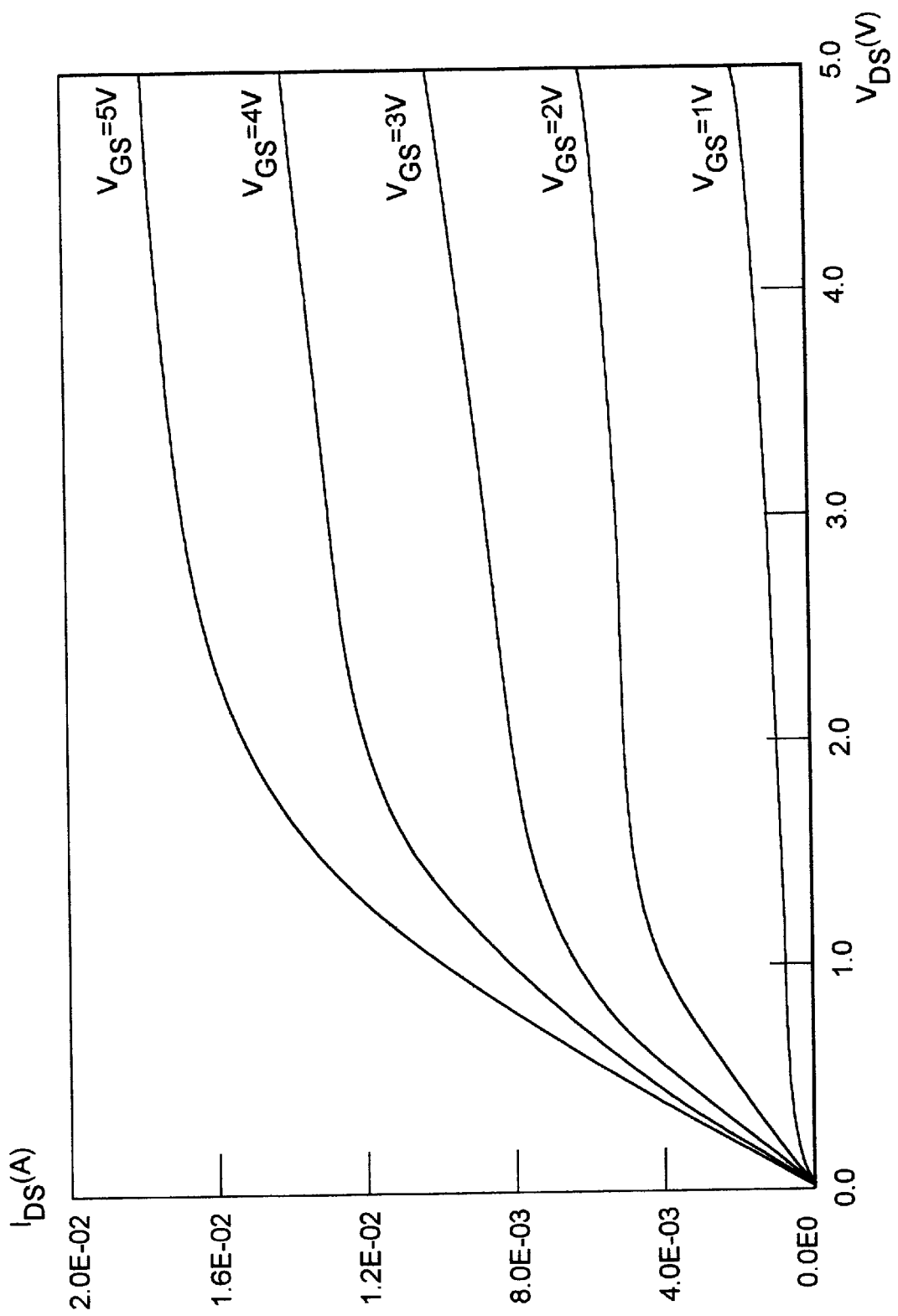
FIG. 7B illustrates the drain current versus gate voltage characteristics of a regular N-channel transistor fabricated in ultrathin silicon on sapphire of the present invention.

FIG. 7A illustrates the drain current versus gate voltage characteristics typical of a N-channel bulk Si transistor with an effective length or "LEFF" of 0.75 µm, a width of 50 µm, a gate polysilicon length of 0.75 µm, and a gate oxide thickness of 180 Å. FIG. 7B illustrates an N-channel transistor in ultrathin silicon on sapphire of the present invention with a width of 50 µm, an LEFF of 0.75 µm, a gate length of 0.75 µm, and a gate oxide thickness of 180 Å. The kink effect is absent in FIG. 7B and the flatness of the drain current curves indicates a minimal amount of electrostatic feedback from the drain to the gate region near the source. Because this transistor has a boron implant to bring its threshold near 0.7 V, it is designated as a "Regular N" or "RN" device.

Figure 7C:
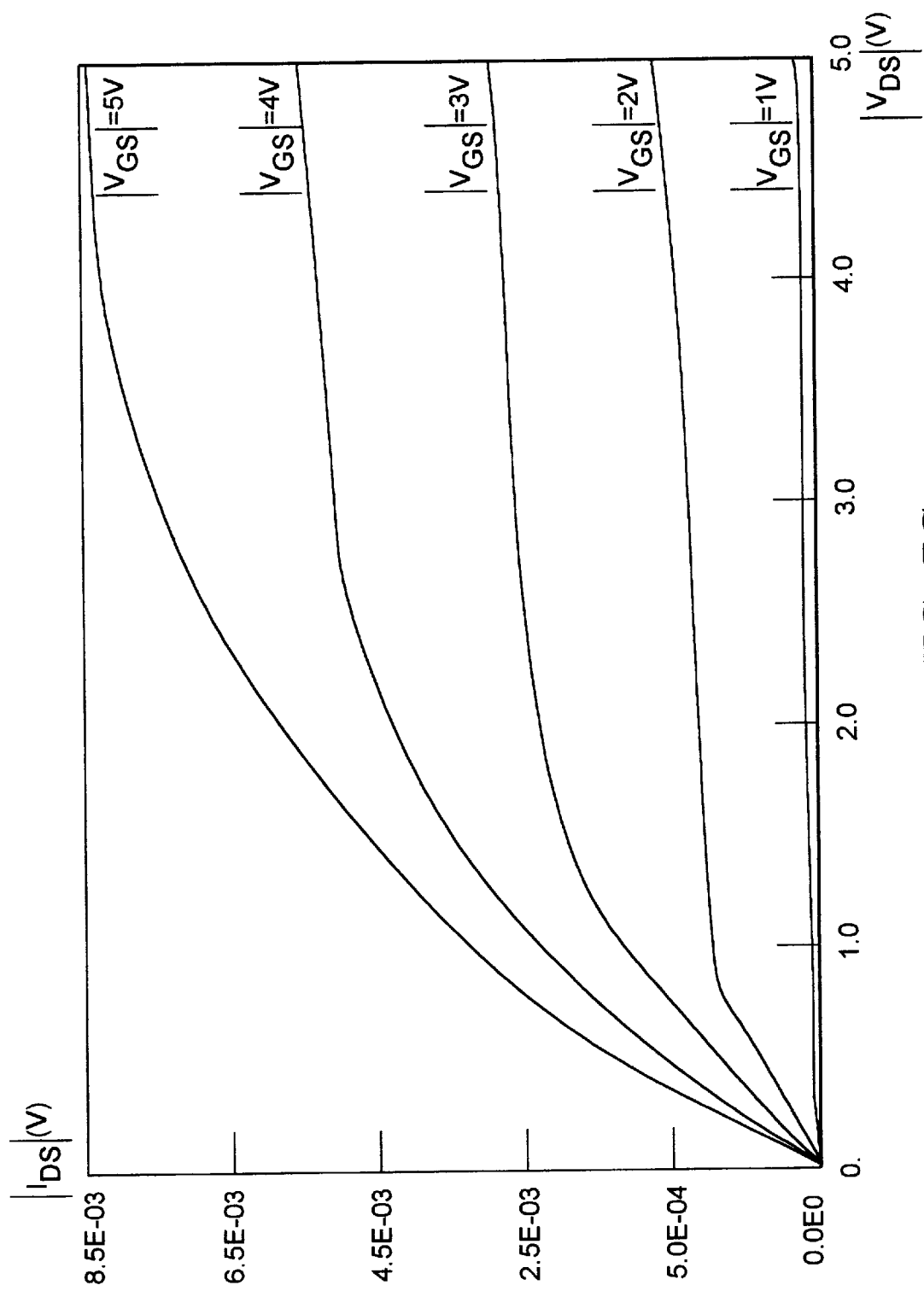
FIG. 7C illustrates the drain current versus gate voltage characteristics typical of a P-channel bulk silicon PMOS transistor.
Figure 7D:
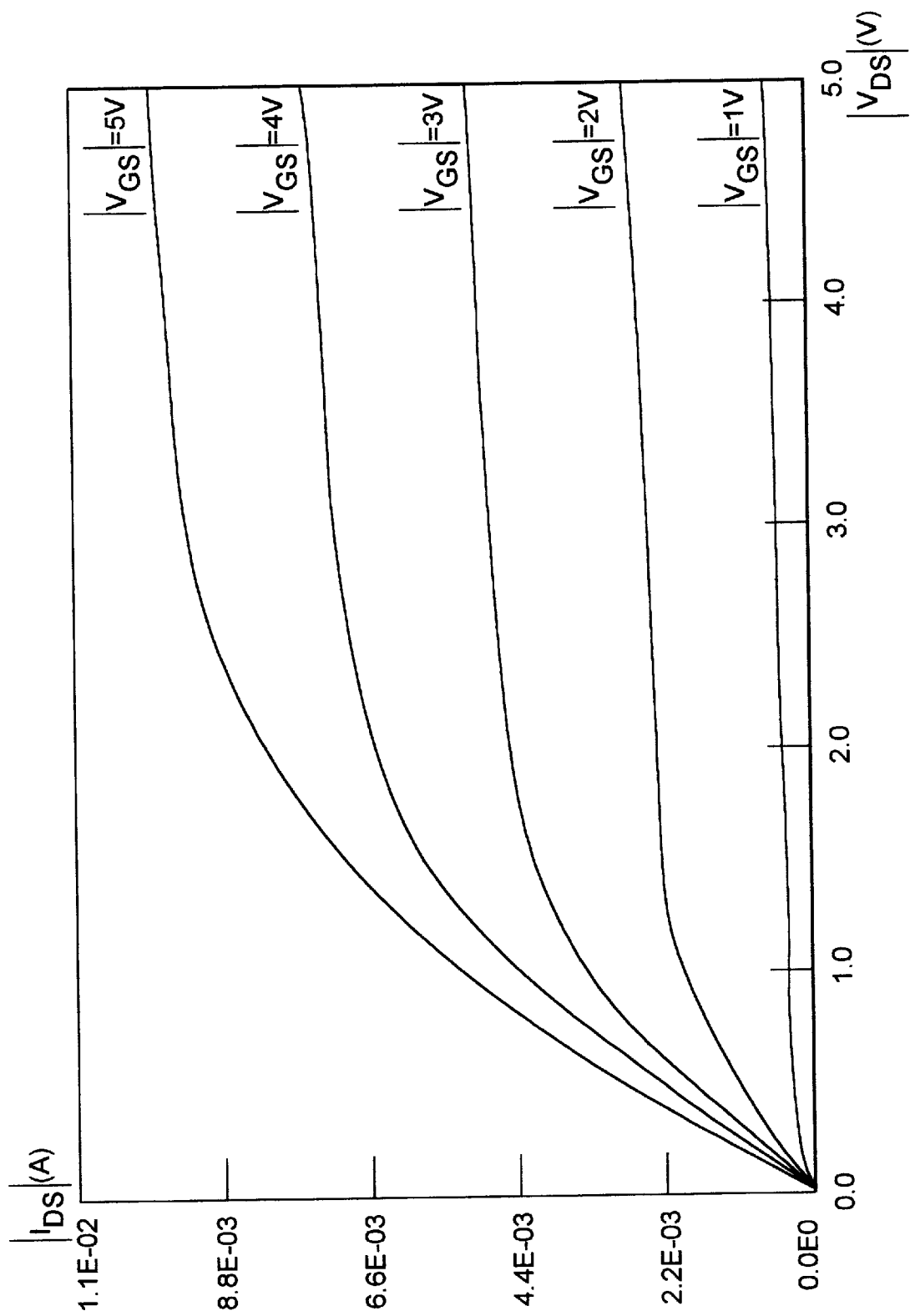
FIG. 7D illustrates the drain current versus gate voltage characteristics of a regular P-channel transistor fabricated in ultrathin silicon on sapphire of the present invention.

FIGS. 7C and 7D compare the P-channel curves for PMOS transistors in bulk Si and ultrathin silicon, respectively. The curves in FIG. 7C of bulk Si are for a transistor with a 0.75 $\mu$m LEFF, a width of 50 $\mu$m, a gate length of 0.75 $\mu$m, and a gate oxide thickness of 180 Å. The threshold voltage is seen from the curves to be approximately –0.9 V. The curves presented in FIG. 7D of the present invention are also for a PMOS transistor. The width is 50 $\mu$m, LEFF is 0.75 $\mu$m, the gate length is 0.75 $\mu$m, and the gate oxide thickness is 180 Å. As seen in the Figures, the P-channel transistor of the present invention provides at least 15% more $I_{DSAT}$ current than the bulk Si P-channel transistor of FIG. 7C.

The kink effect is absent in FIG. 7D as it is in FIG. 7B for the present invention. The flatness of the drain current curves indicates a minimal amount of electrostatic feedback from the drain to the gate region near the source. But, the flatness of the drain current characteristic also reveals another advantage of the current invention: the apparent absence of a significant amount of channel length modulation. The flatness of the drain current characteristics for both FIGS. 7B and 7D of the present invention indicates that the output conductance of these transistors is ideal for the fabrication of typical analog circuits such as operational amplifiers.

Because DC voltage gain in linear devices cannot exceed transconductance divided by output conductance, the DC gain of the device is significantly larger than the bulk Si P-channel MOS device. Transconductance is enhanced by comparison to bulk Si P-channel MOS devices because low doping in the channel results in less mobile carrier scattering, and therefore, higher mobility. An additional factor enhancing P-channel MOS mobility on sapphire substrates is that mismatches in the substrate to epitaxial lattice dimensions result in compressive stresses being applied to the epitaxial layer. Compressive stress in silicon enhances hole mobility, and therefore, enhances P-channel MOS transconductance. A threshold shifting implant reduces hole mobility. The P-channel transistor of FIG. 7D is designated "Regular P" or "RP" because it has a boron implant to shift threshold down to a regular bulk PMOS threshold of –0.7 volts. Because of the thinness of the fully depleted region, less boron is required than for the bulk CMOS device to reach the same threshold. Hole mobility is therefore approximately 10% to 20% higher for the RP device than for the bulk silicon PMOS device.

Figure 7E:
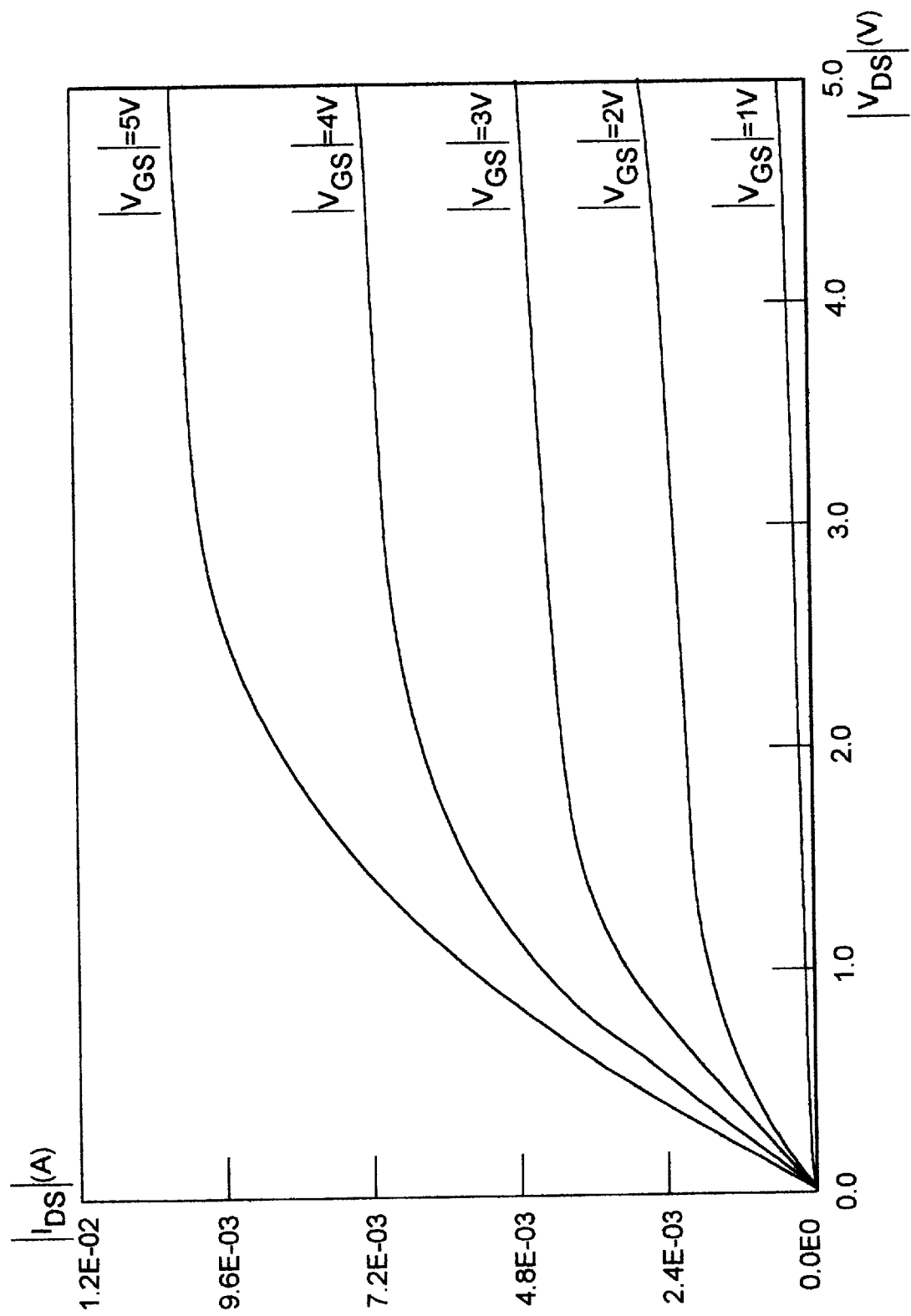
FIG. 7E illustrates the drain current versus gate voltage characteristics of an intrinsic P-channel transistor fabricated in ultrathin silicon on sapphire of the present invention.
Figure 7F:
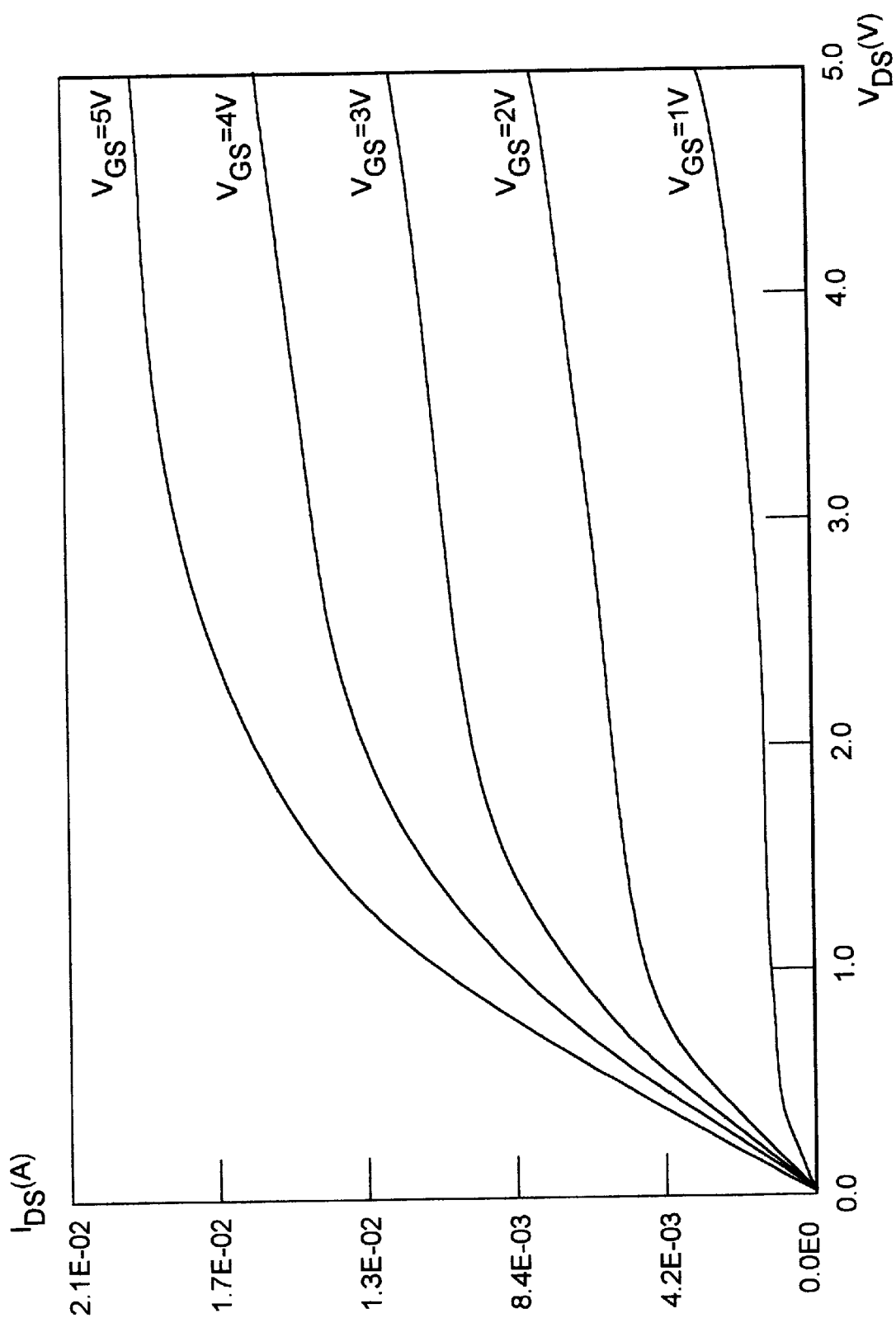
FIG. 7F illustrates the drain current versus gate voltage characteristics of an intrinsic N-channel transistor fabricated in ultrathin silicon on sapphire of the present invention.

It is also possible to fabricate both N-type and P-type devices in the ultrathin silicon on sapphire of the present invention with no threshold shifting implants. These devices are designated "Intrinsic P" or "IP" and "Intrinsic N" or "IN" and the drain current verse gate voltage characteristics of these devices are shown in FIG. 7E and FIG. 7F, respectively.

One embodiment of a PMOS transistor of the present invention is fabricated with a substrate doping of less than $5 \times 10^{15}$ cm$^{-3}$, well below the $5 \times 10^{16}$ cm$^{-3}$ considered adequate to prevent a typical sub-micron device from having unacceptably high output conductance resulting from channel length modulation. This is because the depletion region from the drain junction in a MOS device typically extends much farther into the channel than the drain because the channel is more lightly doped. The edge of the drain depletion region in the channel defines the end of the channel for a bulk CMOS device. If the depletion region length extends as a result of a drain voltage increase, then the channel length is shortened and the device current, proportional to the width divided by the length of the channel, increases. The amount the depletion region lengthens for a given change in drain voltage is inversely proportional approximately to the square root of doping density.

Another important property related to the fabrication of typical analog circuits, such as operational amplifiers, is offset voltage uniformity. It is desirable to achieve offset voltages less than 50 mV in typical CMOS operational amplifier applications. Because the standard deviation in threshold variation from the presence of active states is proportional to the square root of the number of active states below the gate, reducing the active state density to an acceptable value is key to obtaining an acceptable offset voltage uniformity.

Full depletion of the substrate provides an extremely useful result in the construction and performance of an analog transmission gate. The analog transmission gate is a well known device in the art of CMOS data converters. The gate functions as a switch with a very high "off resistance" and an "on resistance" inversely proportional to the "gate drive", or gate-to-source voltage in excess of threshold.

Figure 8:
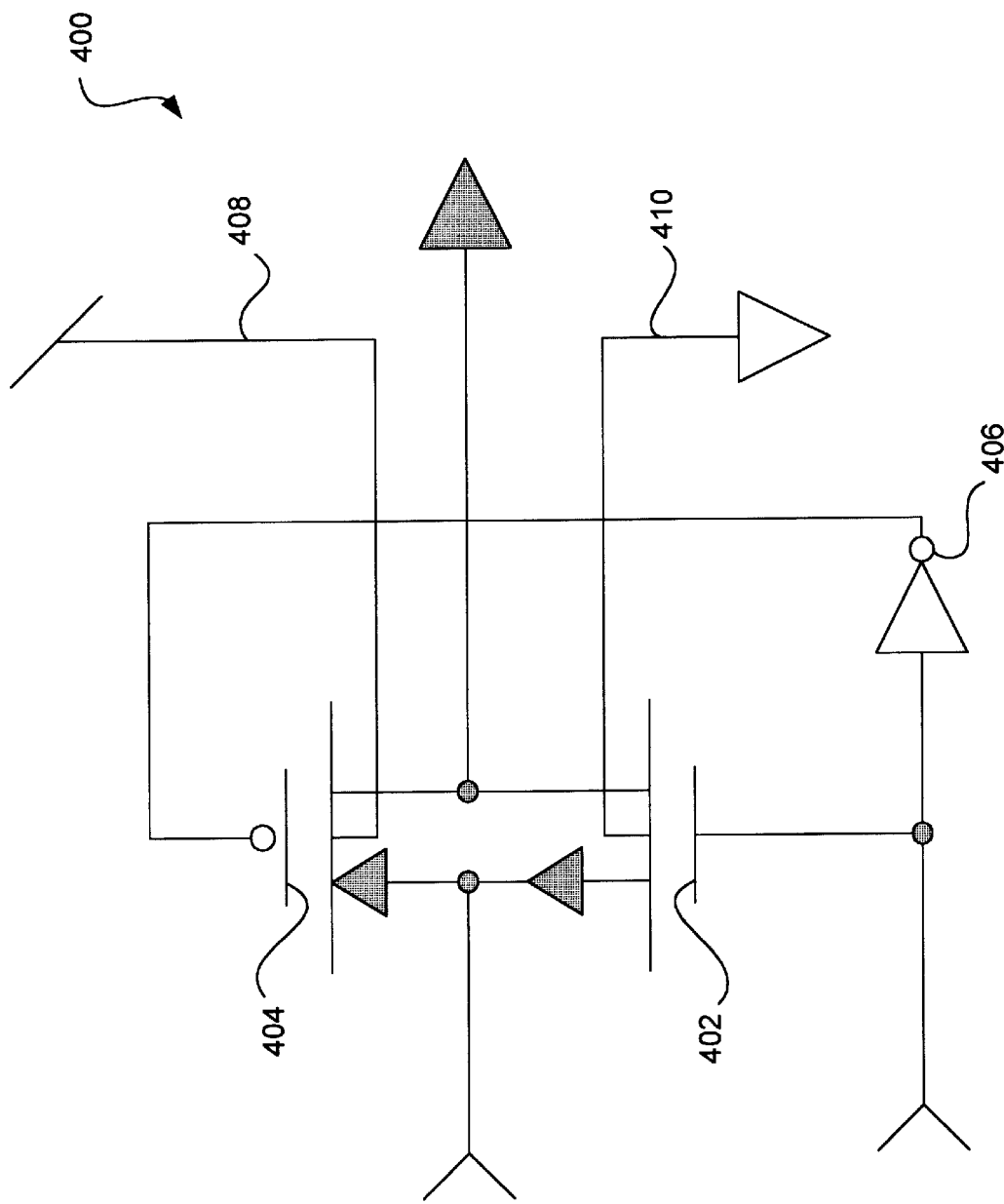
FIG. 8 shows a typical bulk silicon analog transmission gate circuit.

A typical bulk silicon analog transmission gate circuit 400 of bulk Si is shown in FIG. 8. Circuit 400 includes an NMOS device 402, a PMOS device 404, a logic inverter 406, a PMOS N well supply voltage of 5 V, 408, and a NMOS P well supply voltage of 0 V (or grounded) 410.

The IP device of the present invention has a mobility slightly higher than the RP device because of the lack of a threshold shifting implant. The threshold voltage of approximately –1 volt is not as high as for the corresponding bulk silicon device because there is much less contribution to threshold voltage shift from substrate depletion charge. Fabrication of a bulk CMOS IP or IN channel device would not be practical since channel length modulation effects would increase output conductance to levels unacceptable for conventional analog or digital MOS circuit design.

The IN device has a mobility significantly higher than the RN device because of a lack of a threshold-shifting implant. Threshold for the IN device is near 0 volts. This device is useful for high current drivers in memory applications and for source follower transistors in analog applications. In an analog source-follower the normal gate-to-source threshold causes the source output voltage to be at a voltage below the gate input voltage by an amount greater than the threshold voltage. This gate-to-source offset voltage is reduced by at least 0.7 volts from the use of the IN, rather than the RN device. It is reduced additionally as a result of the low source-body effects present in both RN and IN ultrathin fully depleted silicon on sapphire devices. The last reduction is significant because analog source-followers are normally operated with source voltages midway between the positive and negative supply voltages.

An analog transmission gate of the present invention in ultrathin silicon comprises the same elements as the analog transmission gate 400 in FIG. 8 of bulk Si, but with the elimination of the PMOS N well supply voltage 408 and NMOS P well supply voltage 410. The analog transmission gate fabricated in the ultrathin silicon on sapphire of the present invention does not exhibit the problems associated with the bulk silicon version of this circuit previously described in the BACKGROUND OF THE INVENTION section. In the present invention, the threshold does not increase with source voltage because the depletion region has already reached its maximum depth at the onset of inversion. The gate voltage in excess of threshold is, then, just the difference between the gate-source voltage and the device threshold of 0.8 V. This is low compared with a bulk MOS threshold of typically 1.7 V when the source is operated at a voltage midway between the +5 V supply voltage. The "on resistance" of the gate is therefore a factor of 2 less than in bulk Si. Also, because of a lack of body effect, it is possible in some cases to employ a simple N-channel pass transistor 402 can be used in place of the transmission gate 400, thereby eliminating P-channel MOS-FET 404 and logic inverter 406, thereby reducing area and complexity by up to 80%.

Because of the reduction in "on resistance" possible using the present invention, transmission gate speed is increased by more than a factor of 2 in driving a given capacitive load at mid-supply. This speed increase is also useful in transmission gates used in SRAM or DRAM cells.

Figure 9A:
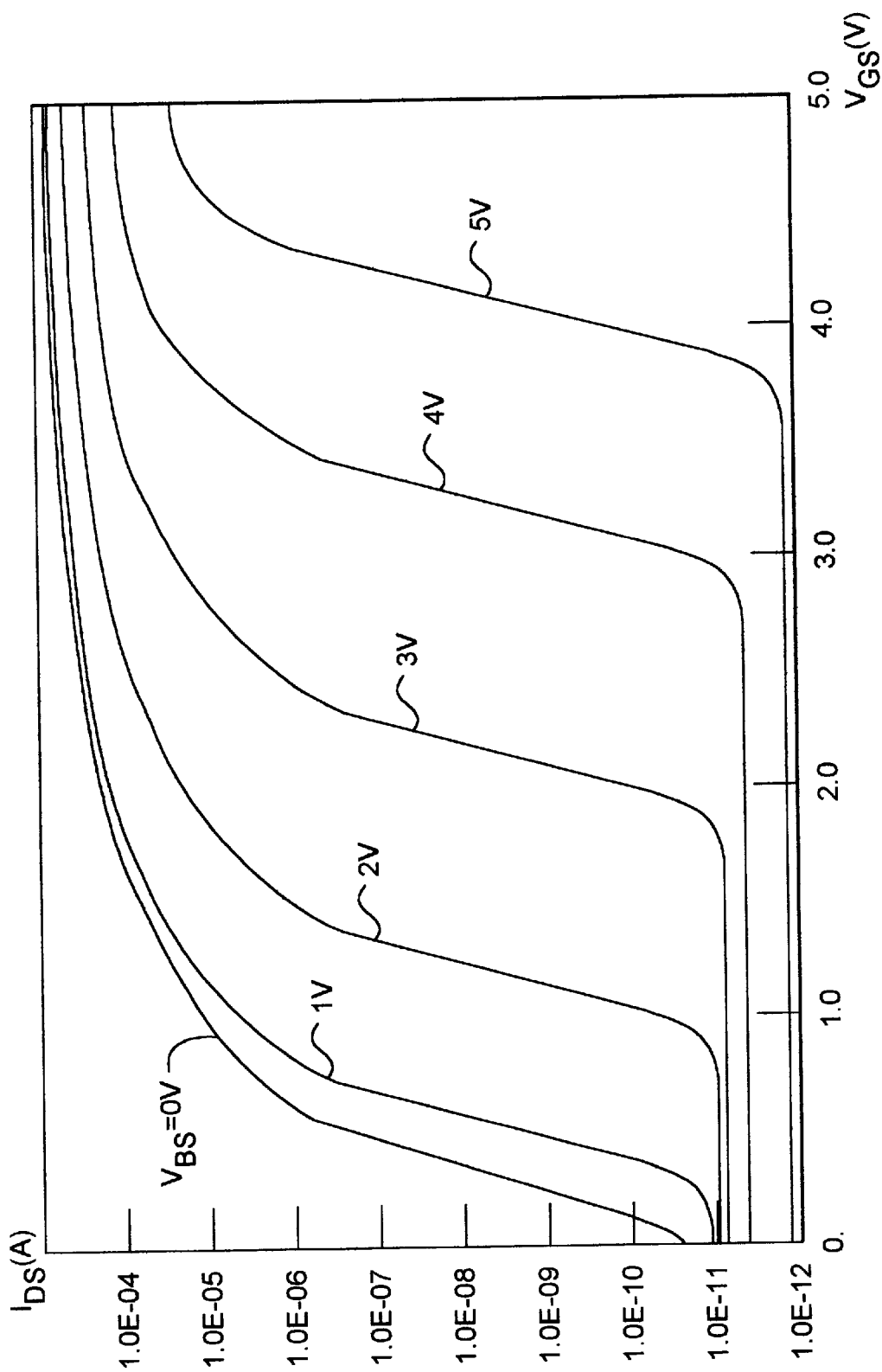
FIG. 9A shows a family of Log I–V plots for a bulk Si N-channel MOS transistor.
Figure 9B:
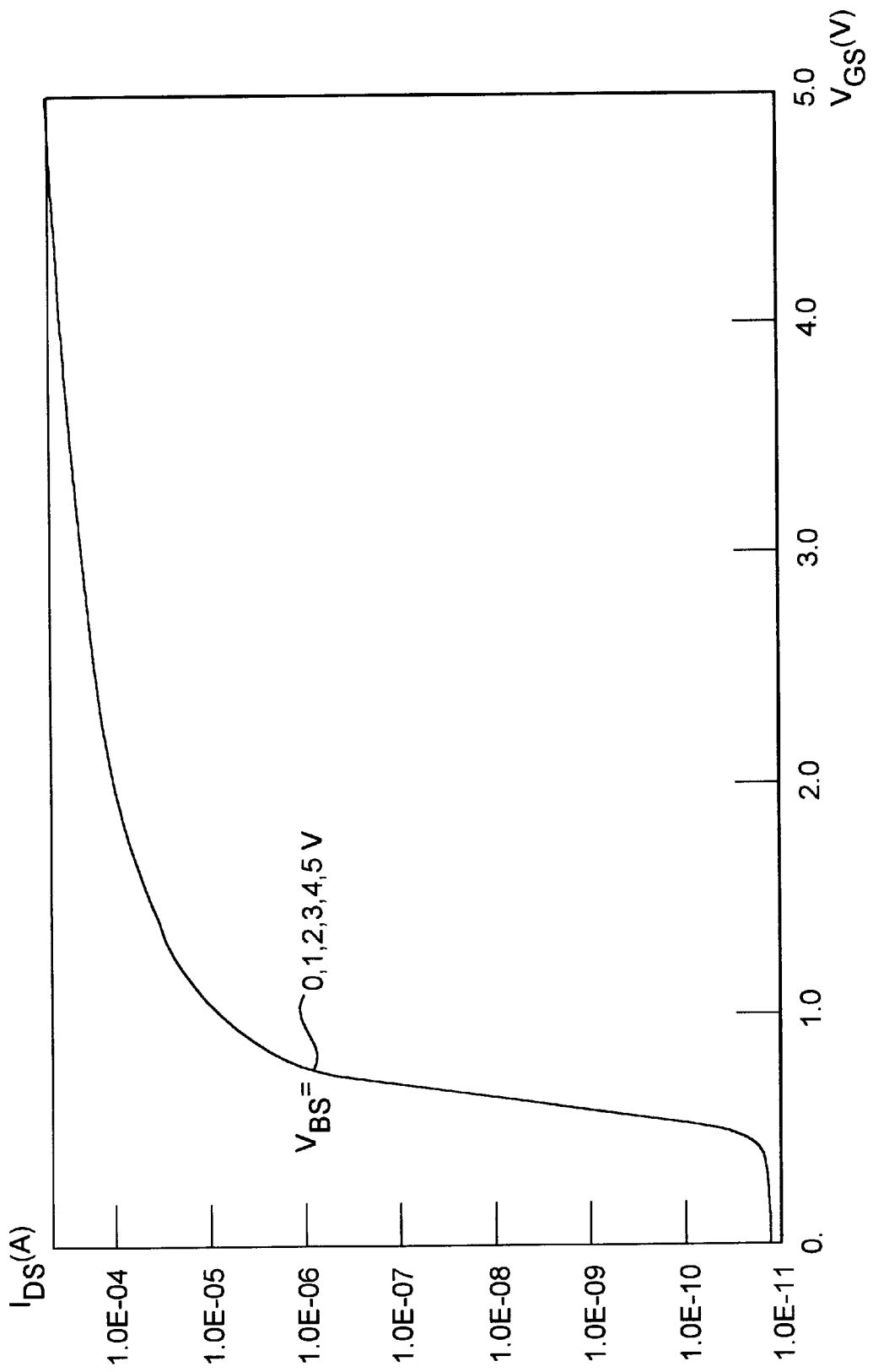
FIG. 9B shows a Log I–V plot for an N-channel MOS transistor fabricated in the ultrathin silicon on sapphire of the present invention.

In order to demonstrate the absence of source body effects in the present invention, a comparison of a bulk silicon N-channel MOS transistor with an N-channel MOS transistor fabricated in ultrathin silicon on sapphire of the present invention is shown in FIGS. 9A and 9B. FIG. 9A is a family of Log I-V plots for a bulk Si N-channel MOS transistor. The drain to source current, $I_{DS}$, is plotted as a function of the gate to source voltage, $V_{GS}$, for six values of the bulk (or well) to source voltage, $V_{BS}$. The curves demonstrate that the curves shift to the right as the voltage between the bulk Si substrate and the source, $V_{BS}$, increases, thus indicating an increase in threshold voltage, $V_{TH}$. As the threshold voltage goes up, the gate drive is reduced by a corresponding amount.

FIG. 9B shows a Log I-V plot for an N-channel MOS transistor fabricated in the ultrathin silicon on sapphire of the present invention. The drain to source current, $I_{DS}$, is plotted as a function of the gate to source voltage, $V_{GS}$ for the same values of $V_{BS}$ as shown in FIG. 9A. Advantageously, this plot shows that there is no change in depletion with source voltage to affect threshold voltages. The identical curves in FIG. 9B illustrate that no source body effect occurs for this N-channel transistor.

Additional information (including circuit designs, design rules, processes, etc.) which may be adapted for making similar or analogous devices or circuits in the ultrathin silicon on sapphire material of the present invention is disclosed in: 1) a book authored by Paul R. Gray and Robert G. Meyer entitled "Analysis and Design of Analog Integrated Circuits", 3rd Edition, John Wiley & Sons, Inc., 1993, ISBN 0-471-57495-3; and 2) a book edited by Leonard Shaw entitled "Analog MOS Integrated Circuits, II", The Institute of Electrical and Electronics Engineers, Inc., 1989, IEEE Order Number: PC02394, ISBN 0-87942-246-7, the entire contents of both of these publications are hereby incorporated herein by reference.

LOGIC ELEMENTS

Modem integrated circuits are comprised of many transistors (up to several millions). While leading to complex systems on a chip, these circuits are basically large assemblages of a few basic building blocks. These building blocks, called logic gates, include NAND (NOT-AND), NOR (NOT-OR), and transmission (or "pass") gates. The latter is discussed in the previous analog section, and NAND and NOR gates are discussed in the present logic section. For a specific application, these gates are interconnected using standard metallization to form complex chips such as a field programmable gate array (FPGA) or microprocessor.

Figure 10:
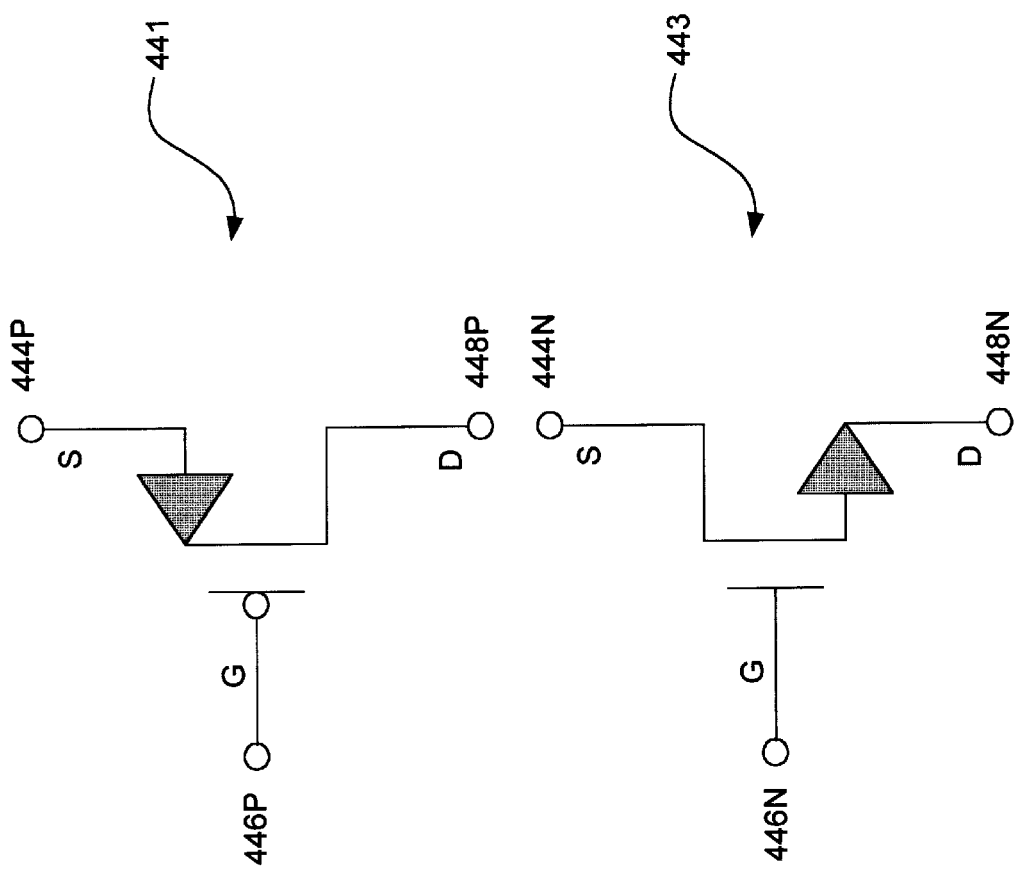
FIG. 10 shows the N-channel MOS transistor and the P-channel MOS transistor shown in FIG. 3C in a transistor-level schematic format.

A cross sectional view of two FET devices fabricated on an ultrathin silicon on sapphire wafer of the present invention is illustrated in FIG. 3C. FIG. 10 represents the same devices shown in FIG. 3C, but in a transistor-level schematic format. A P-channel transistor 441 in FIG. 10 corresponds with P-channel transistor 67 in FIG. 3C, and an N-channel transistor 443 in FIG. 10 corresponds with N-channel transistor 69 in FIG. 3C. The present invention will hereinafter be referred to in the schematic format shown in FIG. 10.

In the present invention, P-channel and N-channel transistors 441 and 443 both include a source, 444P and 444N, a gate, 446P and 446N, and a drain, 448P and 448N, as labeled in FIG. 10. This figure represents two transistors, and its form can be used as an example for the following drawings also depicted in this transistor-level schematic diagram format.

The ultrathin silicon on sapphire wafer processes greatly improve the design, function, and cost in building logic circuitry in the present invention. The thinness of the epitaxial silicon film is of great help in the fabrication of both N and P-channel MOS transistors with sub-micron channel lengths. Logic circuitry in ultrathin silicon may be fabricated at reduced lengths without significant short channel effects from drain electrostatic feedback.

Figure 11:
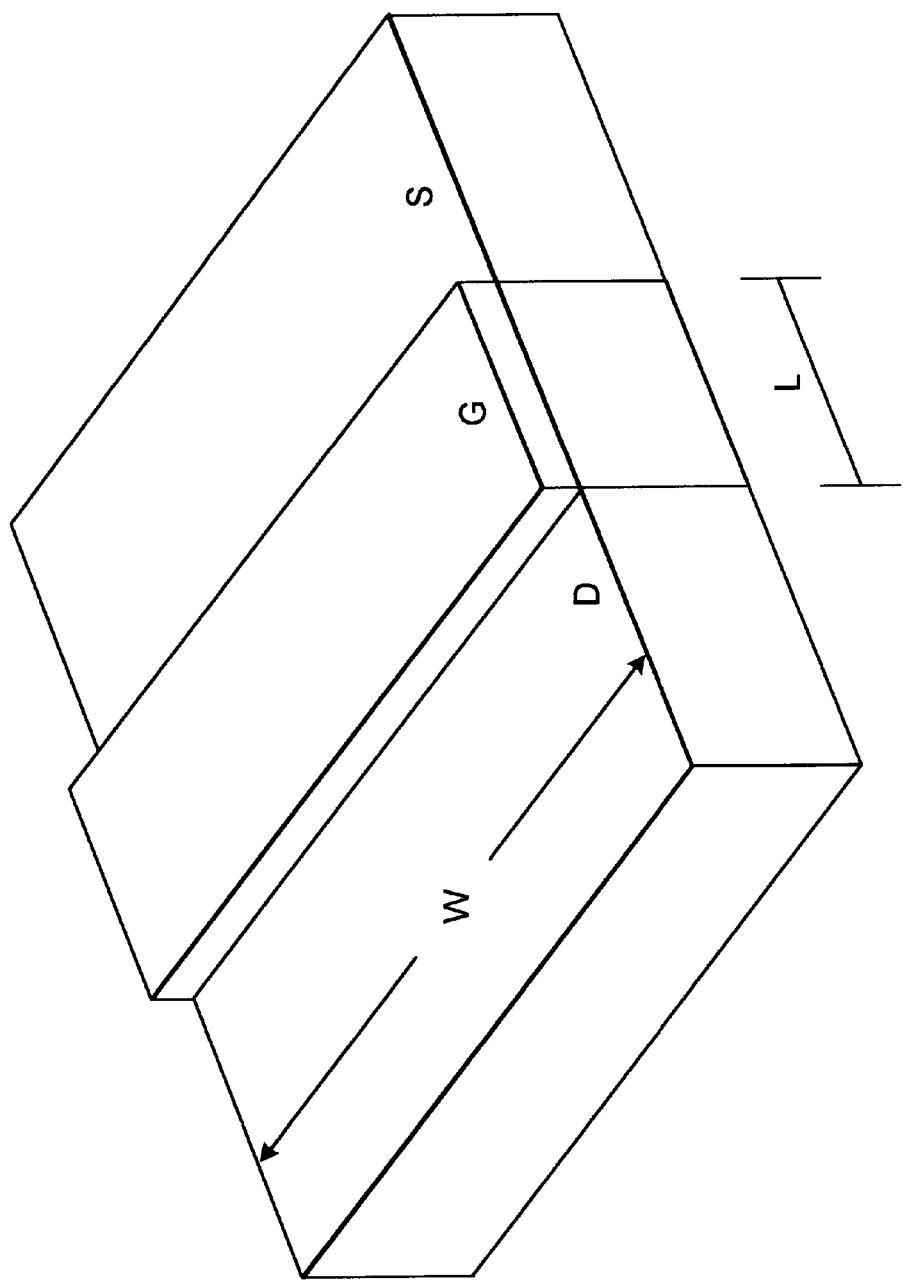
FIG. 11 shows an isometric view of a typical transistor with a gate G, source S, and drain D illustrating W and L dimensions.

In FIG. 11, an isometric view of a typical transistor with a gate G, source S, and drain D, is shown. Transistor channel width W and length L dimensions are shown. In the following drawings, width and length (W/L) dimensions will be represented by these symbols W and L. To explain the advantages of building logic circuitry in ultrathin silicon, a comparison of W/L dimensions for the present invention and bulk Si is useful. These dimensions demonstrate how ultrathin silicon improves upon bulk Si technology by allowing the use of reduced dimensions. A reduction in the PMOS gate lengths is especially advantageous.

Figure 12:
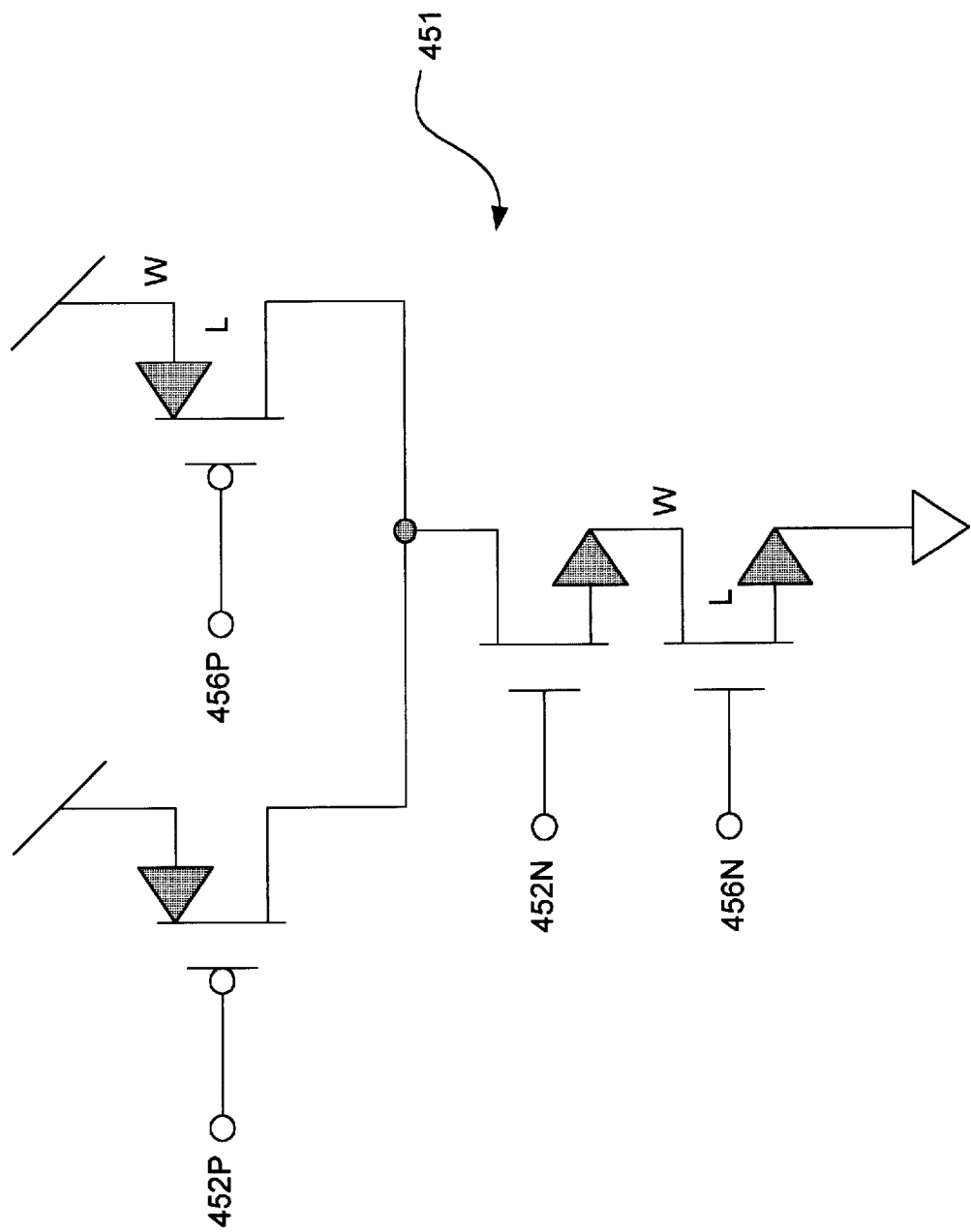
FIG. 12 shows a NAND gate fabricated in accordance with the present invention.

One logic circuit embodiment, a NAND gate 451, is shown in FIG. 12. Devices 452P and 456P represent P-channel transistors, and devices 452N and 456N represent N-channel transistors. In ultrathin silicon, the W/L dimensions are reduced significantly as compared to bulk silicon. For example, in the present invention, P-channel devices 452P and 456P of NAND gate 451 have W/L dimensions of 1.3/0.7 µm. For N-channel devices of NAND gate 451, the W/L dimensions are 0.9/0.8 µm for device 452N and 1.1/0.8 for device 456N.

In ultrathin silicon, the P-channel dimensions are also reduced, allowing the N-channel dimensions to be reduced to drive the reduced capacitance load and yield significant advantages over bulk Si and conventional SOS.

For P-channel devices in the bulk Si NAND gate, the W/L dimensions are 1.8/0.9 µm. The N-channel device W/L dimensions are 1.1/0.8 µm for the top N-channel transistor (452N) and 1.2/0.8 µm for the bottom N-channel transistor (456N).

The PMOS devices 452P and 456P in NAND gate 451 have an increase in transconductance in the present invention. This increase allows the PMOS transistors to be sized down to 1.3 µm from the 1.8 µm found in bulk Si. This width yields an almost 30% reduction in gate input capacitance and area compared to bulk Si.

NMOS devices 452N and 456N are designed to drive a certain capacitive load, often composed of other gates, at a given speed. Because the capacitive gate load of a given gate driver is reduced as a result of lower PMOS gate capacitance in ultrathin silicon, the width is reduced to 0.9 μm instead of the 1.1 μm found in bulk Si. Relative to a bulk Si implementation, NMOS device 456N has somewhat greater drive in ultrathin silicon due to the elimination of the bulk Si source-body effect. Thus, it may be possible to further reduce the width of NMOS device 452N, 456N, or both while maintaining in speed matching a comparable bulk Si NAND gate.

Figure 13:
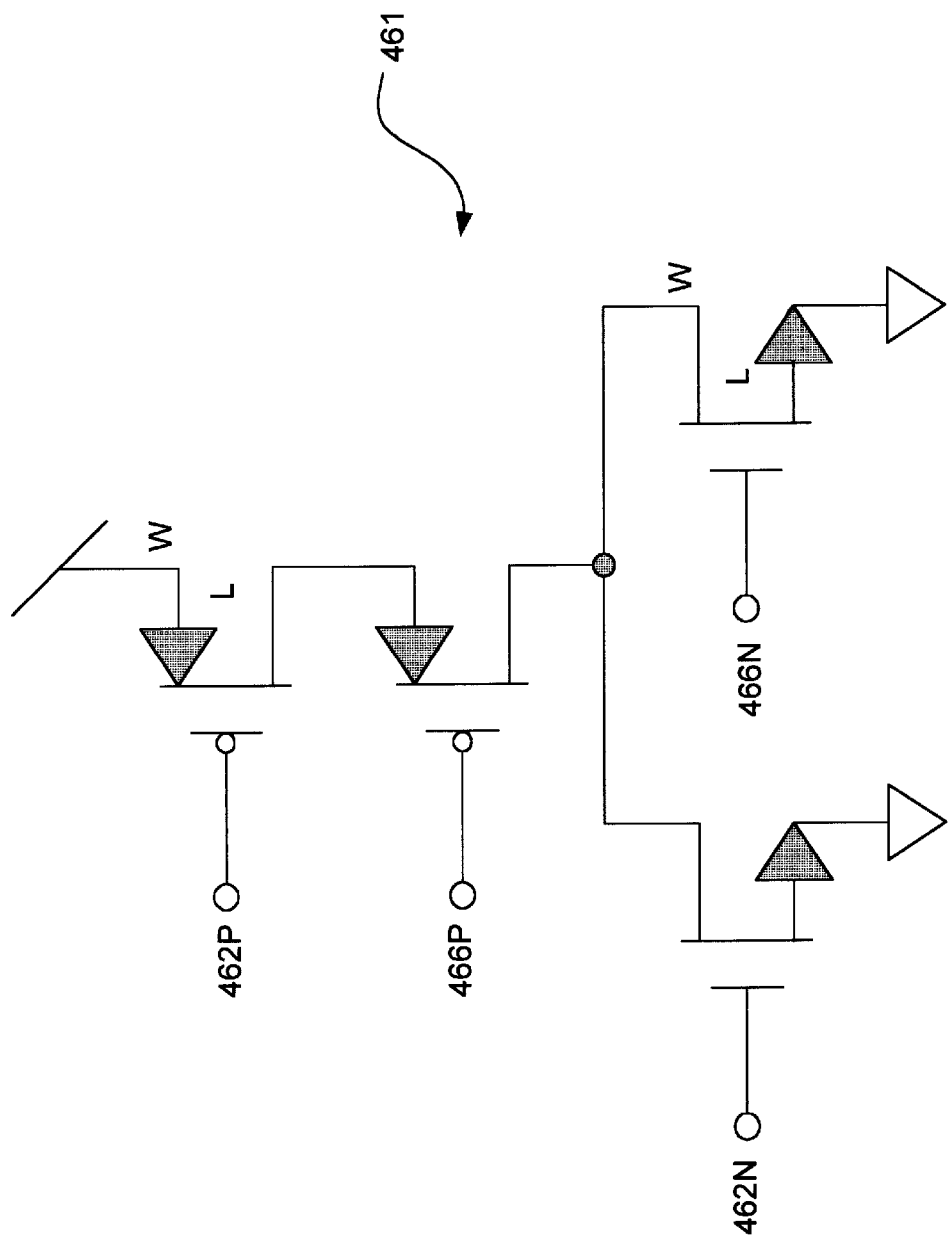
FIG. 13 shows a NOR gate fabricated in accordance with the present invention.

The advantages of ultrathin silicon for logic circuitry are also demonstrated in NOR gate logic devices. A NOR gate 461 is illustrated in FIG. 13. The W/L dimensions for the transistors are significantly reduced compared to the transistors found in bulk Si NOR gate circuitry.

PMOS transistors 462P and 466P for NOR gate 461 have W/L dimensions of 1.5/0.7 μm in ultrathin silicon. NMOS transistors 462N and 466N have W/L dimensions of 1.0/0.8 μm.

In comparison, PMOS transistors for NOR gate logic in bulk Si have W/L dimensions of 3.0/0.9 μm, and NMOS transistors have W/L dimensions of 1.2/0.8 μm. Note that the PMOS gate widths in ultrathin silicon are 50% smaller than the PMOS gate widths in bulk Si (3.0 μm to 1.5 μm) for the same gate speed. This substantial reduction for all the reasons mentioned in the BACKGROUND OF THE INVENTION for logic elements is an improvement over bulk Si technology.

Also, because of the reduced PMOS input capacitance in ultrathin silicon, NMOS devices 462N and 466N are sized with widths of 1.0 μm, which is approximately 20% less than the 1.2 μm width requirements for NMOS devices in the bulk Si NOR gate. A crucial amount of cell space is now saved for both NMOS and PMOS transistors, which ultimately reduces costs of production.

MEMORY ELEMENTS

Modern integrated circuit memories are comprised of many (up to multiple millions) transistors. While often occupying large chip areas, these circuits are assemblages of a few basic building blocks. These building blocks, called cells, are comprised of word-line decoders, word-line drivers, memory cells, column coders, and sense amplifiers. Memory cells most commonly used are dynamic random access memory (DRAM) cells and static random access memory (SRAM) cells.

Figure 14A:
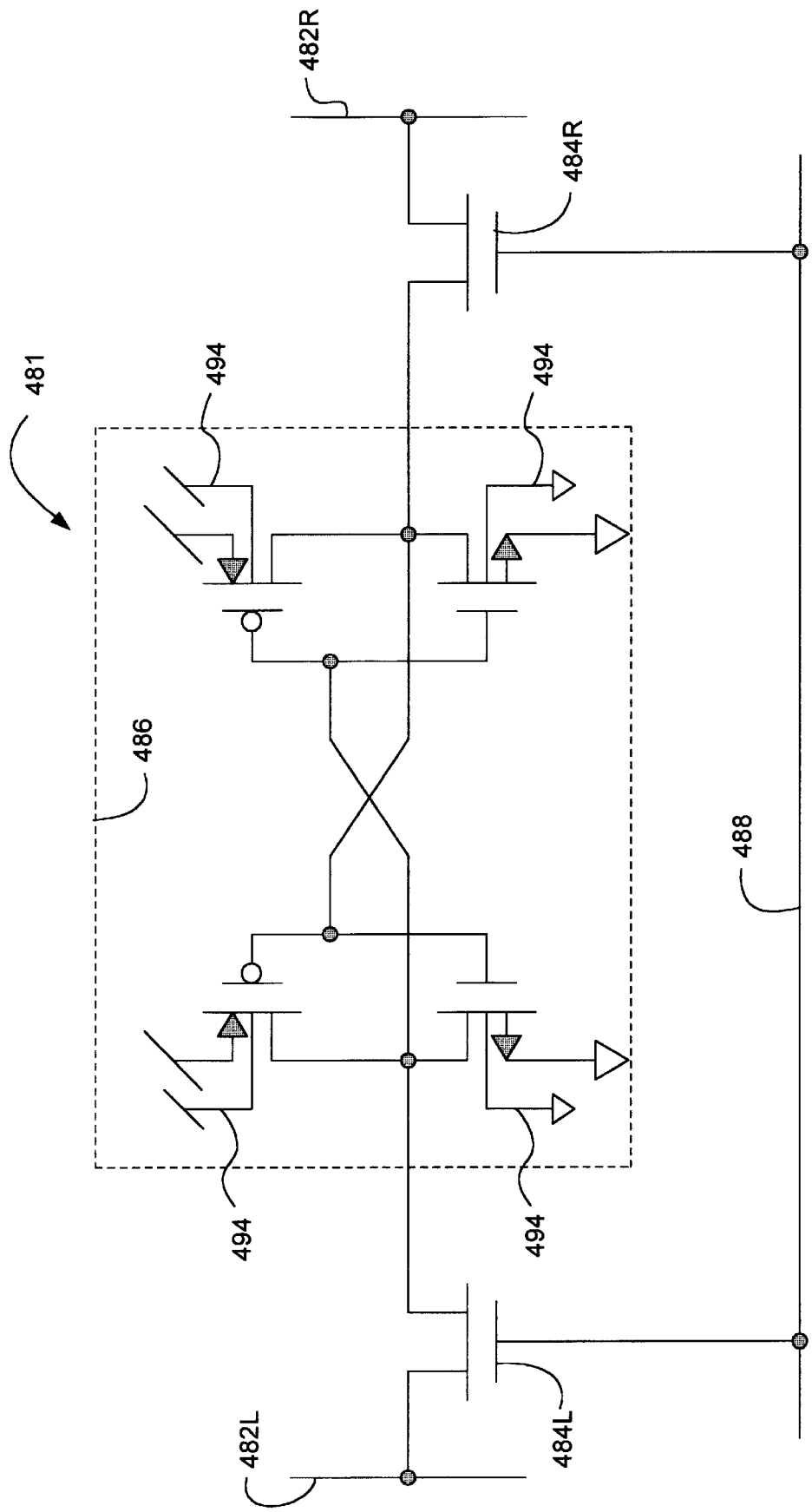
FIG. 14A shows a schematic diagram for a typical bulk Si CMOS 6 transistor (6-T) SRAM cell.

A schematic diagram for a typical bulk Si CMOS 6 transistor (6-T) SRAM cell 481 is shown in FIG. 14A. The cell 481 comprises a left bit line 482L, a right bit line 482R, a left pass transistor 484L, and a right pass transistor 484R. Also shown is a core flip flop 486, which is a basic logic circuit component, a word line 488 and substrate ties 494. As is well understood, it is also possible to form a 4-T SRAM cell by replacing the two PMOS devices inside the core flip-flop 486 with resistors. Such an embodiment is understood to be included within the scope of the present invention and the discussion below is appropriate for either a 4-T or a 6-T implementation.

Numerous improvements result when the SRAM cell 481 is fabricated in ultrathin silicon on sapphire of the present invention. Memory word line driver power is reduced by constructing the pass-gates 484L and 484R with lower input gate capacitance than if constructed in a bulk Si counterpart. The gate input capacitance is reduced to the fully depleted channel with reductions ranging from 10% to 50% depending on specific design and operating conditions.

Word line driver size reduction and power savings result from the reduced depletion capacitance of the "off" pass transistor. Depletion charge in ultrathin silicon reaches a limit prior to the transistor reaching the threshold voltage. The total charge push is quite small by comparison to bulk Si. The combination of a fully depleted substrate and reduced gate area capacitance greatly reduces the capacitance of the cell "off" pass devices, (484L or 484R) connected to internal nodes storing a logic 1, or high voltage. In addition, the memory word line current is decreased in a small, but measurable amount by decreased wiring capacitance with construction of the word lines over an insulating substrate in the present invention.

Assuming proper cell read margin design, pass transistors, 484L and 484R, may have smaller widths without sacrificing speed since ultrathin silicon bit-line capacitance is less than that present in bulk Si MOS memories. The elimination of the bulk Si source-body effect may allow further pass transistor width reduction due to improved drive relative to bulk Si. In addition, memory word line 488 driver power is reduced as a result of lower cell pass transistor gate-source overlap by comparison to bulk Si MOS memories.

A reduction in pass transistors 484L and 484R size over conventional SOS technology may also accrue to the low sense amplifier differential input voltage required as compared to an amplifier constructed with traditional SOS. This is because sense amplifiers have far less variation in offset voltage than in conventional SOS and consequently require far less overdrive.

Figure 14B:
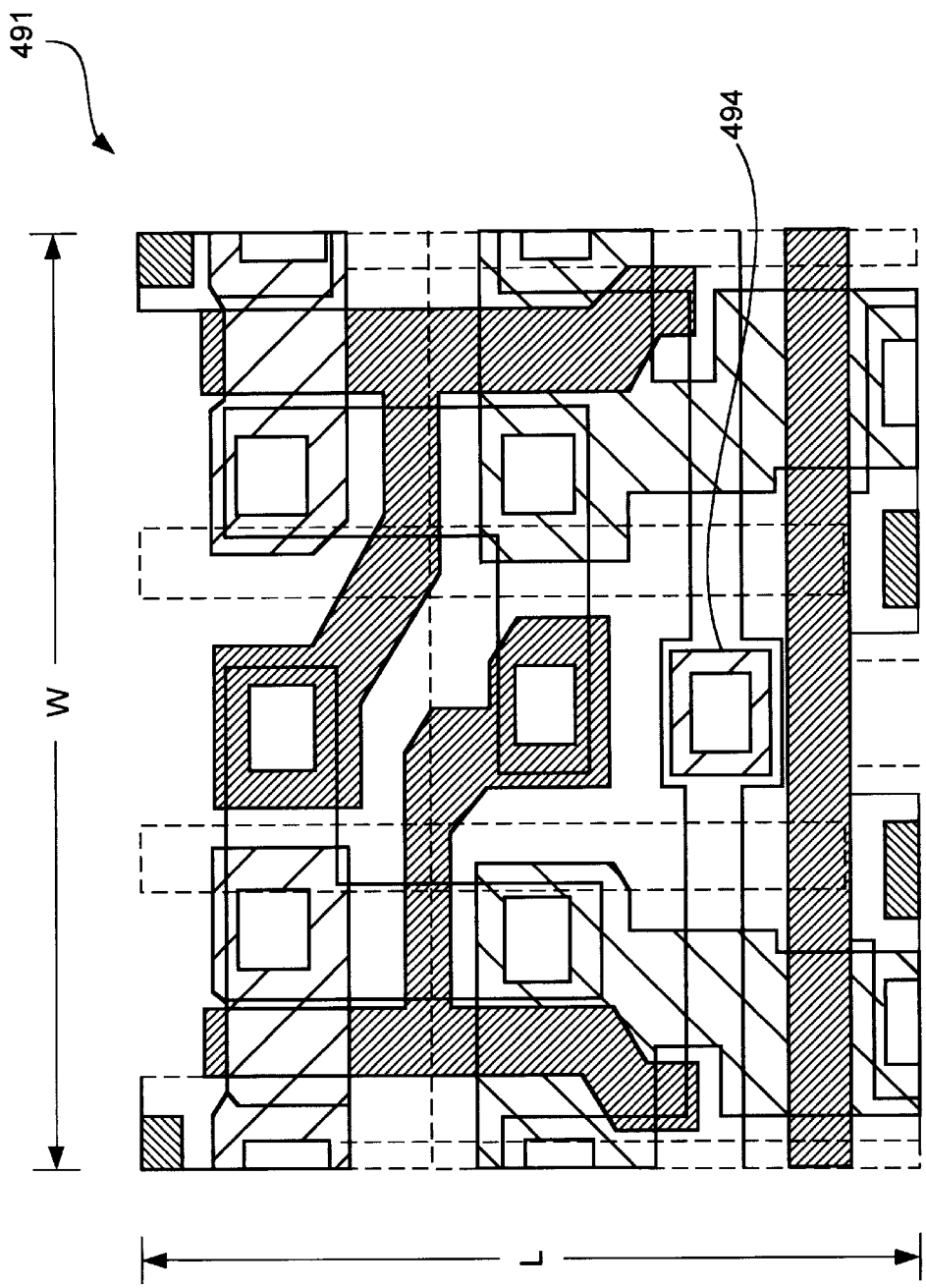
FIG. 14B shows a chip layout for a bulk Si SRAM cell.

A chip layout for a bulk Si SRAM cell 491 is shown in FIG. 14B. This 6-T SRAM cell displays the substrate tie 494, which is required in a bulk Si process. This bulk Si SRAM chip layout has a width W and a length L.

Figure 14C:
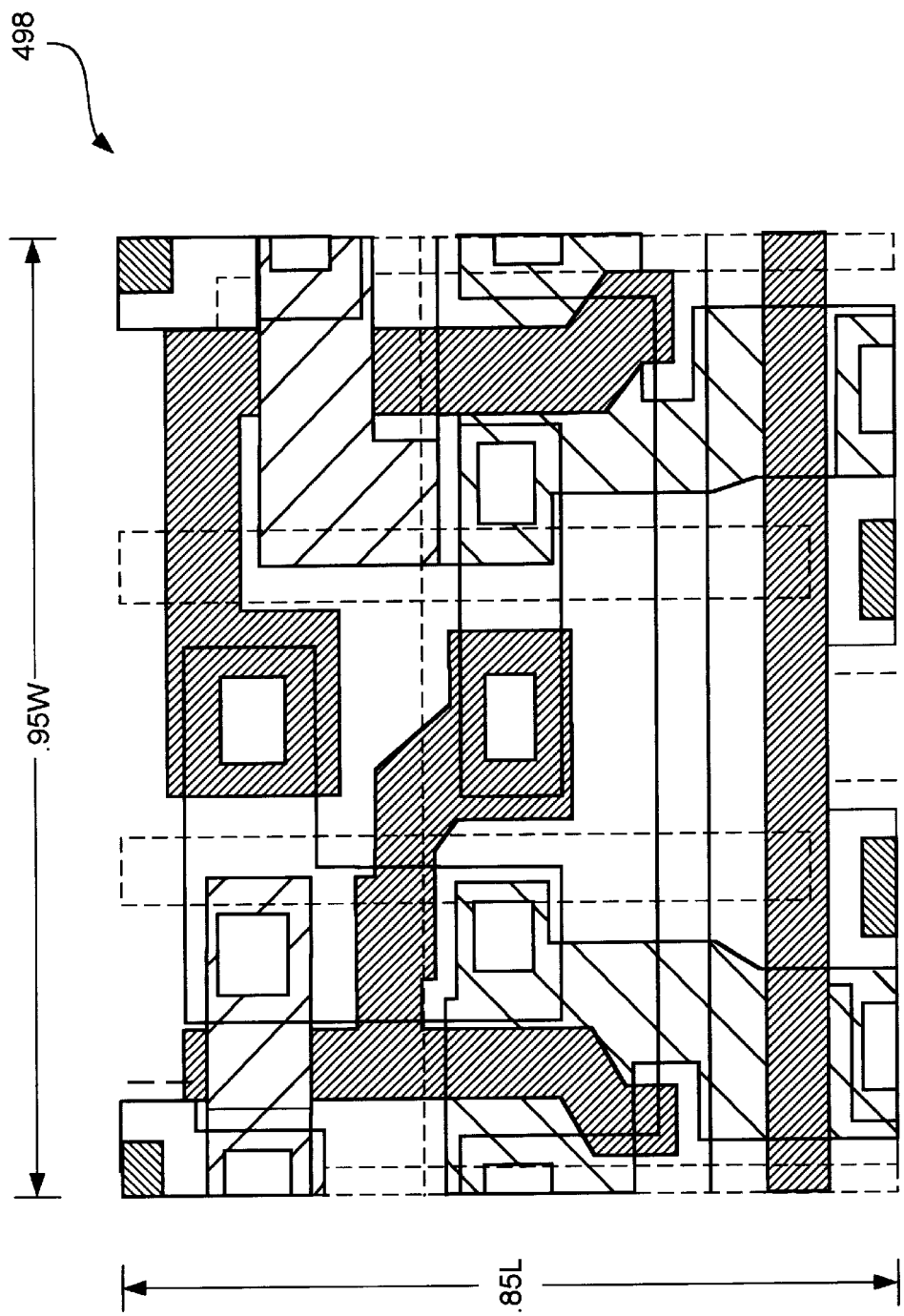
FIG. 14C shows a chip layout for an ultrathin silicon on sapphire of the present invention SRAM cell.

An ultrathin silicon CMOS 6-T SRAM cell 498 chip layout is shown in FIG. 14C. In this figure, no substrate or well ties are necessary to maintain substrate or well potential. The ties are not necessary because of the fully depleted operation in the present invention. The fully depleted operation eliminates the requirement to stabilize N and P diffusions underlying the N and P devices. This ultrathin silicon CMOS 6-T SRAM cell chip layout has a width which is approximately 95% that of the corresponding bulk silicon layout shown in FIG. 14B and a length which is approximately 85% that of the corresponding bulk silicon layout. Thus, the absence of these ties in ultrathin silicon saves significant cell area. Specifically, the ultrathin silicon SRAM cell chip layout 498 (FIG. 14C) has an area which is approximately 20% smaller than the area of the corresponding bulk silicon SRAM cell chip layout 491 (FIG. 14B). This significant difference in layout area is due to no bulk or substrate or well tie and no requirement for added spacing of active devices from a well in the ultrathin silicon SRAM cell chip layout 498. Note that for illustrative purposes, the reduced transistor dimensions afforded by ultrathin silicon are not displayed in FIG. 14C.

Additional power savings in the ultrathin silicon SRAM cell chip layout 498 results from decreasing the widths of the pass transistors as discussed above.

It is also possible to reduce supply voltages in the present invention and maintain the same speed when memory device transconductances are improved and capacitances are reduced using the same gate widths as for bulk silicon cells. The designer is then free to choose whether to take advantage of the improvements in device properties by emphasizing power supply voltage reduction, or cell size reduction, or some combination of both.

Additional information (including circuit designs, design rules, processes, etc.) which may be adapted for making similar or analogous devices or circuits in the ultrathin silicon on sapphire material of the present invention is disclosed in a book authored by Lance A. Glasser entitled "The Design and Analysis of VLSI Circuits", Addison-Wesley Publishing Company, Inc., 1985, ISBN 0-201-12580-3, this entire publication is hereby incorporated herein by reference.

SINGLE CHIP ARCHITECTURE

In accordance with the individual device improvements described above, the present invention also includes the integration of the RF, analog, digital, and memory components of a high-frequency wireless communication system on a single ultrathin silicon on sapphire chip. It is also possible to integrate any combination of the above-described components, such as analog and digital, on a single ultrathin silicon on sapphire chip to achieve new high performance mixed-signal radio frequency system functions.

The present invention incorporates sensitive analog circuitry on the same substrate with large and complex digital subsystems. Practicality of the analog subsystem is achieved by elimination of the substrate voltage bounce under the analog circuitry resulting from high displacement currents in the logic. Practicality of the digital system is achieved by eliminating the source-body effect of an analog negative substrate bias under the digital circuitry.

Power limitations are important both from the standpoint of limited package power dissipation and battery life in small, portable applications. A large amount of power in a digital communication system is consumed by logic and memory subsystems. The present invention integrates very large scale logic and memory circuits while achieving power consumption levels substantially below the bulk Si MOS and conventional SOS processes that do not have the benefit of ultrathin films.

Figure 15A:
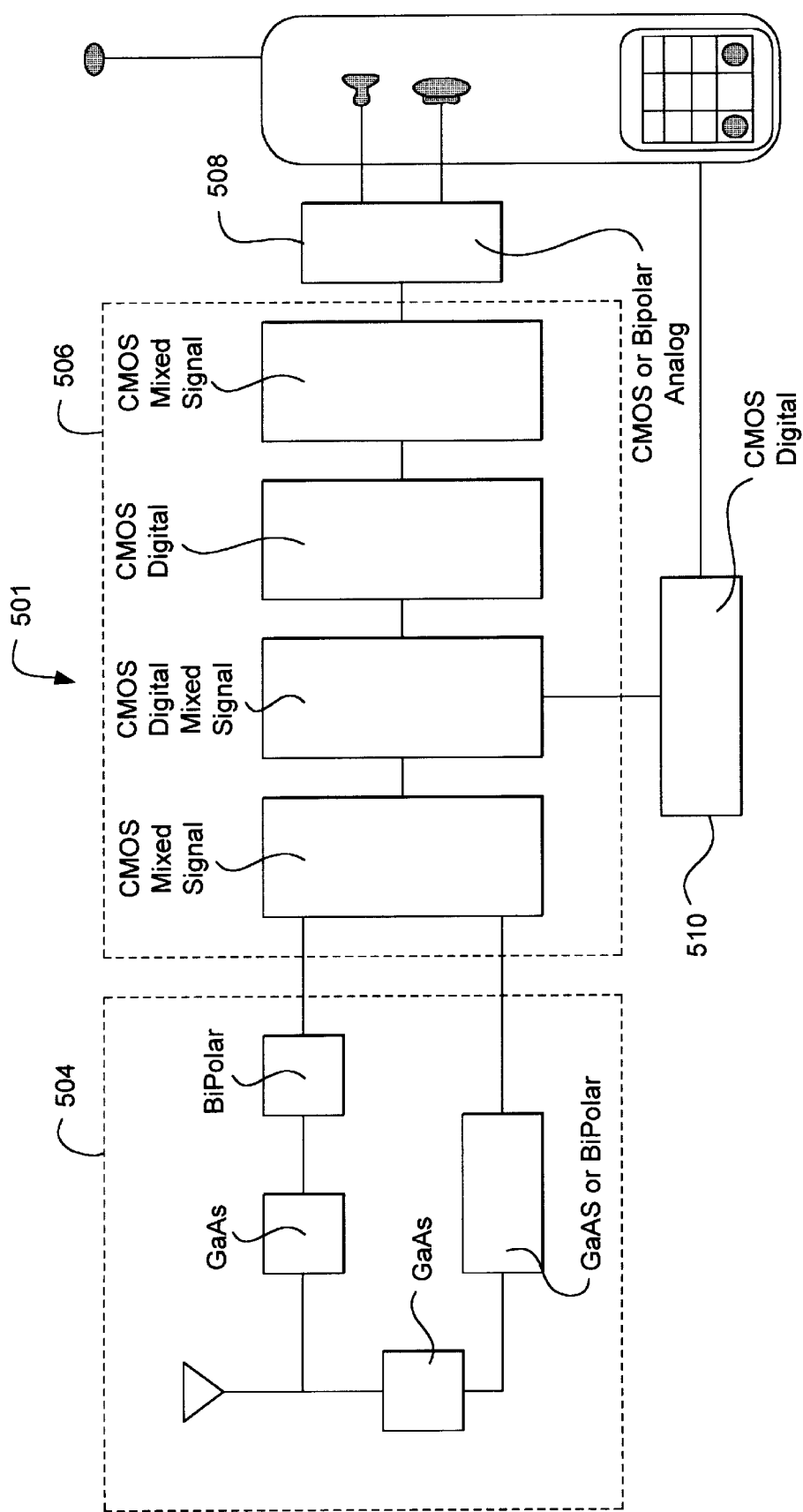
FIG. 15A shows a hand-held cellular telephone using chips fabricated in a variety of technologies. These chips are mounted and interconnected on a printed circuit board or alumina substrate to provide interconnections between subsystems.

FIG. 15A shows a hand-held cellular telephone block diagram generally indicated at 501 using currently available chips and either a printed circuit board or alumina substrate to provide interconnections between subsystems. The different functions require different technologies, making it impossible to combine them cost-effectively onto one chip using any one semiconductor technology. Region 504 comprises the RF chips including technologies such as Bipolar, GaAs, and CMOS. Region 506 comprises the baseband chips constructed with CMOS technology. An audio amplifier 508 is constructed of Bipolar technology and a microprocessor 510 is constructed of CMOS technology.

Figure 15B:
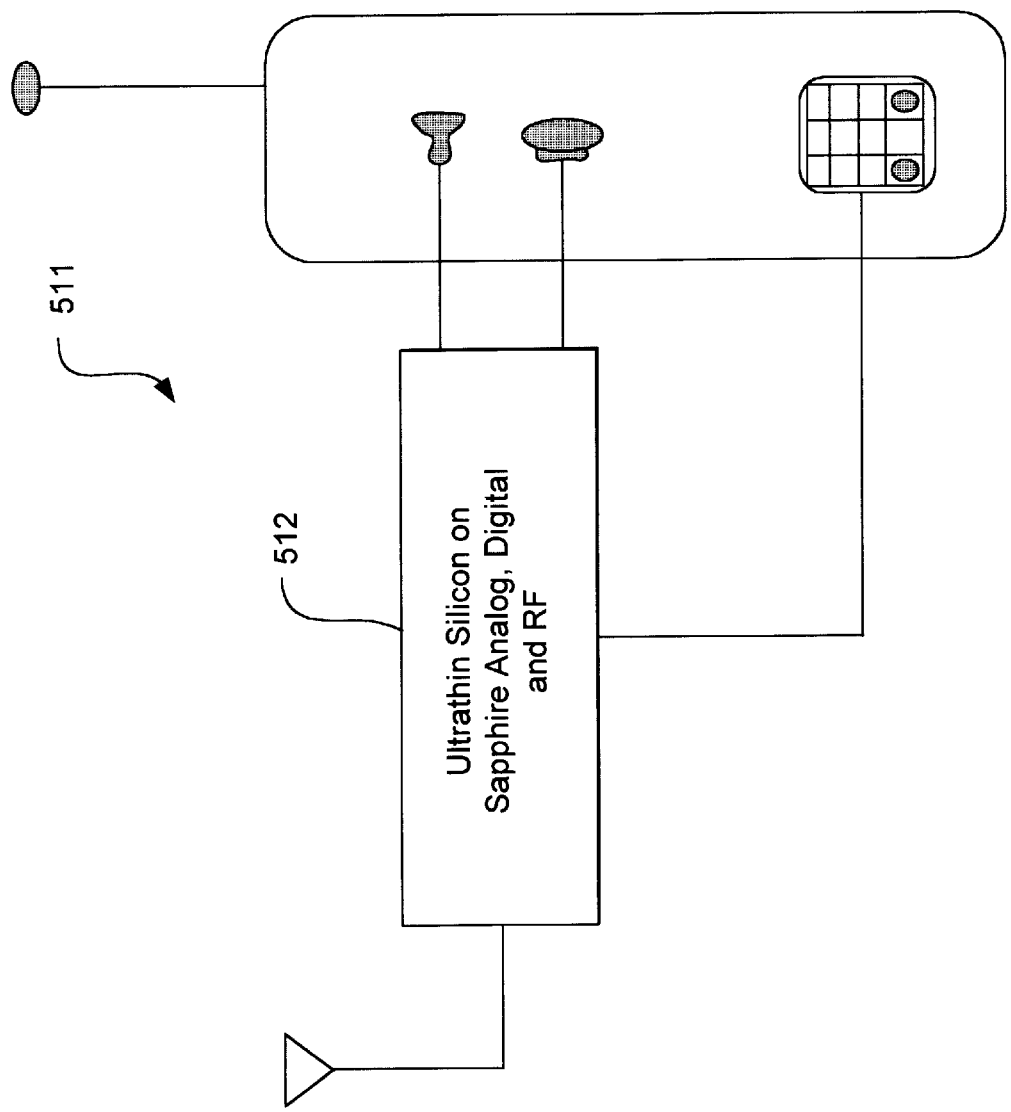
FIG. 15B shows a hand-held wireless communication system which integrates the RF, baseband, audio, and microprocessor components all in one single ultrathin silicon on sapphire chip of the present invention.

A wireless communication system in accordance with the present invention is shown in FIG. 15B. An illustrative example of a hand-held cellular telephone 511 demonstrates the use of a single chip for the same result desired in FIG. 15A, but without multiple chips. Region 512 comprises the RF, baseband, audio, and microprocessor components all in one single ultrathin silicon on sapphire chip of the present invention. The total chip cost is significantly reduced, as is the cost of chip-to-chip wiring and passive components.

In order to integrate high frequency RF active and passive components, analog, digital, and memory components of a power-efficient, wireless communication system in a single chip, an insulating substrate is required for many reasons. These reasons include, but are not limited to, integration of the high frequency passive components, isolation of the precision analog components from the digital noise, low noise characteristics for components both at high and low frequency levels, and reduction of digital and memory system power to a level required in a single-chip system.

Therefore, the current invention exhibits advantages in all major subsystems of a single chip communications system: digital, analog, memory, and RF. In addition, the advantages in each subsystem are achieved in a single integrated process and a single transistor structure. By offering superior performance in all aspects of a single chip communications system in a single integrated process, a variety of low cost, easy to use, portable communications devices can be designed and manufactured cost efficiently.

Additional information (including circuit designs, design rules, processes, etc.) which may be adapted for making similar or analogous devices or circuits in the ultrathin silicon on sapphire material of the present invention is disclosed in a data handbook distributed by Philips Semiconductors entitled "RF/Wireless Communications-1993", North American Philips Corporation, 1992, Publication Number 98-2000-290-04, this entire publication is hereby incorporated herein by reference.

CHIP FABRICATION CONSIDERATIONS

1. Introduction

In general, the processes utilized for fabricating devices in the ultrathin silicon on sapphire material of the present invention are the same as the processes used for conventional bulk silicon. Where differences occur or special considerations are advantageous or necessary, presentation of these factors is presented above in the context of the appropriate section. This section presents additional information which one skilled in the art may find helpful in adapting a specific process to the manufacture of devices in the ultrathin silicon on sapphire material of the present invention.

In one embodiment, the present invention is for a device having a gain-bandwidth product $f_t$ in excess of the 10 GHz required for RF amplifier operation in excess of 700 MHz. The initial film preparation steps leave the silicon film at a thickness of approximately 110 nm prior to the steps that result in the formation of the N and P MOSFETs. Subsequent oxidation and etch steps result in a film thickness under the gate of slightly less than 100 nm. In the present invention, a gate length of 500 nm, made with a film thinner than 100 nm, and preferably closer to 50 nm are achievable. However, the initial film preparation steps, resulting in the 110 nm thickness are representative of an 0.8 μm gate-length process. This gate length is sufficiently short to enable the fabrication of ultrathin silicon on sapphire MOSFETs with an $f_t$ well in excess of the 10 GHz required for RF amplifier operation above 700 MHz.

For a typical ultrathin silicon on sapphire MOSFET device constructed according to the principles of this invention, an 0.8 μm gate length is drawn in the CAD procedures. This results in a polysilicon gate length of 0.75 μm on the wafer after gate photolithography and etch. Subsequent processing forming the lightly doped source and drain regions results in the source and drain metallurgical junctions each extending under the gate by a length of approximately 0.05 μm. The resulting total reduction of 0.1 μm yields a final metallurgical junction length of approximately 0.65 μm. As previously discussed, the process begins with a starting material structure which is an intrinsic silicon film (I.E., contains no dopant atoms) on a sapphire substrate with substantially no electrically active states throughout the structure. Thus, in this example delta N (active state density) is preferably less than approximately $2.0 \times 10^{11}$ cm$^{-2}$, which is typical of most current devices fabricated in accordance with the invention.

The following detailed description of the process is intended to supplement information originally presented above. It is also intended to supplement standard bulk CMOS processing recipes. It is understood by those skilled in the art that each silicon fabrication facility has its own preferred process recipes that have been well tried and tested in its own bulk CMOS processes. Therefore, it is not necessary to explain each process recipe utilized in processing devices in the ultrathin silicon on sapphire of the present invention in order to enable one skilled in the art of bulk silicon CMOS processing to practice the present invention. Additionally, it is generally recognized that fabrication facilities vary widely in their practice of well understood steps such as the application of the metallization and pad layers. These steps constitute what is commonly known as the back-end of the process.

In other well known steps, such as gate oxide growth, it is not necessary to explain each cleaning or clean-up oxide step, but rather it is helpful to explain the final oxide target thickness. This type of information is provided for a 0.8 µm ultrathin silicon on sapphire process typical of the present invention.

2. Epitaxial Silicon Film Preparation

A typical starting material comprises a 270 nm thick epitaxial layer of silicon on a sapphire substrate. The silicon implant dose is approximately $6\times10^{14}$ with an energy of 185 keV. The solid phase epitaxial regrowth is at approximately 550° C. in nitrogen for approximately 30 minutes.

During implantation, a uniform temperature of approximately 0° C. is maintained throughout the film. This may be accomplished with backside cooling with hydrogen or helium. Both gasses are adequate when cooling is performed at millitorr pressures and the choice of gases is based on manufacturing plant ("fab") preference.

The anneal furnace is ramped to approximately 900° C. to begin the second anneal. A ramp time of 30 minutes in a nitrogen environment has been used successfully, but other times may also be appropriate and the second anneal is for approximately 30 minutes. The furnace is then ramped up to 1000° C. to perform the thinning oxidation. Since 950° C. is exceeded during the second ramp, it is necessary to turn on dry $O_2$ at 900° C. while the furnace is ramping and turning off the nitrogen.

When the temperature ramp reaches 1000° C., it is stabilized and the remainder of the oxidation is carried out in steam at 1000° C., until an oxide thickness of 360 nm is reached. Prior to ramp down, dry $O_2$ is turned on and left on during the ramp down.

After all the oxide is etched away, the remaining thickness is approximately 110 nanometers. At this film thickness, the substrate will be fully depleted at the onset of threshold conduction in both P and N-channel MOS devices.

3. Silicon Nitride Patterning

Devices may be fabricated with several types of well understood isolation methods. The following description is typical of the LOCOS (Local Oxidation of Silicon) process. It results in a thick isolation oxide, or field oxide, formed between devices.

One hundred angstroms of stress relief oxide is applied by a CVD step followed by deposition of 1000 Å of silicon nitride. The silicon nitride is patterned by photoresist and lithography steps well understood in the art. After patterning, the photoresist is left over the silicon nitride and subjected to an additional hard bake.

4. N-Channel MOSFET Edge Control

It is well understood that a leakage control implant is required at the edge of an N-Channel device prior to field oxide formation. The Boron increases the threshold of the devices at the edge of the N-channels and must be blocked from the region near the edge of the P-channel MOSFETs by an additional photolithography step that results in photoresist being applied well beyond the edge of the P-MOS devices.

The Boron implant is typically $5\times10^{14}$ of $BF_2$ between 40 and 70 keV.

5. Field Oxidation

The LOCOS field oxidation step is next. It is a preferably a wet oxidation step performed at a temperature less than 950° C. In the ultrathin silicon on sapphire process, the epitaxial silicon thickness of 110 nm limits the field oxide thickness to approximately 240 nm. This is a result of the oxidation proceeding to the silicon/substrate interface as a limit. The final oxide thickness is therefore far more independent of oxidation conditions and time than in a bulk CMOS process.

After the field oxidation, the Silicon Nitride and stress relief oxide are etched away.

6. Channel Implants

Implants are added in the channel region of the MOSFET devices to attain the proper thresholds. The process includes N and P channel digital devices with thresholds of approximately +0.65 V and −0.65 V, respectively. The first device is designated regular N or "RN" and the second device is designated as regular P or "RP."

Knowing that the gate polysilicon material will be heavily doped N-type material, the gate oxide thickness will be approximately 180 Angstroms, and that the epitaxial silicon layer under the gate is close to intrinsic, it is not difficult to determine the correct implant dose and energy.

For the RP device with the above described gate material, oxide thickness, and near-intrinsic silicon film, the implant is typically Boron at a dose of $1.3\times10^{12}$ cm$^{-2}$ and an energy of 10 keV.

For the RN device with the above described gate material, oxide thickness, and near-intrinsic silicon film, the implant is typically Boron at a dose of $2.5\times10^{12}$ cm$^{-2}$ and an energy of 10 keV.

Two additional devices are useful. They both require no additional implants. The first is an intrinsic P or "IP" device that has a final threshold of −1.0 V with no additional implant. The second is an intrinsic N or "IN" device with a threshold of nearly 0 V.

The IP device is useful in analog and memory circuits because the absence of hole scattering from any additional threshold-shifting Boron implant results in slightly higher hole mobility in the channel. This coupled with the beneficial effect of hole mobility enhancement from the compressive stress of the sapphire substrate results in an IP device hole mobility in excess of 10 percent higher than a bulk silicon PMOS device.

The IN device is useful in analog circuits as a source-follower device because of the low threshold. Electron mobility is reduced by the same substrate compressive stress effects that enhance hole mobility. The absence of an implant slightly improves mobility.

7. Gate Oxide Growth

A gate oxide is grown to a thickness of 180 Angstroms in a dry oxidizing ambient temperature of preferably 900° C. Pre-growth cleaning steps are well understood and not repeated here. The growth of the gate oxide reduces the final silicon film thickness to approximately 100 nm. It is understood that if a clean-up oxide is used, the depth of oxidation into the epitaxial silicon layer will additionally reduce the final film thickness.

8. Polysilicon Deposition and Photolithography

Polysilicon is deposited to a thickness of 2700 to 3000 Å. Although a target thickness is indicated, it is not critical. Doping and patterning follow well understood processing practices. The final gate length after patterning will be approximately 0.75 $\mu$M.

9. Lightly Doped Drain (LDD) Construction

Lightly doped drain construction methods are typical of conventional bulk CMOS recipes. The LDD implant for the PMOS devices is well understood to be BF2. Activation of a Phosphorous implant NMOS implant is typically at 900° C. for 20 minutes to maintain the temperature for this step below the 950° C. limit. An Arsenic LDD implant may also be used with a longer activation time.

The sidewall construction also follows standard practice, with typical lateral spacer conditions being dry $O_2$ at 825 to 850° C. A low temperature, low pressure oxide deposition and anisotropic etch follows to remove all oxide from the polysilicon gate and source/drain regions. A final cap oxide of approximately 100 Angstrom thickness is grown over source/drain regions to prevent contamination.

At this point in the process, the channel silicon epitaxial film thicknesses are typically between 950 and 1000 Å thick with source/drain film thickness being between 800 to 900 Å thick.

10. Source/Drain Implant

The preferred method of doping for the source and drain regions described previously was diffusion. In some situations, the preferred method for source/drain doping is by ion implantation.

The source/drain implants in the ultrathin silicon on sapphire of the present invention technology do not have to be driven well below the contact depth as in a bulk CMOS process. Because the bottom of the source/drain regions is terminated by an insulator, there is no contact spiking problem and the source/drain region thickness is typically 800 to 900 Å. This is about a factor of two thinner than for a comparable 0.8 $\mu$m bulk CMOS process.

Because of the thinness of the epitaxial silicon layer in the source/drain region, the optimum implant schedules are slightly different from what is considered optimum in a bulk CMOS process. First, the N+ source/drain regions are implanted with Arsenic at a dose of $2 \times 10^{15}$ cm$^{-2}$ at an implant energy of 55 keV. The P+ source/drain implant is BF$_2$ at a dose of $2 \times 10^{15}$ cm$^{-2}$ at an implant energy of 50 keV. Following the implants, and activation anneal is performed for 10 minutes at 900° C.

11. Salicide Steps

The key to a titanium salicide step is to deposit enough titanium to obtain acceptable resistances but not so much that titanium-rich low conductivity source/drains will result. The salicide represents an improvement over using dopant diffusions to achieve acceptable source/drain resistances.

Prior to the application of the titanium, it may be beneficial to apply a salicide block step. This will block the salicide with a deposited 1000 Å layer of nitride on top of a 100 to 300 Å layer of deposited oxide in regions that are to be blocked from the salicide. The nitride need not be removed from these regions to enable subsequent processing.

Following experimentation with source/drain regions of from 800 Å to 900 Å thickness, typical of the above process steps, it has been determined that the optimum thickness for the titanium deposition is approximately 400 Å.

Following the titanium deposition, a two step anneal is performed. The first step is at a temperature of approximately 700° C. Too high a temperature reduces the sidewall SiO$_2$ thereby causing silicide to form and short the gate to drain or source. The wafers are removed and a chemical etch is performed to remove the titanium nitride over the SiO$_2$. The temperature may now be increased to 900° C. for the final anneal of the source/drain regions.

12. Process Back End

The process back-end steps result in the formation of the additional insulator and metal layers required to interconnect the devices and form a final passivation layer. These steps are the same as would be required for a bulk silicon process without the usual severely constrained time and temperature restrictions that are applied to prevent the metal contacts to the source/drain regions from "spiking" or penetrating through to form a short circuit with the bulk substrate material. There is no conductive bulk substrate material in this process, only an insulating sapphire substrate.

SHORTENED P-CHANNEL LENGTH CMOS CIRCUITRY ON ULTRATHIN SOI

Referring to the illustrative drawings of FIG. 3C, there is shown a cross-sectional view of adjacent p-channel and n-channel MOSFETS which can be interconnected in a CMOS circuit. A substrate 12 is formed from an insulating material. In the preferred embodiment, the insulating material is sapphire. A p-channel MOSFET 67 and an n-channel MOSFET 69 are formed on the substrate 12. The p-channel transistor includes a source 42S, drain 42D and channel 44. It also includes a lightly doped source region 42LS and a lightly doped drain region 42LD. Similarly, the n-channel transistor includes a source 52S, drain 52D and channel 54 as well as a lightly doped source region 52LS and a lightly doped drain region 52LD.

A silicon dioxide isolation region 34 separates the p-channel transistor 67 and the n-channel transistor 69. The p-channel transistor 67 includes a n+doped conductor gate 48 formed over the channel 44. The gate 48 is separated from the channel by a gate insulator 40. Likewise, the n-channel transistor 69 includes an n+doped conductor gate formed adjacent to its channel 54. The gate 58 is separated from the channel 54 by a gate insulator 40. Sidewall spacers 60 are used during fabrication to produce the lightly doped source/drain regions. It will be appreciated, of course, that other gate conductor dopings may be within the scope of the invention.

Metal layers 64 are used to interconnect the p-channel transistor 67 and the n-channel transistor 69 with other components (not shown) and/or with each other. The metal layers 64 are separated from each other by an insulating layer 62. Metallic regions 48M and 58M are respectively formed on the p-channel transistor gate 48 and the n-channel transistor gate 58 to facilitate contact with the metal layers 64. The p-channel transistor also includes metallic regions 42M formed in its source and drain to facilitate electrical contact with the metallic layers 64. Similarly, the n-channel transistor, includes metallic regions 52M formed in its source and drain to facilitate electrical contact with the metal layers 64.

The benefits and advantages of the present invention will be better appreciated from the simplified drawing of FIG. 4C which shows a cross-sectional view of a single MOSFET like the n-channel and/or p-channel transistors 67, 69 of FIG. 3C. The drawing of FIG. 4C is simplified to remove many details, shown in FIG. 3C, which are not central to the invention. The MOSFET 271 of FIG. 4C can be doped as either an n-channel transistor or a p-channel transistor.

The MOSFET 271 includes an insulative substrate 290. Source 274, drain 272 and channel 276 regions are fabricated in an ultrathin semiconductor layer 273 formed on the insulative substrate 290. In the preferred embodiment, the semiconductor layer is intrinsic prior to transistor construction and doping silicon, and the insulating layer is sapphire. The source includes a lightly doped source region 274L. The drain includes a lightly doped drain region 272L. The MOSFET includes a gate 278 bounded by sidewall spacers 280 which are used in the fabrication of the lightly doped source and drain regions 274L, 272L. An insulative oxide layer 286 separates the gate 278 from the channel 276. Respective conductive source and drain contacts 282, 284 are formed in the source and drain regions 274, 272. For simplification, metallization and insulation layers are omitted from the drawing.

The gate length L corresponds to the gate length L in FIG. 11. The silicon layer 273 in which the MOSFET is formed is thin compared to the separation between the MOSFETs' source and drain. This separation distance is the channel length L. In the preferred embodiment, the intrinsic silicon layer thickness is such that the transistor channel 276 is fully depleted and transistor source and drain diffusions extend fully from the silicon surface to the insulating substrate 290. Fully depleted as used herein means that, in operation, a depletion region forms under the gate 278. In the present embodiment, the depletion region extends substantially through the silicon film 273 and reaches the silicon-sapphire interface before the conduction channel inverts. This is referred to herein as a fully depleted transistor.

In a present embodiment the silicon layer 273 thickness is approximately 1000 Angstroms. This ultrathin semiconductor on insulator MOSFET lacks a deep channel lateral electric field of the type that could cause punch-through breakdown in conventional MOSFETs formed in bulk silicon, like that shown in FIG. 18. The MOSFET 271 of FIG. 4C inhibits punch-through breakdown by providing only a shallow (not deep) transistor channel, control of which is maintained by the transistor gate 278. Moreover, since the thin source and drain of the fully depleted transistor extend fully from the silicon surface to the silicon-sapphire interface, there can be no spreading of the source and drain as there is deep in the bulk silicon substrate of conventional bulk silicon transistors.

Figure 18:
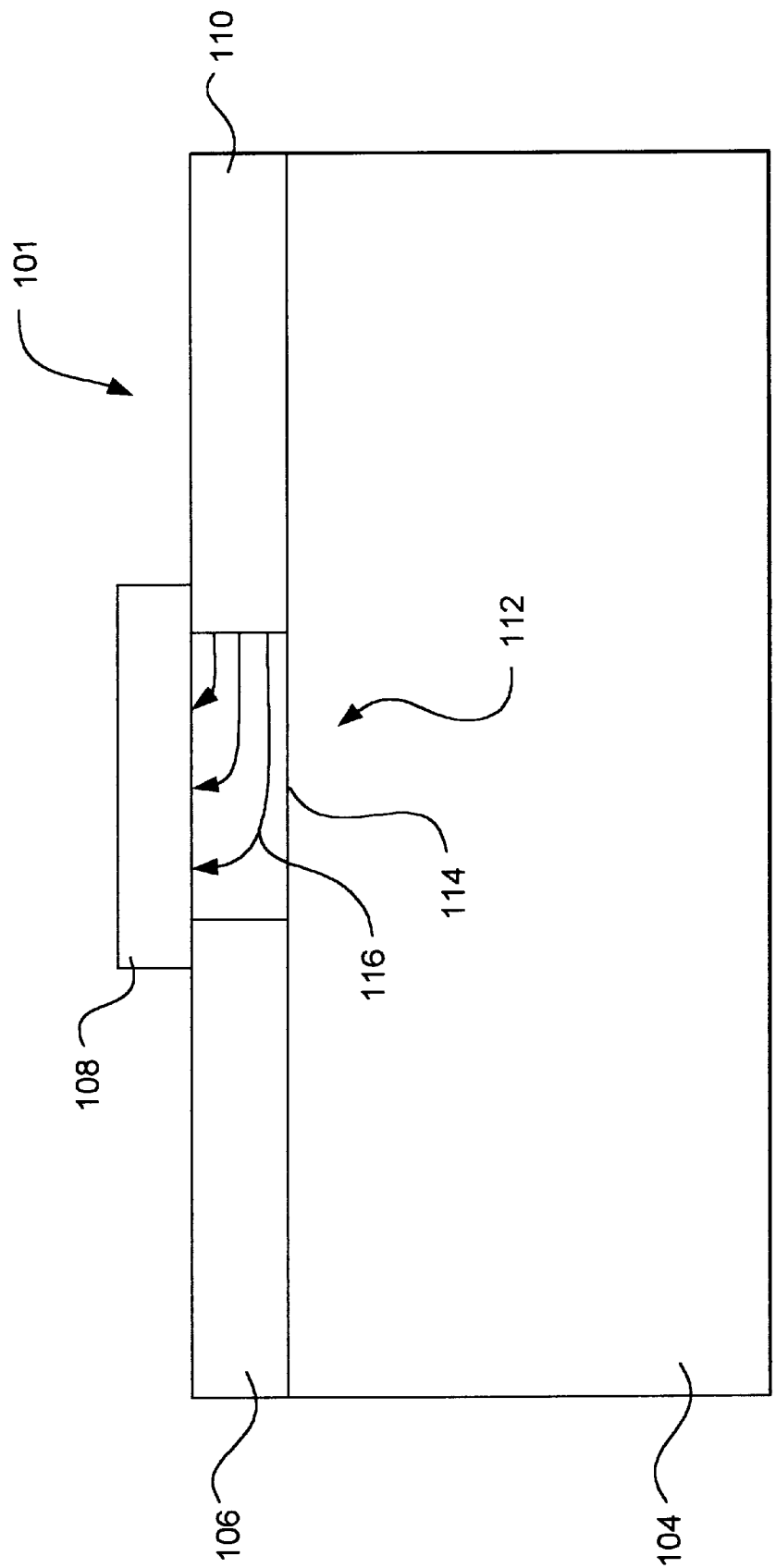
FIG. 18 is a simplified cross-sectional view of a MOSFET fabricated on an ultrathin semiconductor layer formed on an insulating substrate in which lateral electrical field contours are shown to indicate significantly lower punch-breakdown characteristics in accordance with a present embodiment of the invention.

Referring to the illustrative drawings of FIG. 18, there is shown an even more simplified cross-sectional view of a MOSFET 101 of a present embodiment of the invention. The source 106, drain 110 and channel 112 regions are formed in an ultrathin semiconductor layer 114 formed on an insulative substrate 104. A gate 108 controls the electric field in the channel 112. Since the source and drain regions 106, 110 extend substantially all of the way through the ultrathin semiconductor layer to the insulating substrate 104 and since the channel is fully depleted, the electric field imposed through the gate 108 can control conduction between the source and drain regions and can essentially prevent punch-through breakdown. The lateral electric field contours 116 emanate from the drain but terminate in the gate. That is, since the semiconductor layer is thin, the gate can impose adequate control over the lateral electric field such that no punch-through breakdown occurs. In other words, there is no region of the MOSFET in the "off" state in which the lateral electric field contours at 116 can extend completely between the source and drain thereby producing the punch-through transistor breakdown.

This beneficial effect is true for both p-channel transistors and n-channel transistors. However, this does not necessarily preclude impact ionization breakdown in n-channel transistors. As a result, p-channel transistors can be manufactured with narrower channel lengths L without increased risk of punch-through breakdown. The same is not necessarily true for n-channel transistors; the minimum n-channel transistor length generally must be sufficient to prevent impact ionization breakdown.

Figure 16:
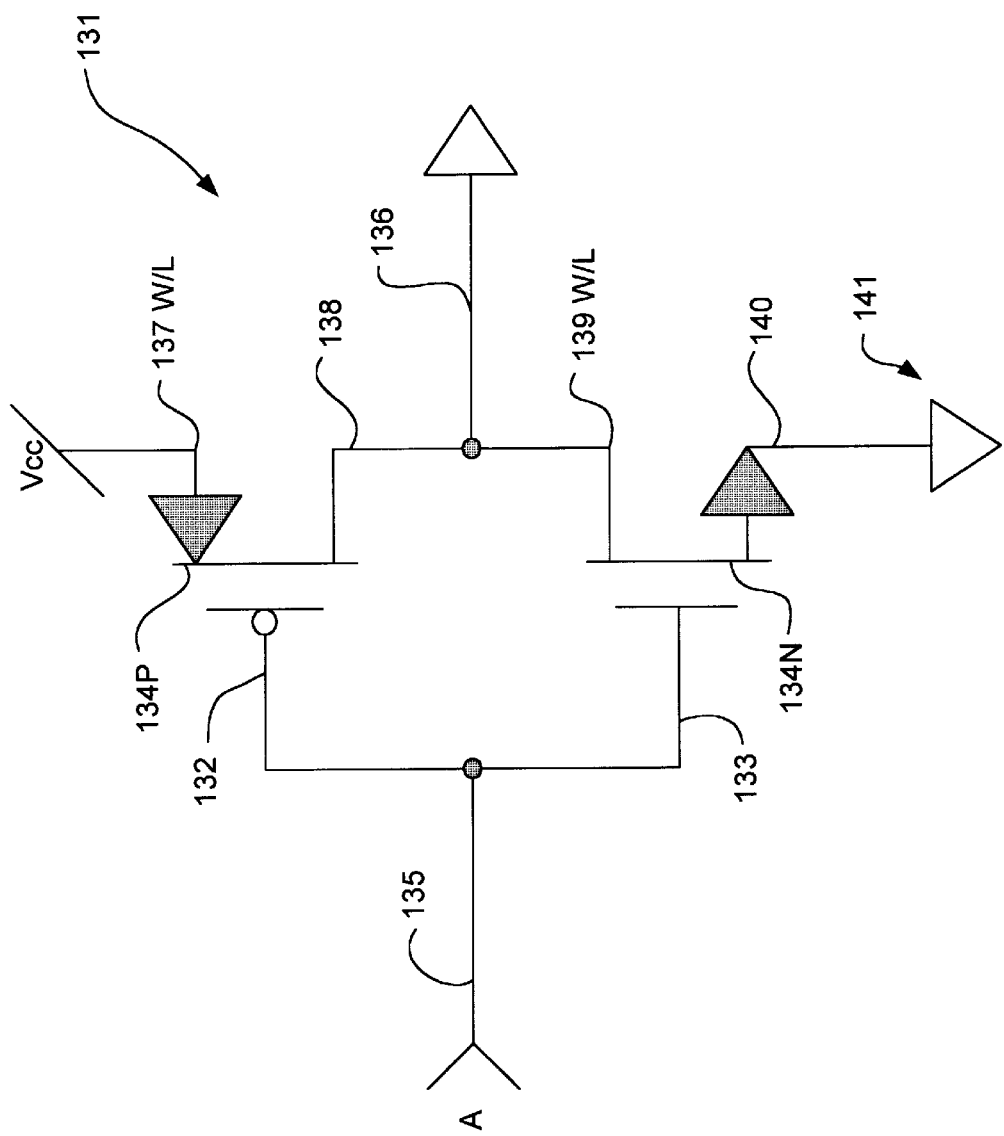
FIG. 16 is a transistor level diagram of a conventional CMOS inverter circuit.
Figure 17:
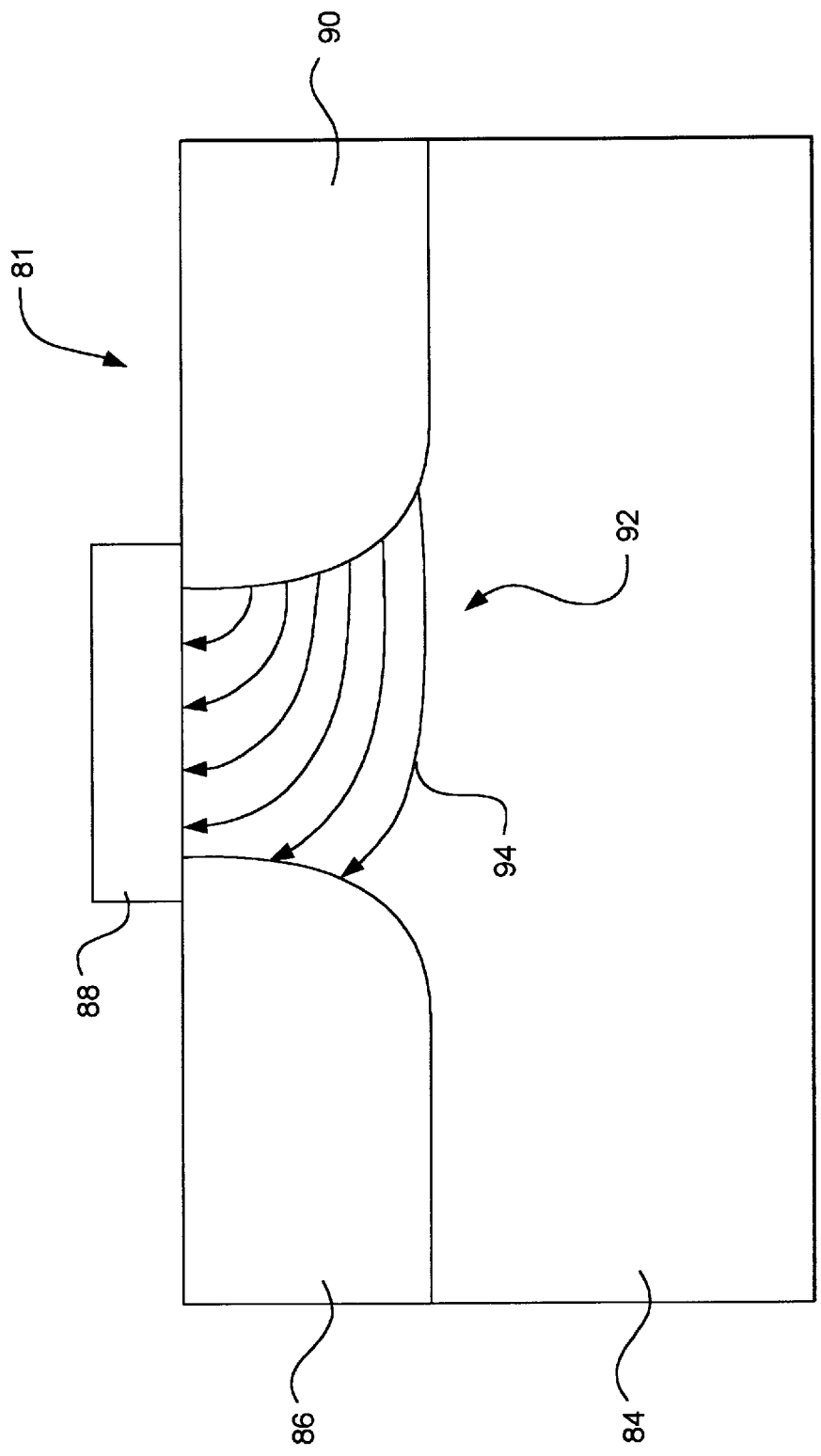
FIG. 17 is a generalized cross-sectional view of a conventional MOSFET fabricated in bulk silicon demonstrating the electric field contours that are characteristic of punch-through breakdown.
Figure 19:
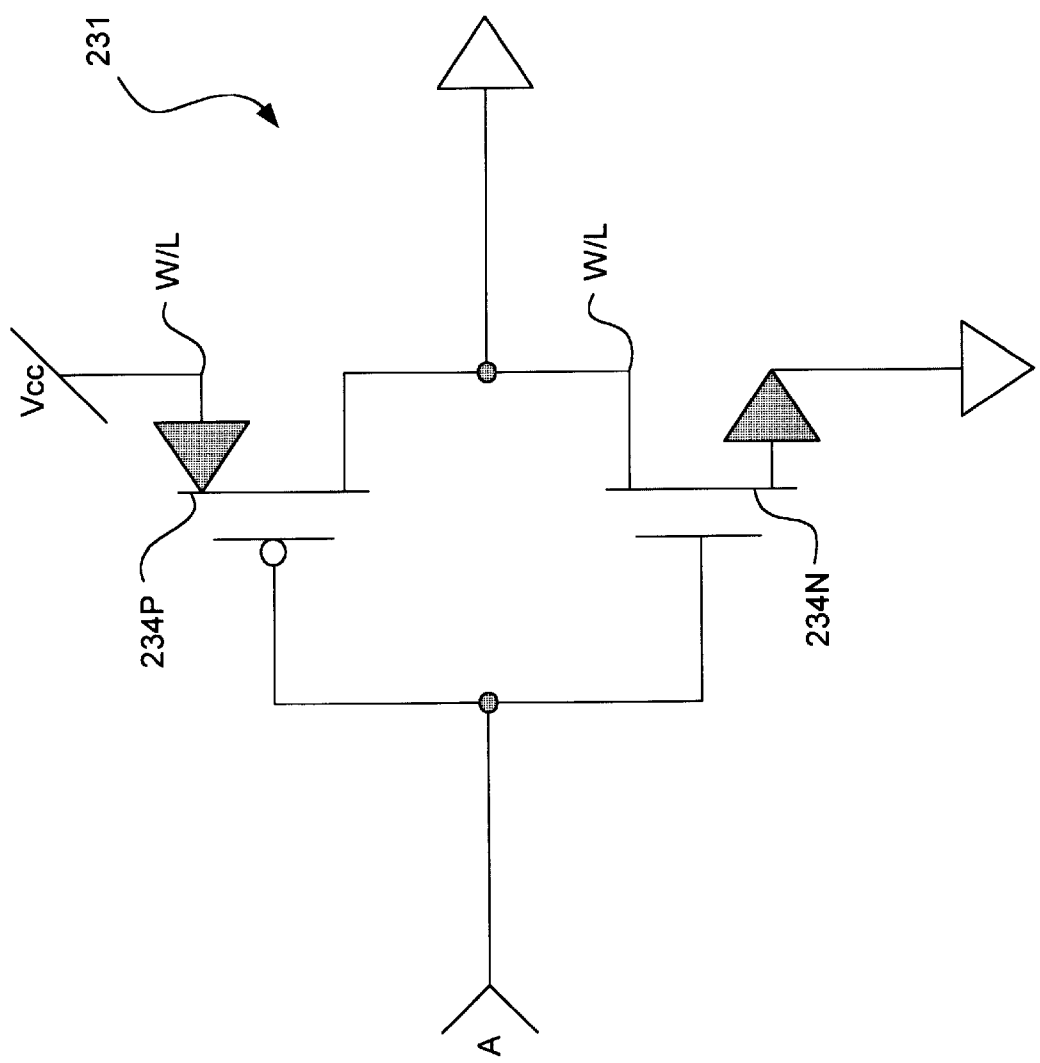
FIG. 19 is a transistor level diagram of an inverter circuit comprising MOSFETs fabricated on an ultrathin semiconductor layer formed on an insulating substrate in accordance with a present embodiment of the invention.

Referring to the illustrative drawing of FIG. 19, there is shown a transistor level diagram of a CMOS inverter circuit 231 constructed in accordance with a present embodiment of the present invention. The connections between the p-channel transistor 234P and the n-channel transistor 234N are essentially the same as those for the conventional inverter 131 of FIG. 16. However, unlike the inverter 131 of FIG. 16, the transistors 234P and 234N of the inverter 231 of FIG. 19 are of the general type described with reference to FIGS. 3C and 4C. They are constructed with a relative transistor gate sizing that produces balanced "pull-up" (p-channel transistor) and "pull-down" (n-channel transistor) performance. That means that the p-channel and n-channel transistor rise/fall times are substantially equal. This means substantially equal current drive strength in the p-channel and n-channel transistor.

In a presently preferred embodiment of the invention, the W/L gate dimensions of the p-channel transistor 234P are 10/0.5 micrometers. The W/L gate dimensions of the n-channel transistor 234N are 8/0.8 silicon ($\mu_n$), e.g., $\mu_n$=2 ($\mu_p$). Although, in activity $\mu_n$ and $\mu_p$ are more similar in ultrathin silicon than in bulk Si allowing even more favorable transistor sizing than demonstrated in the following discussion. Transistor drive is assumed to be proportional to transistor channel width divided by transistor channel length multiplied by the charge carrier effective mobility. Hence, balanced transistor drive is assumed to follow when the following condition holds, $$W_p/L_p(\mu_p) = W_n/L_n(\mu_n).$$

where, $W_p$=p-channel width; $L_p$=p-channel length; $W_n$=n-channel width; and $L_n$=n-channel length. Thus, in a current embodiment, balanced drive for $\mu_p$=2 $\mu_n$ requires, $$W_P/W_N = 2(L_P/L_N).$$

Figure 20:
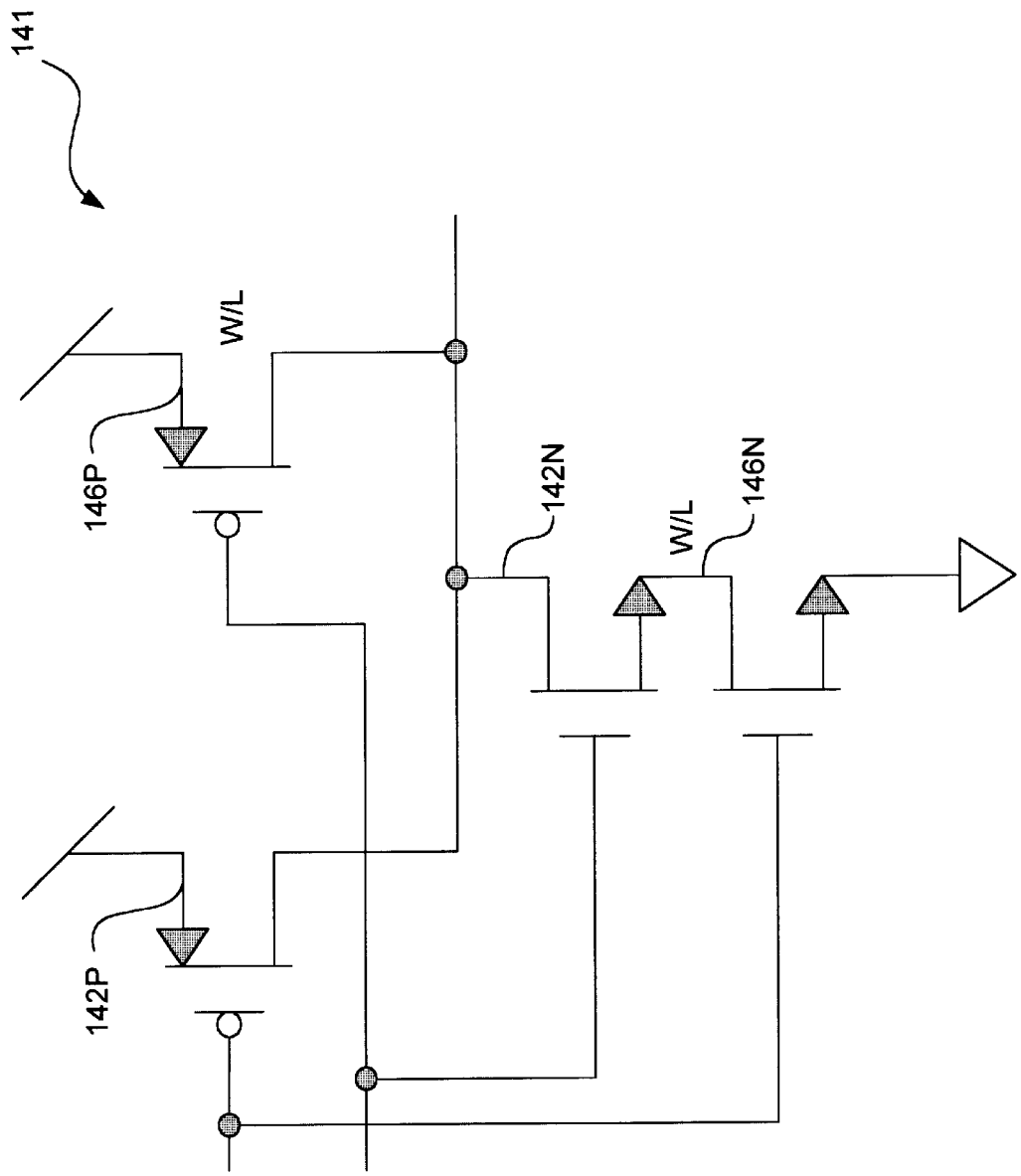
FIG. 20 is a transistor level diagram of a NAND gate comprising MOSFETs fabricated on an ultrathin semiconductor layer formed on an insulating substrate in accordance with a present embodiment of the invention.

Referring to the illustrative drawings of FIG. 20, there is shown a transistor level diagram of a two input NAND gate 141 constructed in accordance with a present embodiment of the invention. The NAND gate includes p-channel pull-up transistors 142P, 146P and n-channel pull-down 142N and 146N. Each of the transistors is fabricated on ultrathin semiconductor on insulator as described in FIGS. 3C and 4C. The interconnection of the various transistors and their operation is conventional and well understood by those skilled in the art and need not be described herein.

In a present preferred embodiment of the NAND circuit 141, the pull-up and the pull-down performance of the respective p-channel transistors and n-channel transistors is balanced. The W/L dimensions of the p-channel transistors are 10/0.5 micrometers. The W/L dimensions of micrometers. The ratio of the channel lengths of the devices 234P and 234N is 0.625:1. The p-channel gate length is shorter than the n-channel gate width. It will be appreciated, of course, that inverters with different gate dimensions and gate length ratios can be constructed consistent with the invention.

For balanced transistor performance, assuming a p-channel transistor to n-channel transistor effective mobility ratio of approximately 1:2 and a minimum channel length ratio of 0.625:1, the channel width of the p-channel transistor 234P is 1.25 times the width of the n-channel transistor 234N. The overall gate area of an inverter fabricated on ultrathin semiconductor on insulator in which the gate channel lengths and widths are scaled to take full advantage of the reduced punch-through breakdown risk, is substantially less than that the overall area of a similar inverter in bulk silicon. In addition, the overall input capacitance is reduced since input capacitance and gate area generally are proportional. A significant reduction in the area required to implement the inverter 231 and in the input capacitance can result in overall increased circuit speed as well as reduced power consumption and circuit cost. Since input capacitance decreases for CMOS circuits built in accordance with the present invention, the drive required from the preceding stage can be lowered by reducing both p-channel and n-channel widths without sacrificing performance.

The above transistor dimensions are not critical to the invention. The present limit on p-channel length of 0.5 micrometers is imposed by limitations in photolithographic equipment available to the inventors. Negative charge carrier effective mobility, $(\mu_p)$ is assumed to be twice the positive charge carrier effective mobility for both bulk Si and ultrathin the n-channel transistors are 16/0.8 micrometers. In this embodiment, the p-channel length is 0.625 times the n-channel length. For balanced transistor performance with a p-channel to n-channel effective mobility of 1:2 and a minimum channel length ratio of 0.625:1, p-channel width should be 0.625 times n-channel width. The result is a reduction in input capacitance relative to that of bulk silicon MOSFETs having similar current drive. This leads to improved circuit speed and reduced power consumption and implementation cost.

The above transistor dimensions are not critical to the invention. For a two input NAND gate of the general type described in FIG. 20, balanced p-channel and n-channel performance ordinarily follows where the following condition holds.

$$W_p/L_p(\mu_p) = W_n/2L_n(\mu_n).$$

Hence, $W_p/W_n = L_p/L_n$ for $\mu_n = 2\mu_p$. The reason that the value $2L_n$ is used above is because the particular implementation of the NAND gate 141 uses stacked n-channel transistors 142N, 146N.

Figure 21:
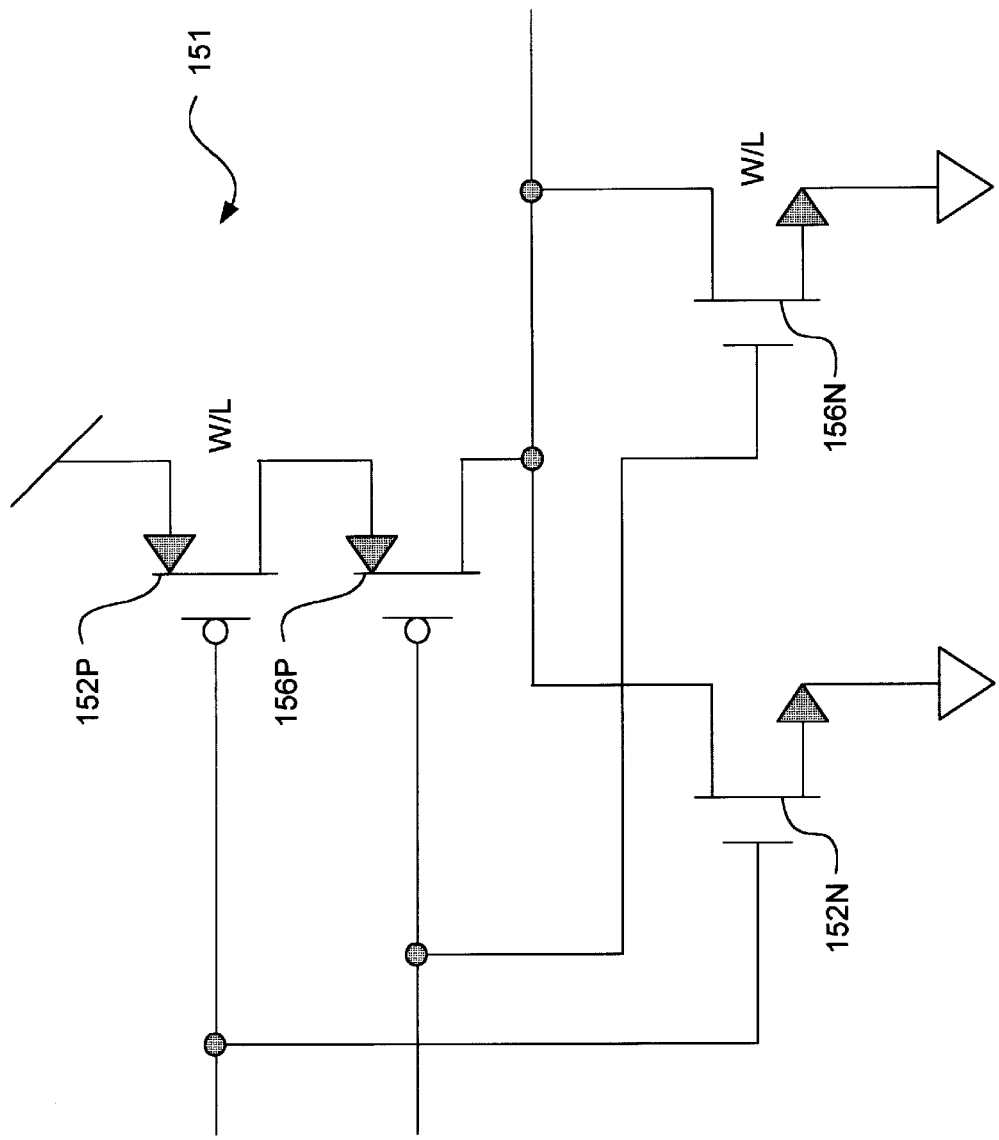
FIG. 21 is a transistor level diagram of a NOR gate comprising transistors fabricated on an ultrathin semiconductor layer formed on an insulating substrate in accordance with a present embodiment of the invention.

Referring to the illustrative drawings of FIG. 21, there is shown a transistor level circuit diagram of a two input NOR gate 151 in accordance with a present embodiment of the invention. Each of the p-channel pull-up transistors 152P and 156P and each of the n-channel pull-down transistors 152N and 156N comprises a respective MOSFET fabricated on ultrathin semiconductor on insulator as described in FIGS. 3C and 4C. The transistor interconnections and operation of the NOR gate of FIG. 21 are conventional and well understood skilled in the art and need not be described herein.

The NOR gate 151 achieves balanced pull-up by p-channel transistors 152P, 156P and pull-down by n-channel transistors 152N, 156N. The W/L dimensions of the p-channel transistor are 20/0.5 micrometers. The W/L dimensions of the n-channel transistor are 8/0.5 micrometers. Once again, in the present embodiment, the p-channel length is 0.625 times the n-channel length. For balanced transistor performance with a p-channel to n-channel effective mobility of 1:2 and a minimum channel length ratio of 0.625:1, p-channel transistors 152P and 156P channel width is 2.5 times n-channel transistor 152N and 156N channel width. The overall gate area for the NOR gate in ultrathin silicon on insulator is less than it would be for similar MOSFETs formed in bulk silicon.

The above dimensions are not critical to the invention. For a NOR gate of the general type described in FIG. 21, balanced p-channel and n-channel performance generally follows when the following condition holds.

$$W_p/2L_p(\mu_p) = W_n/L_n(\mu_n).$$

Hence, $W_p/W_n = 4(L_p/L_n)$ for $\mu_n = 2\mu_p$. The value $2L_p$ is used above because the particular implementation of the NOR gate 151 uses stacked p-channel transistors 152P, 156P.

In the logic elements presented above, (Inverter, NAND, NOR) the gate drive has been assumed to be constant. Much of the speed balancing of n-channel and p-channel devices in CMOS circuits is accomplished by decreasing p-channel length rather than increasing p-channel width. In contrast, the conventional approach in bulk silicon CMOS circuits has been to accomplish speed balancing of n-channel and p-channel transistor by increasing p-channel width. Thus, CMOS logic elements implemented in accordance with the present invention may include p-channel transistors that have smaller channel widths and that, therefore, present smaller capacitive loading to previous logic stages. It is conceivable that this phenomenon could drive a fundamental shift in CMOS technology. In conventional bulk silicon CMOS, the typical NOR gate has a larger gate area than an equivalent drive NAND gate. Hence, in conventional CMOS, the NAND gate ordinarily is the logic gate of choice. However, in CMOS in ultrathin semiconductor on insulator, the typical NOR gate can have a smaller gate area than an equivalent drive NAND gate. Therefore, NOR gates may become the logic gate of choice for CMOS circuits in ultrathin semiconductor on insulator.

It will be appreciated that the inverter 231, NAND gate 141 and NOR gate 151 described above are logic gates that are used as building blocks in larger more complex electronic circuits. Combinations of these logic gates are used to construct storage devices like a latch circuit or a flip-flop circuit and to construct more complex switching elements like a shift register and a multiplexer or to construct computational elements like an arithmetic and logic element in a computer CPU. In any of these implementations, a multiplicity of basic building block logic elements such as inverters, NAND gates or NOR gates, are used to construct a more complex device or system.

While particular embodiments of the invention have been described in detail herein, it will be appreciated that various modifications can be made to the preferred embodiment without departing from the scope of the invention. For example, although the invention has been explained in relation to present embodiments in which p-channel transistor and n-channel transistor performance are balanced, the principles of the invention can be applied where nonbalanced performance is desired. For example, reduced p-channel drive/area can actually slightly improve aggregate circuit performance and lower AC power consumption (less gate area). Moreover, while the invention has been described with reference to present embodiments in which the ratio of n-channel charge carrier effective mobility to p-channel charge carrier effective mobility is 2:1, the principles of the invention apply as well for different n-channel to p-channel charge carrier effective mobility ratios. Furthermore, although the invention is described with reference to three specific logic elements, Inverter, two input NAND gate and two input NOR gate, it will be appreciated that the principles of the invention apply to other logic elements as well such as latches, flip flops, AND-NOR and OR-NAND circuits, for example. Thus, the foregoing description is not intended to limit the invention which is defined in the appended claims.

What is claimed is:

1. An integrated circuit comprising:
   an insulating substrate;
   a layer of silicon formed on said insulating substrate;
   a p-channel transistor and an n-channel transistor formed in said silicon layer and interconnected in a CMOS circuit;
   wherein the ratio of transistor p-channel length to transistor n-channel length in the CMOS circuit is less than one.

2. The integrated circuit of claim 1 wherein the insulating substrate is sapphire.

3. The integrated circuit of claim 1 wherein the silicon layer is approximately 1000 Angstroms thick.

4. The integrated circuit of claim 1 wherein respective source and drain regions of the respective p-channel and n-channel transistors of the CMOS circuit extend to the insulating substrate.

5. The integrated circuit of claim 1 wherein respective channels of the respective p-channel and n-channel transistors of the CMOS circuit are fully depleted.

6. The integrated circuit of claim 1 wherein the CMOS circuit is an inverter.

7. The integrated circuit of claim 1 wherein the CMOS circuit is a NOR gate.

8. The integrated circuit of claim 1 wherein the CMOS circuit is a NAND gate.

9. The integrated circuit of claim 1 wherein the CMOS circuit is a logic gate.

10. The integrated circuit of claim 1 wherein respective source and drain regions of the respective p-channel and n-channel transistors of the CMOS circuit extend to the insulating substrate and respective channels of the respective p-channel and n-channel transistors of the CMOS circuit are fully depleted.

11. The integrated circuit of claim 1 wherein the insulating substrate is sapphire and the silicon layer is approximately 1000 Angstroms thick.

12. The integrated circuit of claim 1 wherein the p-channel transistor serves as a pull-up transistor in said CMOS circuit and the n-channel transistor serves as a pull-down transistor in said CMOS circuit.

13. The integrated circuit of claim 1 wherein the switching characteristics of the interconnected p-channel transistor and n-channel transistor are balanced.

14. An integrated circuit comprising:
    an insulating substrate;
    a layer of silicon formed on said insulating substrate;
    a multiplicity of p-channel transistors and a multiplicity of n-channel transistors formed in said silicon layer and interconnected in a multiplicity of CMOS circuits;
    wherein the ratio of transistor p-channel length to transistor n-channel length in the CMOS circuits is less than one.

15. The integrated circuit of claim 14 wherein the multiplicity of CMOS circuits include a multiplicity of inverters.

16. The integrated circuit of claim 14 wherein the multiplicity of CMOS circuits include a multiplicity of NOR gates.

17. The integrated circuit of claim 14 wherein the multiplicity of CMOS circuits include a multiplicity of NAND gates.

18. The integrated circuit of claim 14 wherein the multiplicity of CMOS circuits include a multiplicity of logic gates.

19. The integrated circuit of claim 14 wherein the p-channel transistor and n-channel transistor switching characteristics are balanced in each of the multiplicity of CMOS circuits.

20. An integrated circuit comprising:
    an insulating substrate;
    a semiconductor layer formed on said substrate; and
    a p-channel pull-up transistor and an n-channel pull-down transistor formed in said semiconductor layer and interconnected in a balanced CMOS circuit;
    wherein the gate area of the minimum size p-channel transistor is less than the gate area of the minimum size n-channel transistor;
    wherein respective source and drain regions of the p-channel transistor and the n-channel transistor extend substantially to the substrate; and
    wherein respective channels of the p-channel transistor and the n-channel transistor are fully depleted.

21. The integrated circuit of claim 20 wherein the semiconductor layer is intrinsic silicon and the insulating substrate is sapphire.

22. The integrated circuit of claim 20 wherein the interconnected p-channel transistor and the n-channel transistor form a balanced CMOS circuit.

23. An integrated circuit comprising:
    a sapphire substrate;
    a silicon layer formed on said substrate; and
    a multiplicity of p-channel pull-up transistors and a multiplicity of n-channel pull-down transistors formed in said semiconductor layer and interconnected to form a multiplicity of balanced CMOS circuits;
    wherein the respective gate areas of the p-channel transistors are less than the respective gate areas of the n-channel transistors;
    wherein respective source and drain regions of the respective p-channel transistors and of the respective n-channel transistors extend substantially to the substrate; and
    wherein respective channels of the respective p-channel transistors and of the respective n-channel transistors are fully depleted.

24. The integrated circuit of claim 23 wherein the multiplicity of balanced CMOS circuits include a multiplicity of inverters.

25. The integrated circuit of claim 23 wherein the multiplicity of balanced CMOS circuits include a multiplicity of NOR gates.

26. The integrated circuit of claim 23 wherein the multiplicity of balanced CMOS circuits include a multiplicity of NAND gates.

27. The integrated circuit of claim 23 wherein the multiplicity of CMOS circuits include a multiplicity of logic gates.

28. A method of producing a CMOS circuit comprising the steps of:
    providing an insulating substrate;
    forming a silicon layer on the insulating substrate;
    forming an n-channel transistor and a p-channel transistor adjacent to each other in the silicon layer such that the source and drain regions of the n-channel and p-channel transistors extend from an upper surface of the silicon layer to the silicon-insulator interface and such that the channels of the n-channel and p-channel transistors both are fully depleted and such that the ratio of p-channel length to n-channel length is less than one.

29. The method of claim 28 wherein the step of forming the n-channel and p-channel transistors includes scaling their respective channel lengths to achieve balanced switching.

30. The method of claim 28 or 29 wherein the silicon layer is approximately 1000 Angstroms thick.

31. The integrated circuit of claim 1 wherein the silicon layer is no more than aproximately 1000 Angstroms thick.

32. The integrated circuit of claim 1 wherein the insulating layer includes sapphire and the silicon layer is no more than approximately 1000 Angstroms thick.

33. The integrated circuit of claim 1, 3, 14, 20 or 23 wherein the p-channel length is no greater than approximately 0.5 micrometers.

34. The method of claim 28 or 29 wherein the silicon layer is no more than approximately 1000 Angstroms thick.

35. The method of claim 29 or 34 wherein the p-channel length is scaled so as to be no more than approximately 0.5 micrometers.

* * * * *